(12) United States Patent
Akiyama et al.

(10) Patent No.: US 8,569,124 B2
(45) Date of Patent: Oct. 29, 2013

(54) METHOD OF MANUFACTURING COMPOUND SEMICONDUCTOR DEVICE WITH GATE ELECTRODE FORMING BEFORE SOURCE ELECTRODE AND DRAIN ELECTRODE

(75) Inventors: Shinichi Akiyama, Yokohama (JP); Kenji Nukui, Yokohama (JP); Mutsumi Katou, Yokohama (JP); Yoshitaka Watanabe, Yokohama (JP); Tetsuya Itou, Yokohama (JP); Yoichi Fujisawa, Yokohama (JP); Toshiya Sato, Yokohama (JP); Tsutomu Hosoda, Yokohama (JP); Yuuichi Satou, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 162 days.

(21) Appl. No.: 13/089,981

(22) Filed: Apr. 19, 2011

(65) Prior Publication Data

US 2011/0272742 A1    Nov. 10, 2011

(30) Foreign Application Priority Data

May 7, 2010    (JP) ................................. 2010-107654

(51) Int. Cl.
    *H01L 21/336*    (2006.01)
(52) U.S. Cl.
    USPC ................ 438/197; 257/288; 257/E29.242
(58) Field of Classification Search
    USPC ............................................ 438/669; 257/78
    See application file for complete search history.

(56) References Cited

U.S. PATENT DOCUMENTS

2006/0278920 A1*  12/2006  Kim ............................. 257/327
2008/0258243 A1   10/2008  Kuroda et al.
2009/0095991 A1*   4/2009  Cheng .......................... 257/288

FOREIGN PATENT DOCUMENTS

JP    2008-270521 A    11/2008

* cited by examiner

*Primary Examiner* — Eva Yan Montalvo
(74) *Attorney, Agent, or Firm* — Fujitsu Patent Center

(57) ABSTRACT

A compound semiconductor device includes a substrate; a compound semiconductor layer formed on the substrate; a first insulating film formed on the compound semiconductor layer; a second insulating film formed on the first insulating film; and a gate electrode, a source electrode, and a drain electrode, each being formed on the compound semiconductor layer, wherein the gate electrode is formed of a first opening filled with a first conductive material via at least a gate insulator, and the first opening is formed in the first insulating film and configured to partially expose the compound semiconductor layer, and wherein the source electrode and the drain electrode are formed of a pair of second openings filled with at least a second conductive material, and the second openings are formed in at least the second insulating film and the first insulating film and configured to partially expose the compound semiconductor layer.

4 Claims, 46 Drawing Sheets

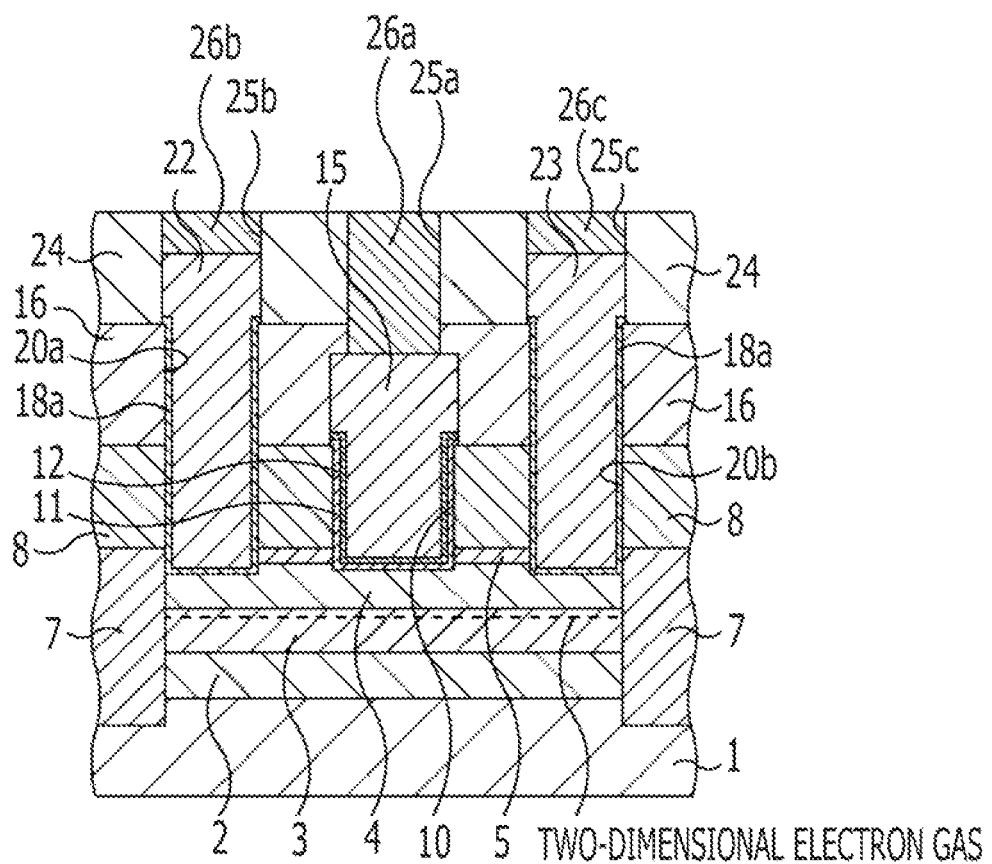

METHOD OF MANUFACTURING COMPOUND SEMICONDUCTOR DEVICE WITH GATE ELECTRODE FORMING BEFORE SOURCE ELECTRODE AND DRAIN ELECTRODE

CROSS-REFERENCE TO RELATED APPLICATIONS

This application is based upon and claims the benefit of priority of the prior Japanese Patent Application No. 2010-107654, filed on May 7, 2010, the entire contents of which are incorporated herein by reference.

FIELD

The present invention relates to a compound semiconductor device and a method of manufacturing a compound semiconductor device.

BACKGROUND

Nitride semiconductor devices have features, such as high saturated electron velocity and wide band gaps, and thus have been actively developed as high-voltage, high-power semiconductor devices. With respect to nitride semiconductor devices, many reports of field-effect transistors, in particular, high electron mobility transistors (HEMTs) have been published. In particular, AlGaN/GaN HEMTs including electron transit layers composed of GaN and electron supply layers composed of AlGaN have been attracting attention. For AlGaN/GaN HEMTs, the difference in lattice constant between GaN and AlGaN causes strain in AlGaN. The strain-induced piezoelectric polarization and the spontaneous polarization of AlGaN results in a high-density two-dimensional electron gas (2DEG), thereby achieving high breakdown voltage and high output power. AlGaN/GaN HEMTs have been attracting attention as semiconductor devices for use in power supplies and high-frequency amplifiers.

Nitride semiconductor devices, such as AlGaN/GaN HEMTs, include gate electrodes, source electrodes, and drain electrodes on nitride semiconductor layers including, for example, electron transit layers and electron supply layers. The gate electrodes, the source electrodes, and the drain electrodes are formed using what is called a lift-off process.

To form a source electrode and a drain electrode, a resist is applied on a nitride semiconductor layer and processed by lithography to form a resist mask having openings located at portions of the mask corresponding to portions of the layer where the source electrode and the drain electrode will be formed. For example, Ti/Al is used as an electrode material. Ti/Al is deposited by vapor evaporation or the like on the resist mask in such a manner that the openings are filled with Ti/Al. The resist mask and Ti/Al deposited on the mask are removed by the lift-off process. Then heat treatment of a substrate forms ohmic contacts. Thereby, the source electrode and the drain electrode are formed on the nitride semiconductor layer.

To form the gate electrode, the resist is applied on the nitride semiconductor layer and processed by lithography to form a resist mask having an opening located at a portion of the mask corresponding to a portion of the layer where the gate electrode will be formed. For example, Ni/Au is used as an electrode material. Ni/Au is deposited by vapor evaporation or the like on the resist mask in such a manner that the opening is filled with Ni/Au. The resist mask and Ni/Au deposited on the mask are removed by the lift-off process. Thereby, the gate electrode is formed between the source electrode and the drain electrode on the nitride semiconductor layer.

Japanese Unexamined Patent Application Publication No. 2008-270521 is an example of related art.

SUMMARY

According to an aspect of the invention, a method of manufacturing a compound semiconductor device, includes forming a compound semiconductor layer on a substrate; forming a first insulating film on the compound semiconductor layer; forming a first opening in the first insulating film, the first opening being configured to partially expose the compound semiconductor layer; forming a first conductive material on the first insulating film via at least a gate insulator in such a manner that the first opening is filled with the first conductive material; forming a first mask on a portion of the first conductive material corresponding to the first opening; processing at least the first conductive material with the first mask to form a gate electrode; forming a second insulating film on the first insulating film so as to cover the gate electrode; forming a pair of second openings in at least the second insulating film and the first insulating film, the pair of second openings being configured to partially expose the compound semiconductor layer; forming at least a second conductive material on the second insulating film in such a manner that the second openings are filled with the second conductive material; forming second masks on portions of the second conductive material corresponding to the second openings; and processing at least the second conductive material using the second masks to form a source electrode and a drain electrode.

According to another aspect of the invention, a method of manufacturing a compound semiconductor device, includes forming a compound semiconductor layer on a substrate; forming a first insulating film on the compound semiconductor layer; forming a pair of first openings in the first insulating film, the pair of first openings being configured to partially expose the compound semiconductor layer; forming a first conductive material on the first insulating film in such a manner that the first openings are filled with the first conductive material; forming first masks on portions of the first conductive material corresponding to the first openings; processing at least the first conductive material with the first masks to form a source electrode and a drain electrode; forming a second insulating film on the first insulating film so as to cover the source electrode and the drain electrode; forming a second opening in at least the second insulating film and the first insulating film, the second opening being configured to partially expose the compound semiconductor layer; forming a second conductive material on the second insulating film via at least a gate insulator in such a manner that the second openings are filled with the second conductive material; forming a second mask on a portion of the second conductive material corresponding to the second opening; and processing at least the second conductive material with the second mask to form a gate electrode.

According to another aspect of the invention, a compound semiconductor device includes a substrate; a compound semiconductor layer formed on the substrate; a first insulating film formed on the compound semiconductor layer; a second insulating film formed on the first insulating film; and a gate electrode, a source electrode, and a drain electrode, each being formed on the compound semiconductor layer, wherein the gate electrode is formed of a first opening filled with a first conductive material via at least a gate insulator, and the first opening is formed in the first insulating film and configured to partially expose the compound semiconductor layer, and wherein the source electrode and the drain electrode are formed of a pair of second openings filled with at least a second conductive material, and the second openings are formed in at least the second insulating film and the first insulating film and configured to partially expose the compound semiconductor layer.

According to another aspect of the invention, a compound semiconductor device includes a substrate; a compound semiconductor layer formed on the substrate; a first insulating film formed on the compound semiconductor layer; a second insulating film formed on the first insulating film; and a gate electrode, a source electrode, and a drain electrode, each being formed on the compound semiconductor layer, wherein the source electrode and the drain electrode are formed of a pair of first openings filled with at least a first conductive material, and the first openings are formed in the first insulating film and configured to partially expose the compound semiconductor layer, and wherein the gate electrode is formed of a second opening filled with a second conductive material via at least gate insulator, and the second opening is formed in at least the second insulating film and the first insulating film and configured to partially expose the compound semiconductor layer.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

In the case where a gate electrode, a source electrode, and a drain electrode are formed by the lift-off process, part of metal pieces of the electrode material that has been lifted-off may be redeposited on a surface of the substrate. The redeposited metal pieces may cause defects in various patterns when the patterns are formed in the subsequent steps. Examples of the patterns in which defects may be caused include as follows: the gate electrode when the source electrode and the drain electrode are formed before the formation of the gate electrode; the source electrode and the drain electrode when the source electrode and the drain electrode are formed after the formation of the gate electrode; connecting portions connected to the gate electrode, the source electrode, and the drain electrode; and various interlayer insulators. If defects occur in these patterns, device properties of nitride semiconductor devices may be significantly impaired.

[First Embodiment]

In this embodiment, with respect to an AlGaN/GaN HEMT, the case where a gate electrode is formed before the formation of a source electrode and drain electrode is described.

Figure 1A:
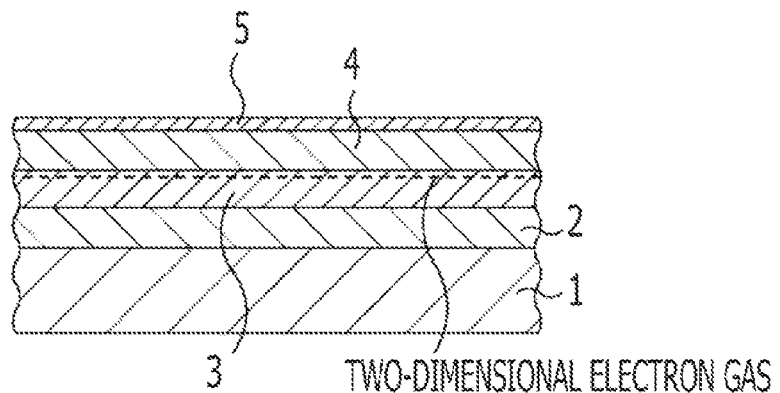
FIGS. 1A to 1P are schematic cross-sectional views of a method of manufacturing an AlGaN/GaN HEMT according to a first embodiment.

FIGS. 1A to 1P are schematic cross-sectional views illustrating a method of manufacturing an AlGaN/GaN HEMT according to a first embodiment.

As illustrated in FIG. 1A, a buffer layer 2, an electron transit layer 3, an electron supply layer 4, and a cap layer 5 are formed on, for example, a semi-insulating SiC substrate 1 serving as a substrate used for growth.

For example, the buffer layer 2 is an AlN layer, the electron transit layer 3 is an intentionally undoped GaN (i-GaN) layer, the electron supply layer 4 is an n-AlGaN layer, and the cap layer 5 is an n-GaN layer.

A silicon substrate may be used in place of the SiC substrate 1. The buffer layer 2 may have a multilayer structure composed of AlN and GaN. Alternatively, the buffer layer 2 may have a concentration gradient of Ga in such a manner that the composition is changed from AlN to AlGaN from the lower portion (adjacent to the SiC substrate 1) to the upper portion. Furthermore, the electron supply layer 4 may be an intentionally undoped AlGaN (i-AlGaN) layer.

Referring to FIG. 1A, specifically, the following compound semiconductor layers are grown on the SiC substrate 1 by, for example, metal-organic vapor phase epitaxy (MOVPE) using a crystal growth apparatus.

AlN, i-GaN, n-AlGaN, and n-GaN are deposited on the SiC substrate 1 to form the buffer layer 2, the electron transit layer 3, the electron supply layer 4, and the cap layer 5. The buffer layer 2 has a thickness of about 2 μm. The electron transit layer 3 has a thickness of 1 μm to 3 μm. In this embodiment, the electron transit layer 3 has a thickness of about 3 μm. The electron supply layer 4 has a thickness of about 5 nm to about 40 nm. In this embodiment, the electron supply layer 4 has a thickness of about 40 nm and an Al ratio of, for example, 0.2. The cap layer 5 has a thickness of about 0.1 nm to about 5 nm. In this embodiment, the cap layer 5 has a thickness of about 2 nm.

In the AlGaN/GaN HEMT, a two-dimensional electron gas (2DEG) indicated by a broken line in the figure is formed in the vicinity of the interface of the electron transit layer 3 and the electron supply layer 4. This is attributed to the formation of a quantum well due to the fact that the band gap of AlGaN constituting the electron supply layer 4 is larger than that of GaN constituting the electron transit layer 3. The accumulation of electrons in the quantum well results in the formation of the 2DEG, which serves as an electron carrier.

With respect to growth conditions of AlN, i-GaN, n-AlGaN, and n-GaN, a mixed gas of trimethylaluminum gas, trimethylgallium gas, and ammonia gas is used as a source gas. Whether or not to feed the trimethylaluminum gas serving as an Al source, the trimethylgallium gas serving as a Gs source, and the ammonia gas serving as an N source and the flow rate thereof are appropriately set in response to the compound semiconductor layers to be grown. The flow rate of the ammonia gas, which is a common source, is set to about 100 ccm to about 10 LM. The growth pressure is set to about 50 Torr to about 300 Torr. The growth temperature is set to about 1000° C. to about 1200° C. In the case of the growth of n-GaN and n-AlGaN, for example, a Si-containing gas, such as $SiH_4$ gas, serving as an n-type impurity is added to the source gas at a predetermined flow rate to dope GaN and AlGaN with Si. The Si doping concentration is set to about $1\times10^{18}/cm^3$ to about $1\times10^{20}/cm^3$, for example, about $1\times10^{18}/cm^3$.

Figure 1B:
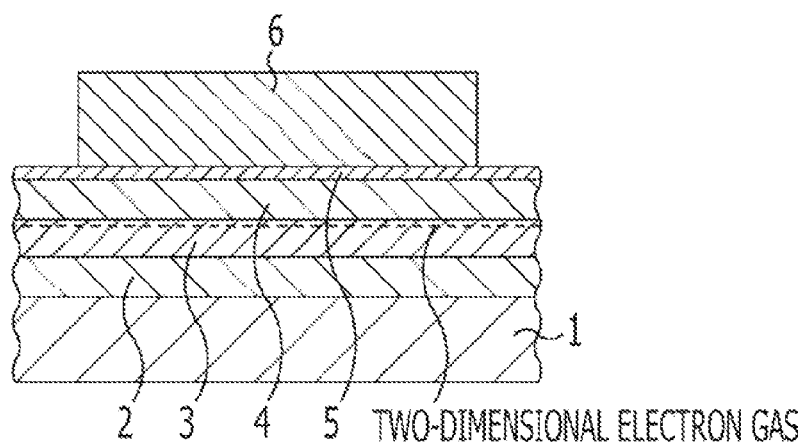

As illustrated in FIG. 1B, a resist mask 6 is formed on the cap layer 5.

A resist is applied on the entire surface of the cap layer 5 and processed by lithography, thereby forming the resist mask 6 that covers an element active region and expose an element isolation region on the cap layer 5.

Figure 1C:
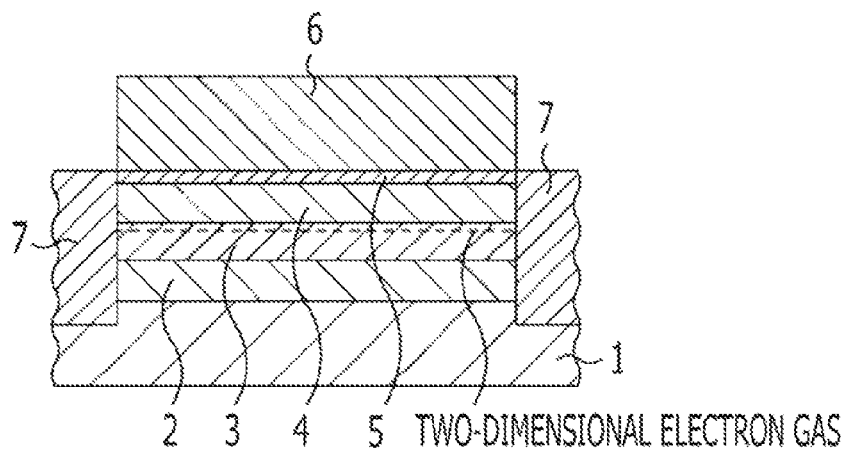

As illustrated in FIG. 1C, element isolation structures 7 are formed.

A predetermined element, for example, Ar, is ion-implanted into the element active region extending to the cap layer 5, the electron supply layer 4, the electron transit layer 3, the buffer layer 2, and an upper portion of the SiC substrate 1 using the resist mask 6. The ion implantation is performed at an acceleration energy of, for example, about 100 eV and a dose of, for example, about $1.0\times10^{13}/cm^2$. The element isolation structures 7 are formed by the ion implantation. In the element isolation structures 7, the crystal structures of AlN, GaN, and AlGaN are broken to eliminate the 2DEG in the element isolation structures 7; hence, the element isolation structures 7 serve as insulating regions.

Then the resist mask 6 is removed by ashing or the like.

Figure 1D:
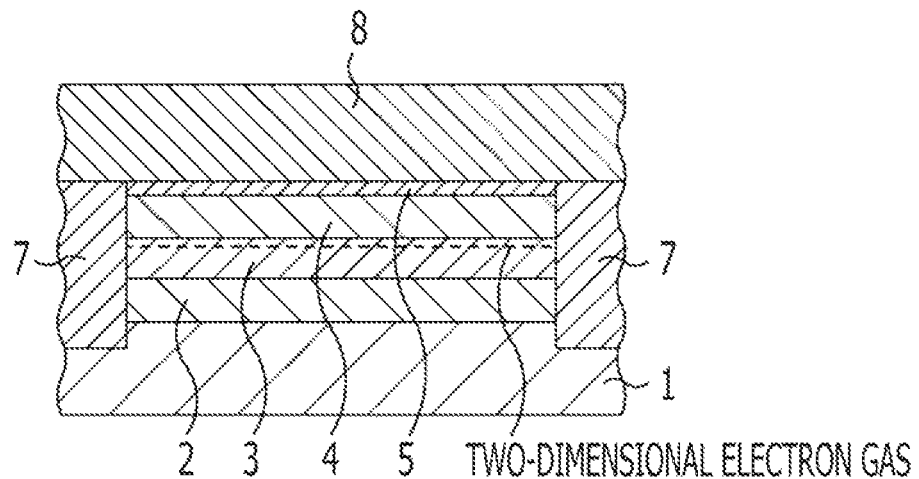

As illustrated in FIG. 1D, a first protective insulating film 8 is formed.

An insulating film, for example, a silicon nitride film, having a thickness of about 20 nm to 500 nm, for example, about 300 nm is formed on the entire surface above the SiC substrate 1 by, for example, plasma-enhanced chemical vapor deposition (CVD), thereby forming the first protective insulating film 8. The first protective insulating film 8 may be formed by thermal CVD or atomic layer deposition (ALD) in place of plasma-enhanced CVD. Furthermore, the first protective insulating film 8 may be formed of a silicon oxide film. Alternatively, the first protective insulating film 8 may have a laminated structure of a silicon nitride film and a silicon oxide film.

Figure 1E:
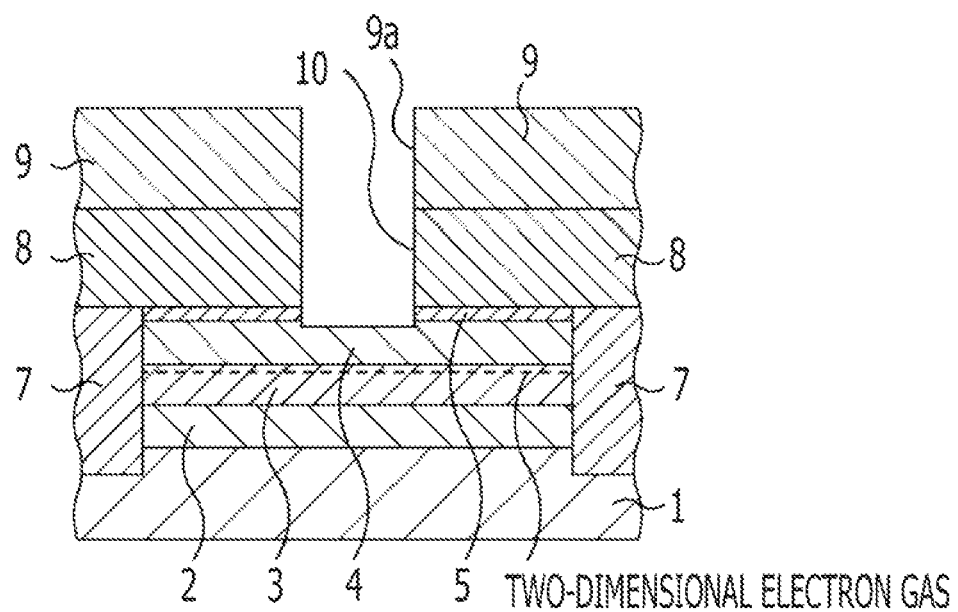

As illustrated in FIG. 1E, an opening 10 is formed in the first protective insulating film 8 and the cap layer 5.

A resist is applied on the entire surface of the first protective insulating film 8 and processed by lithography, thereby forming a resist mask 9 having an opening 9a that exposes a portion of the first protective insulating film 8 where the gate electrode will be formed.

The first protective insulating film 8 and the cap layer 5 are subjected to dry etching with the resist mask 9 to form the opening 10. The dry etching is performed with a fluorine-containing gas, for example, a mixed gas of $CHF_3$, $CF_3$, and Ar, as an etching gas at a pressure of about 1.7 Torr and an RF power of, for example, about 650 W. The opening 10 that partially exposes the surface of the electron supply layer 4 is formed in the cap layer 5 and the first protective insulating film 8 by this dry etching. The exposed portion of the electron supply layer 4 is a portion where the gate electrode will be formed. In this embodiment, as illustrated in the figure, the dry etching is performed so as to expose a surface of the electron supply layer 4 (to form a shallow recess in the surface). This makes it possible to extend a depletion layer directly below the gate electrode and to form a shallow quantum well. That is, the electrical elimination of the 2DEG directly below the gate electrode provides what is called a normally-off operation (a current between the source electrode and the drain electrode is off at a gate electrode of 0 V).

Then the resist mask 9 is removed by ashing or the like.

Figure 1F:
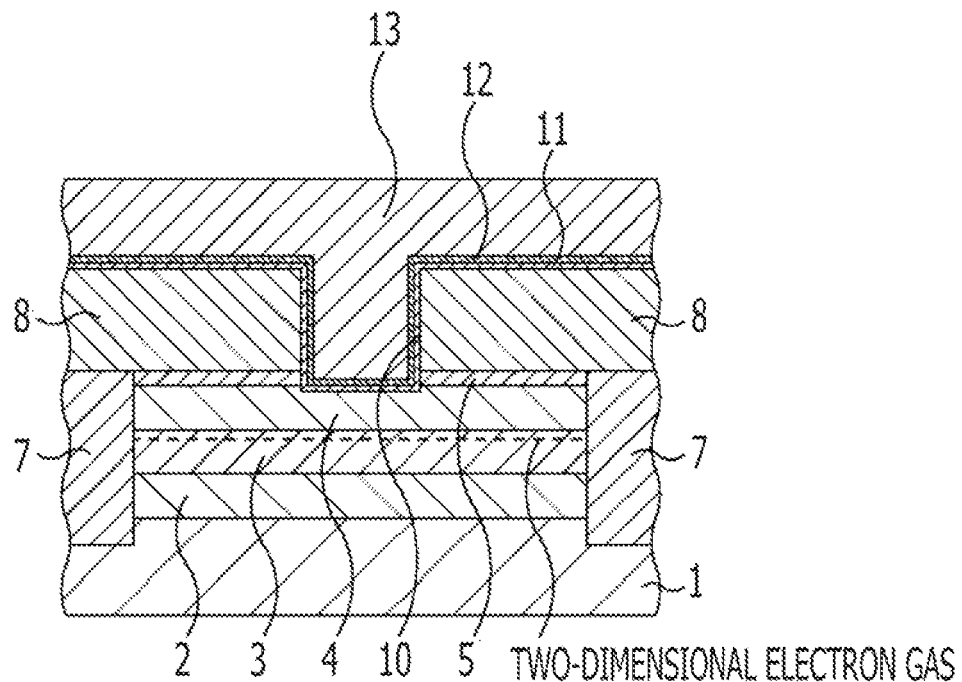

As illustrated in FIG. 1F, after the formation of a gate insulator 11 and a high-work-function film 12, a conductive material 13 is deposited.

Specifically, the gate insulator 11 and the high-work-function film 12 are sequentially formed on the first protective insulating film 8 so as to cover the inner surface of the opening 10.

The gate insulator 11 is formed by depositing, for example, an AlO film having a thickness of, for example, about 20 nm by ALD or the like. The gate insulator 11 may be formed of a TaO film, or a high-dielectric (high-k) oxide or oxynitride film of Hf, Ti, or Zr, in place of the AlO film. Alternatively, the gate insulator 11 may have a laminated structure of two or more selected from the AlO film, the TaO film, and the high-k film.

After the formation of the gate insulator 11, for example, heat treatment may be performed at, for example, 550° C. for about 60 seconds.

The high-work-function film 12 is formed by depositing, for example, a TaN film having a thickness of, for example, about 40 nm by physical vapor deposition (PVD) or the like. The term "high-work-function film" indicates a film composed of a conductive material having a work function of 4.5 eV or more. The formation of the high-work-function film 12 provides a shallow quantum well directly below the gate electrode, thereby reducing the 2DEG directly below the gate electrode when the gate voltage is 0 V.

The conductive material 13, such as Al, is deposited on the entire surface of the high-work-function film 12 by PVD or the like in such a manner that the resulting film of the conductive material 13 has a thickness of about 20 nm to about 500 nm, for example, about 400 nm and that the opening 10 is filled with the conductive material 13 via the gate insulator 11 and the high-work-function film 12.

Figure 1G:
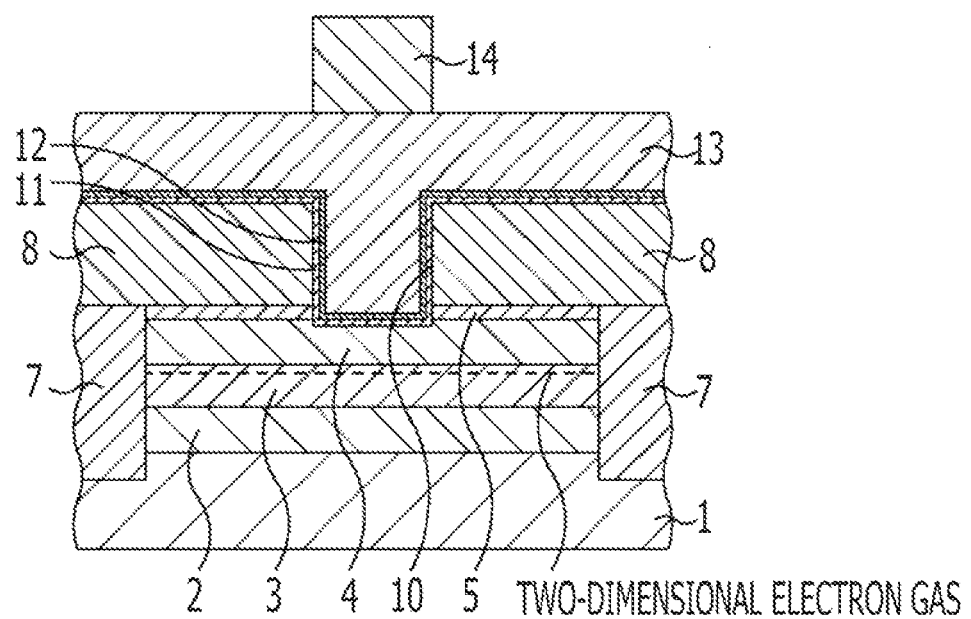

As illustrated in FIG. 1G, a resist mask 14 is formed on the conductive material 13.

A resist is applied on the entire surface of the conductive material 13 and processed by lithography, thereby forming the resist mask 14 that covers a portion of the conductive material 13 where the gate electrode will be formed.

Figure 1H:
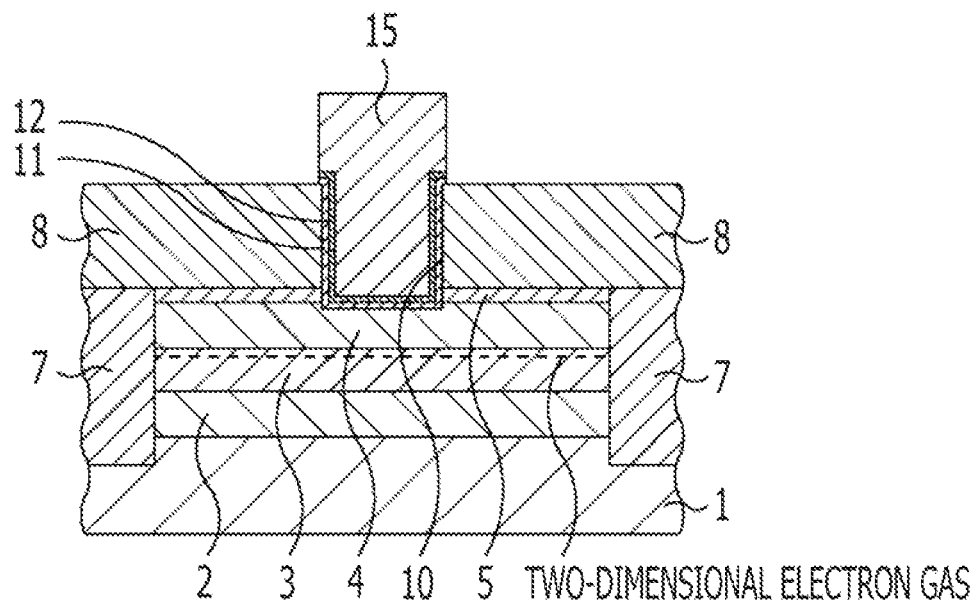

As illustrated in FIG. 1H, a gate electrode 15 is formed.

The conductive material 13, the high-work-function film 12, and the gate insulator 11 are dry-etched using the resist mask 14, thereby forming the gate electrode 15 in which the opening 10 is filled with the conductive material 13 via the gate insulator 11 and the high-work-function film 12 and which protrudes from the first protective insulating film 8. Here, the conductive material 13 and the high-work-function film 12 may be dry-etched to leave the gate insulator 11 on the first protective insulating film 8.

Then the resist mask 14 is removed by ashing or the like.

In this embodiment, the gate electrode 15 of the AlGaN/GaN HEMT is formed by lithography and dry etching. In this case, the first protective insulating film 8 is formed, and then the gate electrode 15 is formed in such a manner that the opening 10 in the first protective insulating film 8 is filled with the conductive material 13. The presence of the first protective insulating film 8 protects the compound semiconductor layers, thereby minimizing damage from, for example, the dry etching during the formation of the gate electrode to the compound semiconductor layers, such as the electron supply layer 4. As described above, in this embodiment, when the gate electrode 15 is formed, the lithography and the dry etching are performed using the first protective insulating film 8, without employing the lift-off process. Unlike the lift-off process, part of the conductive material is not redeposited above the SiC substrate 1, and the satisfactory gate electrode 15 is formed without damaging the compound semiconductor layers.

Figure 1I:
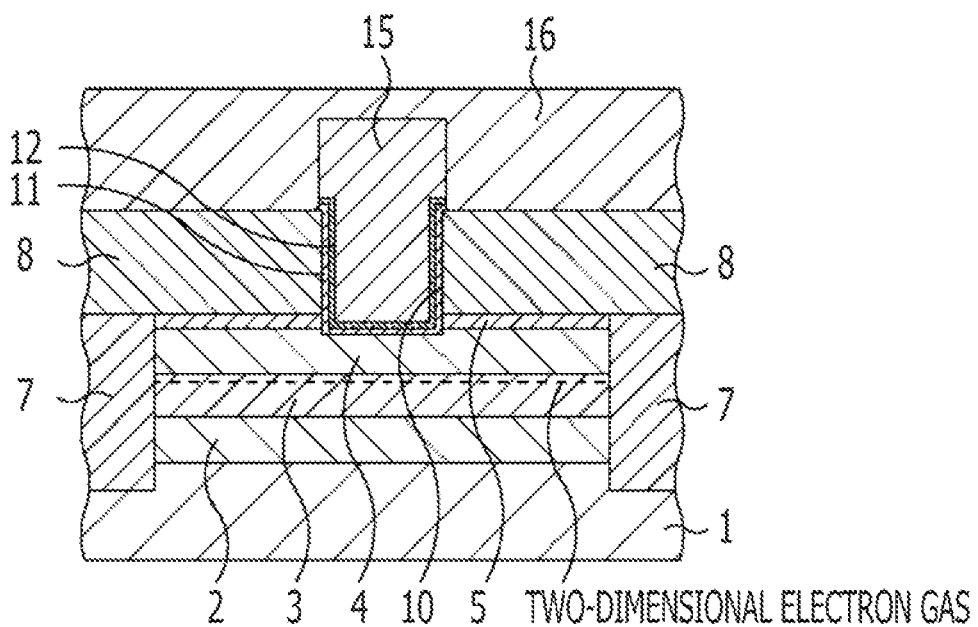

As illustrated in FIG. 1I, a second protective insulating film 16 is formed.

An insulating film, such as a silicon oxide film, having a thickness of about 300 nm is formed on the entire surface of the first protective insulating film 8 by, for example, plasma-enhanced CVD so as to cover the gate electrode 15, thereby forming the second protective insulating film 16. Here, a bump attributed to a projecting portion of the gate electrode 15 is formed on a portion of the second protective insulating film 16 above the gate electrode 15. To remove the bump, surface polishing is preferably performed by, for example, chemical-mechanical polishing (CMP). In this case, the silicon oxide film or the like is deposited so as to have a thickness of about 500 nm to about 1000 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the second protective insulating film 16. In FIG. 1I, the second protective insulating film 16 having a surface planarized by CMP is illustrated.

With respect to a method for forming the second protective insulating film, a silicon oxide film or the like may be formed by, for example, spin coating in place of plasma-enhanced CVD and is subjected to curing treatment to form the second protective insulating film.

Figure 1J:
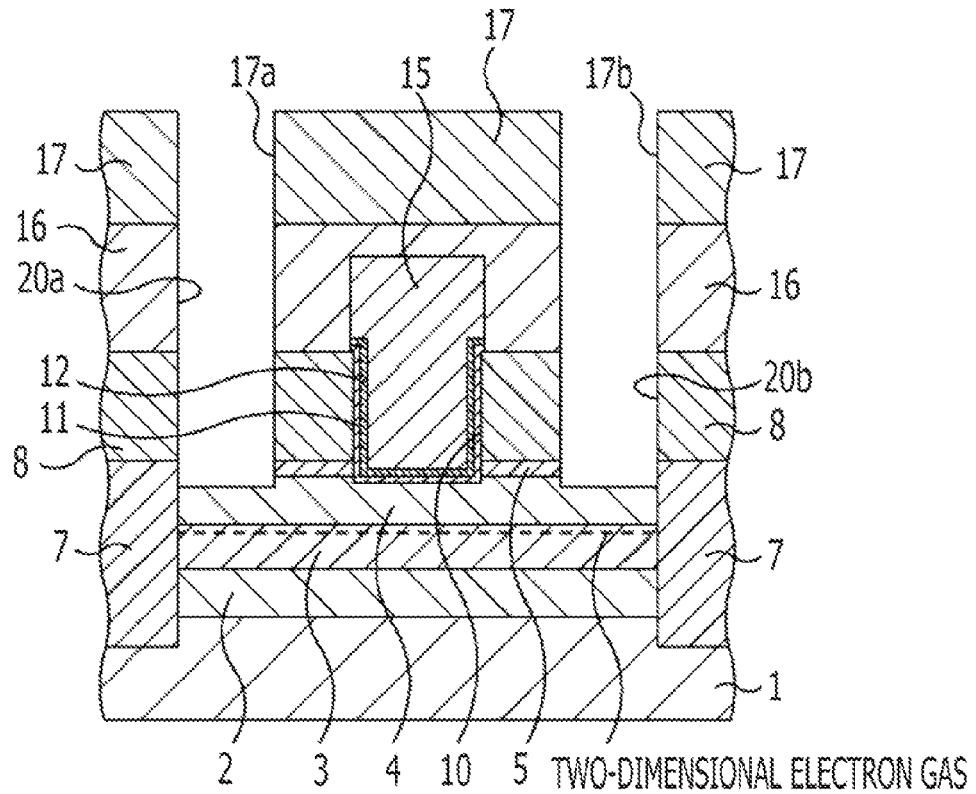

As illustrated in FIG. 1J, a pair of openings 20a and 20b is formed in the second protective insulating film 16, the first protective insulating film 8, and the cap layer 5.

A resist is applied on the entire surface of the second protective insulating film 16 and processed by lithography, thereby forming a resist mask 17 having a pair of openings 17a and 17b that expose portions of the second protective insulating film 16 where the source electrode and the drain electrode will be formed.

The second protective insulating film 16, the first protective insulating film 8, and the cap layer 5 are subjected to dry etching with the resist mask 17 to form the openings 20a and 20b. The dry etching is performed with a fluorine-containing gas, for example, a mixed gas of $CHF_3$, $CF_3$, and Ar, as an etching gas at a pressure of 1.7 Torr and an RF power of, for example, 650 W. The openings 20a and 20b that partially expose the surface of the electron supply layer 4 are formed in the cap layer 5, the first protective insulating film 8, and the second protective insulating film 16 by the dry etching. The exposed portions of the electron supply layer 4 are portions where the source electrode and the drain electrode will be formed. Here, in order to reliably expose the portions of the surface of the electron supply layer 4, as illustrated in the figure, a surface of the electron supply layer 4 may be etched (to form a shallow recess in the surface).

Then the resist mask 17 is removed by ashing or the like.

Figure 1K:
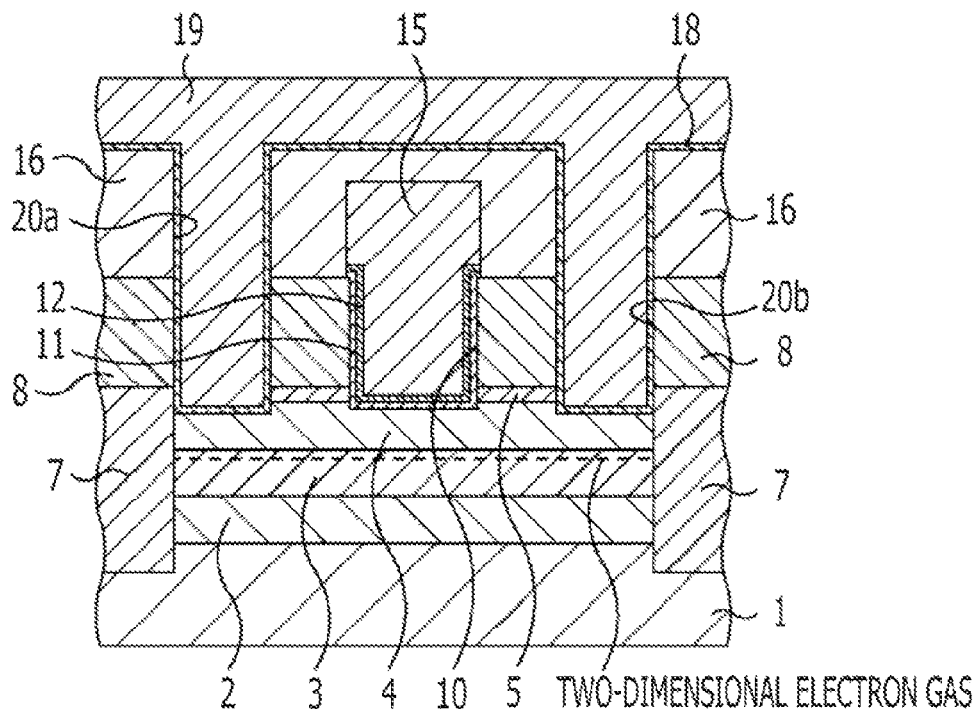

As illustrated in FIG. 1K, after the formation of a low-work-function film 18, a conductive material 19 is deposited.

The low-work-function film 18 is formed on the second protective insulating film 16 as an underlying conductive film so as to cover inner surfaces of the openings 20a and 20b. The term "low-work-function film" indicates a film composed of a conductive material having a work function of less than 4.5 eV. The low-work-function film 18 is formed by depositing one selected from Al, Ti, metal-rich TiN, Ta, metal-rich TaN, Zr, metal-rich TaC, $NiSi_2$, and Ag in such a manner that the deposited film has a thickness of about 1 nm to about 100 nm. The term "metal-rich TIN" indicates TiN in which the composition ratio of Ti is larger than that of N. The term "metal-rich TaN" indicates TaN in which the composition ratio of Ta is larger than that of N. The term "metal-rich TaC" indicates TaC in which the composition ratio of Ta is larger than that of C. Here, for example, a Ta film is deposited by PVD or the like at a DC power of, for example, 1 kW to 10 kW so as to have a thickness of about 10 nm, thereby forming the low-work-function film 18. The formation of the low-work-function film 18 reduces the barrier between the electrode material and a portion of the electron supply layer 4 directly below the gate electrode, thereby forming the source electrode and the drain electrode with low contact resistance.

The conductive material 19, such as Al, is deposited on the entire surface of the low-work-function film 18 by PVD or the like at a DC power of, for example, 1 kW to 20 kW in such a manner that the resulting film of the conductive material 19 has a thickness of about 300 nm and that the openings 20a and 20b are filled with the conductive material via the low-work-function film 18.

Figure 1L:
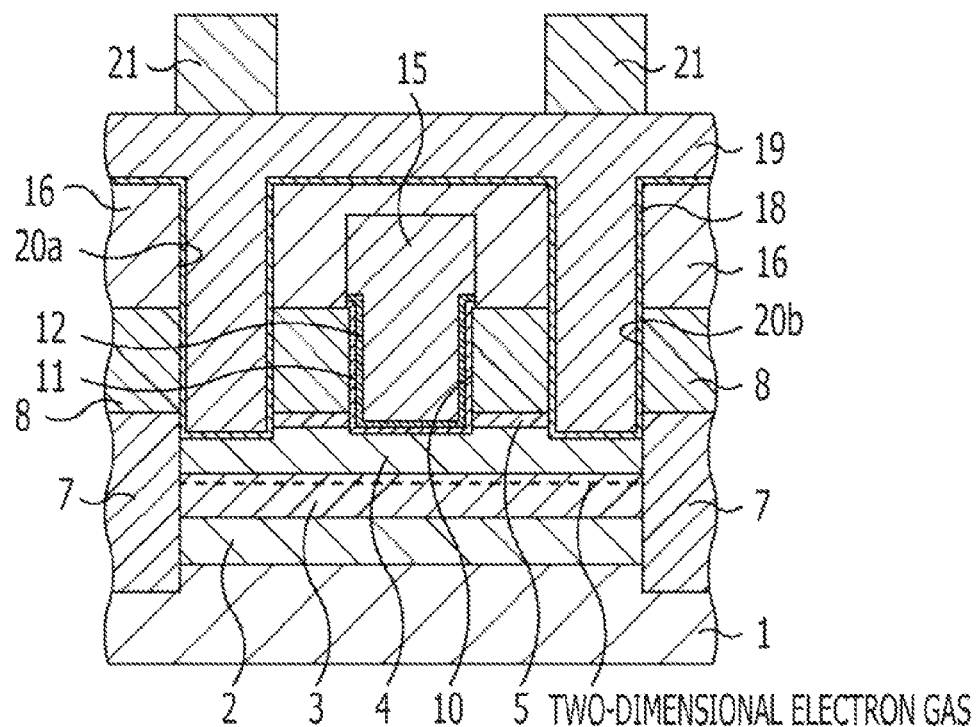

As illustrated in FIG. 1L, resist masks 21 are formed on the conductive material 19.

A resist is applied on the entire surface of the conductive material 19 and processed by lithography, thereby forming the resist masks 21 that cover portions of the conductive material 19 where the source electrode and the drain electrode will be formed.

Figure 1M:
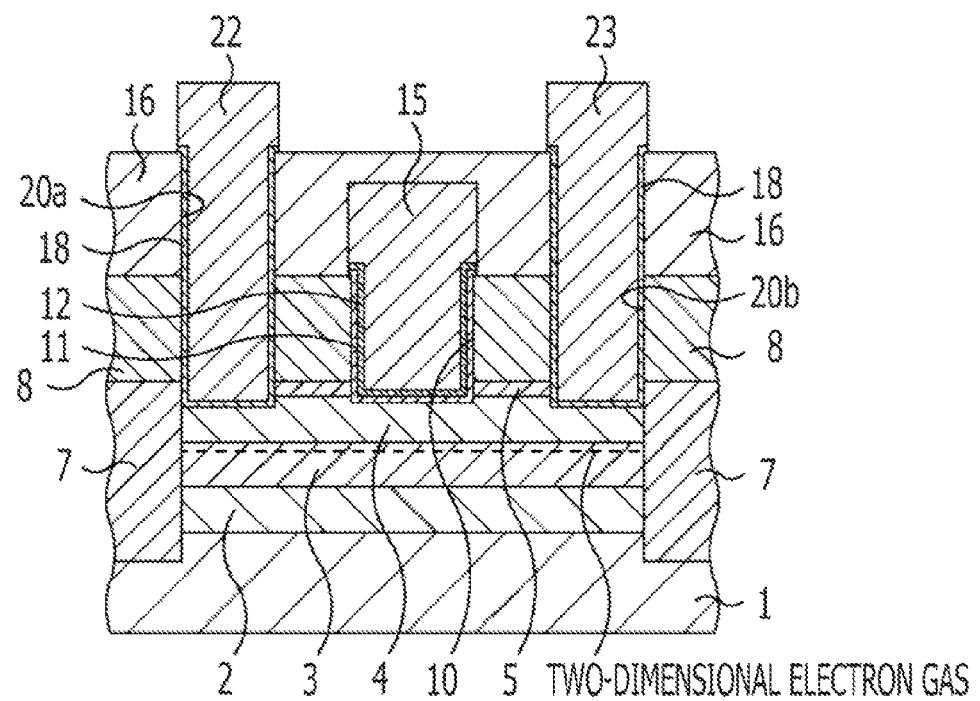

As illustrated in FIG. 1M, a source electrode 22 and a drain electrode 23 are formed.

The conductive material 19 and the low-work-function film 18 are dry-etched using the resist masks 21, thereby forming the source electrode 22 and the drain electrode 23 in which the openings 20a and 20b are filled with the conductive material 19 via the low-work-function film 18 and which protrude from the second protective insulating film 16.

Then the resist mask 21 is removed by ashing or the like.

In this embodiment, the source electrode 22 and the drain electrode 23 of the AlGaN/GaN HEMT are formed by lithography and dry etching. In this case, the source electrode 22 and the drain electrode 23 are formed in such a manner that the openings 20a and 20b are filled with the conductive material 19. The presence of the first and second protective insulating films 8 and 16 protects the compound semiconductor layers, thereby minimizing damage from, for example, the dry etching during the formation of the source and drain electrodes to the compound semiconductor layers, such as the electron supply layer 4. As described above, in this embodiment, when the source electrode 22 and the drain electrode 23 are formed, the lithography and the dry etching are performed using the second protective insulating film 16, without employing the lift-off process. Unlike the lift-off process, part of the conductive material is not redeposited above the SiC substrate 1, and the satisfactory source electrode 22 and the satisfactory drain electrode 23 are formed without damaging the compound semiconductor layers.

The SiC substrate 1 is subjected to heat treatment in, for example, an $N_2$ atmosphere at about 600° C. for about 60 seconds.

Figure 1N:
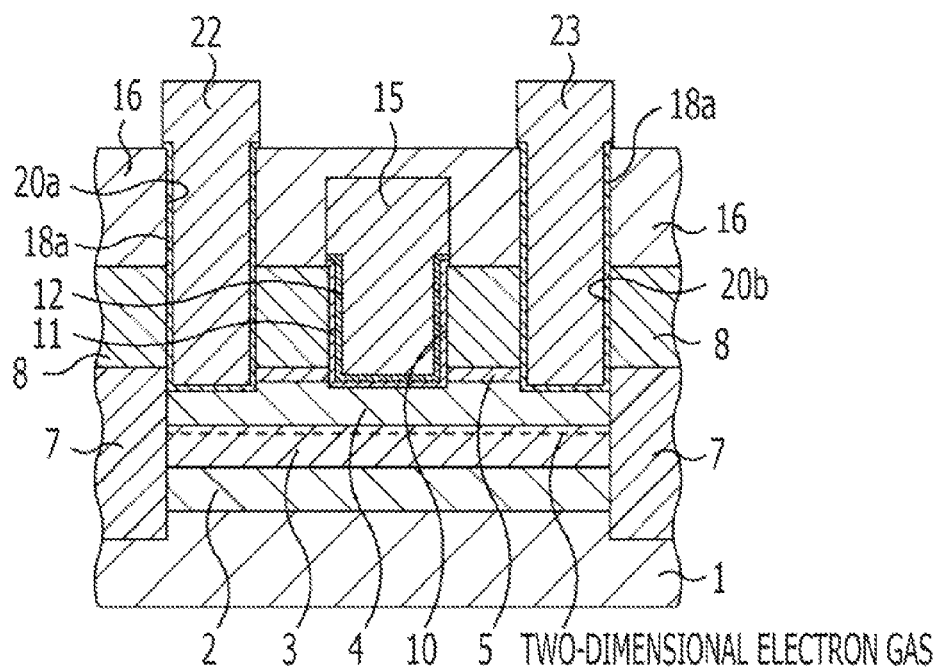

As illustrated in FIG. 1N, the heat treatment allows Ta in the low-work-function film 18 to react with Al in the conductive material 19, so that the low-work-function film 18 is formed into a $TaAl_3$ film 18a.

Figure 2:
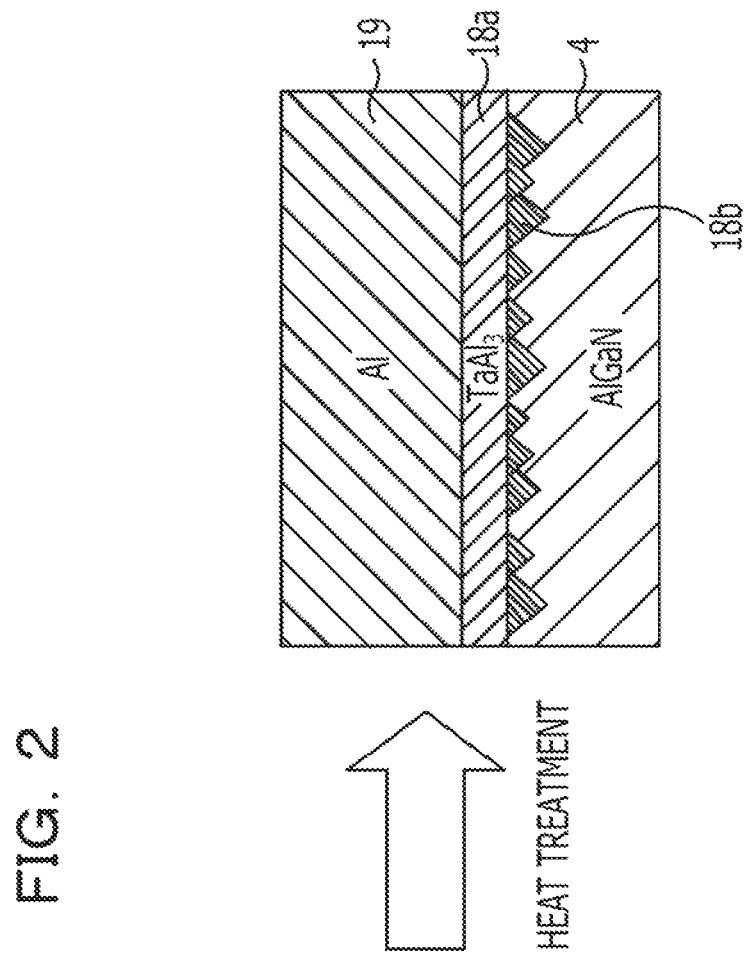
FIG. 2 is a schematic cross-sectional view illustrating a reaction of a Ta film and an Al film by heat treatment.

Details of the reaction by the heat treatment are illustrated in FIG. 2. The heat treatment results in the formation of minute spikes 18b of the $TaAl_3$ film 18a at bottoms of the openings 20a and 20b, i.e., portions of the electron supply layer 4 directly below the source electrode 22 and the drain electrode 23, thereby reducing the contact resistance between the electron supply layer 4 and the source electrode 22 and between the electron supply layer 4 and the drain electrode 23. Furthermore, Al has a low work function. This also contributes to a reduction in contact resistance.

Figure 1O:
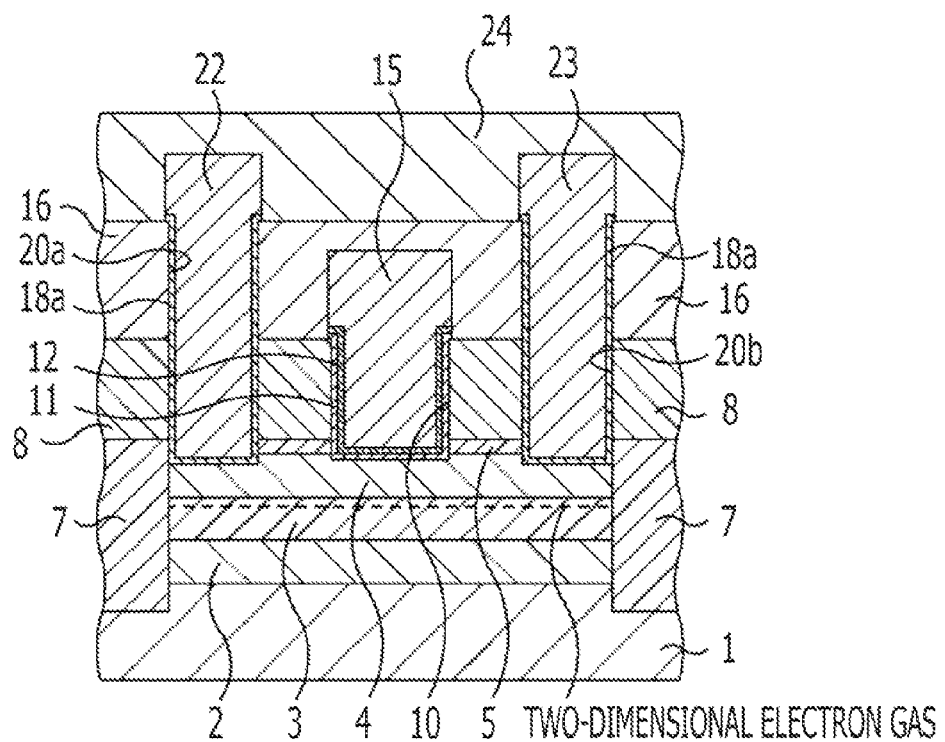

As illustrated in FIG. 1O, an interlayer insulator 24 is formed.

An insulating film, such as a silicon oxide film, having a thickness of about 1000 nm is formed on the entire surface of the second protective insulating film 16 by, for example, plasma-enhanced CVD so as to cover the source electrode 22 and the drain electrode 23, thereby forming the interlayer insulator 24. Here, bumps attributed to projecting portions of the source electrode 22 and the drain electrode 23 are formed on portions of the second protective insulating film 16 above the source electrode 22 and the drain electrode 23. To remove the bumps, surface polishing is preferably performed by, for example, chemical-mechanical polishing (CMP). In this case, the silicon oxide film or the like is deposited so as to have a thickness of about 1000 nm to about 1500 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the interlayer insulator 24. In FIG. 1O, the interlayer insulator 24 having a surface planarized by CMP is illustrated.

With respect to a method for forming the interlayer insulator, a silicon oxide film or the like may be formed by, for example, spin coating in place of plasma-enhanced CVD and is subjected to curing treatment to form the interlayer insulator.

As illustrated in FIG. 1P, a connecting portion 26a of the gate electrode 15, a connecting portion 26b of the source electrode 22, and a connecting portion 26c of the drain electrode 23 are formed.

Specifically, the second protective insulating film 16 and the interlayer insulator 24 are processed by lithography and dry etching, thereby forming openings 25a, 25b, and 25c that partially expose respective surfaces of the gate electrode 15, the source electrode 22, and the drain electrode 23.

A conductive material, such as Al, is deposited on the interlayer insulator 24 by, for example, sputtering or plating in such a manner that the openings 25a, 25b, and 25c are filled with the conductive material. The conductive material is polished by CMP using a surface of the interlayer insulator 24 as a polishing stopper. In this way, the openings 25a, 25b, and 25c are filled with the conductive material to form the connecting portion 26a of the gate electrode 15, the connecting portion 26b of the source electrode 22, and the connecting portion 26c of the drain electrode 23.

Subsequently, steps of forming, for example, an upper interlayer insulator and a line are performed to form the AlGaN/GaN HEMT according to this embodiment.

As described above, according to this embodiment, the gate electrode 15, the source electrode 22, and the drain electrode 23 of the AlGaN/GaN HEMT are formed not by the lift-off process but by a simple method without causing a defect in any pattern, thereby simply and reliably manufacturing the AlGaN/GaN HEMT with excellent device properties.

Furthermore, in this embodiment, the gate electrode 15 is formed before the formation of the source electrode 22 and the drain electrode 23. This makes it possible to form the gate electrode 15 having a low profile, i.e., a low aspect ratio. In this case, dry etching to form the opening 10 where the gate electrode 15 will be formed can be performed with high accuracy without damaging the electron supply layer 4.

[Modification]

A modification of the first embodiment will be described below. In this modification, although the structure of an AlGaN/GaN HEMT and a method of manufacturing the AlGaN/GaN HEMT are disclosed as in the first embodiment, the structure of the underlying layers of the gate electrode in the modification differs slightly from that in the first embodiment. Note that components equivalent to those in the first embodiment are designated using the same reference numerals.

In this modification, the steps illustrated in FIGS. 1A to 1E are performed as in the first embodiment. Note that in this modification, the case where the opening 10 formed in the first protective insulating film 8 and the cap layer 5 slightly has a tapered shape is exemplified.

Figure 3A:
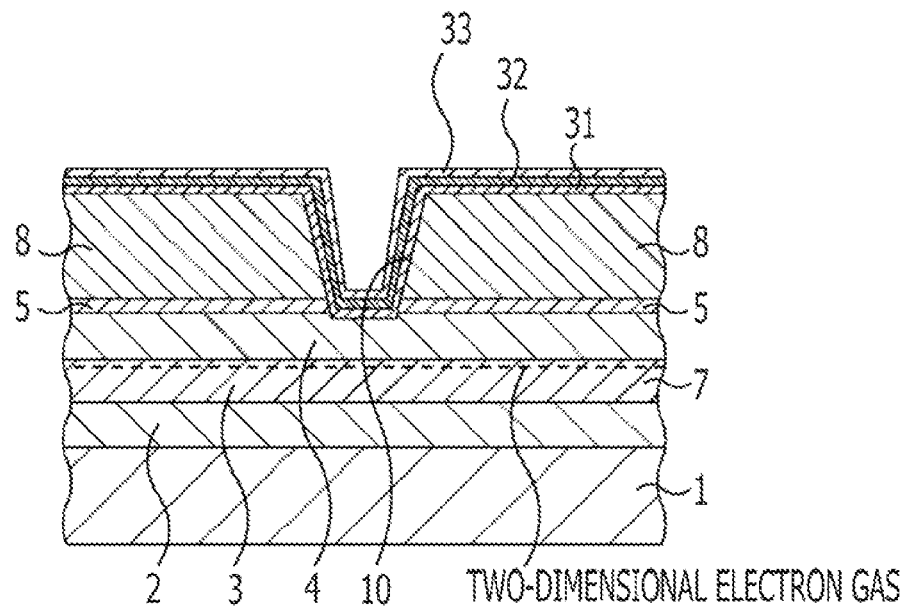
FIGS. 3A and 3B are schematic cross-sectional views illustrating main steps of a method of manufacturing an AlGaN/GaN HEMT according to a modification of the first embodiment.

As illustrated in FIG. 3A, a gate insulator 31, a high-work-function film 32, and a barrier film 33 are formed. Next, in a step the same as that illustrated in FIG. 1F, the conductive material 13 is deposited so as to come into contact with the barrier film 33.

The gate insulator 31, the high-work-function film 32, and the barrier film 33 are formed on the first protective insulating film 8 so as to cover the inner surface of the opening 10.

The gate insulator 31 is formed of an oxide or oxynitride film of one selected from Si, Al, Ti, Ta, Hf, La, Y, and Ni. Alternatively, the gate insulator 31 has a laminated structure of two or more selected from these films. Here, for example, an AlO film is deposited so as to have a thickness of, for example, about 1 nm to about 50 nm, thereby forming the gate insulator 31.

The high-work-function film 32 is formed by depositing one selected from Au, Ni, Co, nitrogen-rich TiN, nitrogen-rich TaN, carbon-rich TaC, Pt, W, Ru, Ni$_3$Si, and Pd in such a manner that the deposited film has a thickness of about 1 nm to about 100 nm. The term "nitrogen-rich TiN" indicates TiN in which the composition ratio of N is larger than that of Ti. The term "nitrogen-rich TaN" indicates TaN in which the composition ratio of N is larger than that of Ta. The term "carbon-rich TaC" indicates TaC in which the composition ratio of C is larger than that of Ta. Here, for example, TiN is deposited so as to have a thickness of about 20 nm, thereby forming the high-work-function film 32.

The barrier film 33 is formed by depositing, for example, a TaN film using PVD, ALD, or the like in such a manner that the TaN film has a thickness of, for example, about 0.1 nm to about 50 nm.

The barrier film 33 is provided between the high-work-function film 32 and the conductive material 13. The presence of the barrier film 33 prevents Al in the conductive material 13 from reaching a portion of the electron supply layer 4 directly below the gate electrode through the gate insulator 31 when the SiC substrate 1 is subjected to heat treatment at 550° C. to 650° C. in the subsequent step. As described below, a higher proportion of nitrogen in the barrier film 33 results in higher barrier properties of the barrier film 33. In the case where nitrogen-rich TaN is formed as the barrier film 33, the resulting nitrogen-rich TaN film preferably has a thickness of 0.1 nm to 10 nm.

Alternatively, without forming the barrier film 33, the high-work-function film 32 may be formed of a nitrogen-rich TaN film in the same way as the barrier film 33 (that is, the high-work-function film 32 is formed so as to also serve as a barrier film), and then the conductive material 13 may be deposited so as to come into contact with the high-work-function film 32.

Steps the same as those illustrated in FIGS. 1G to 1M according to the first embodiment are performed.

In the step illustrated in FIG. 1H, the conductive material 13, the barrier film 33, and the high-work-function film 32 are dry-etched using the resist mask 14 to form the gate electrode 15. Here, the case where the gate insulator 31 is not etched and is left on the first protective insulating film 8 is exemplified. Alternatively, the gate insulator 31 may also be etched.

Figure 3B:
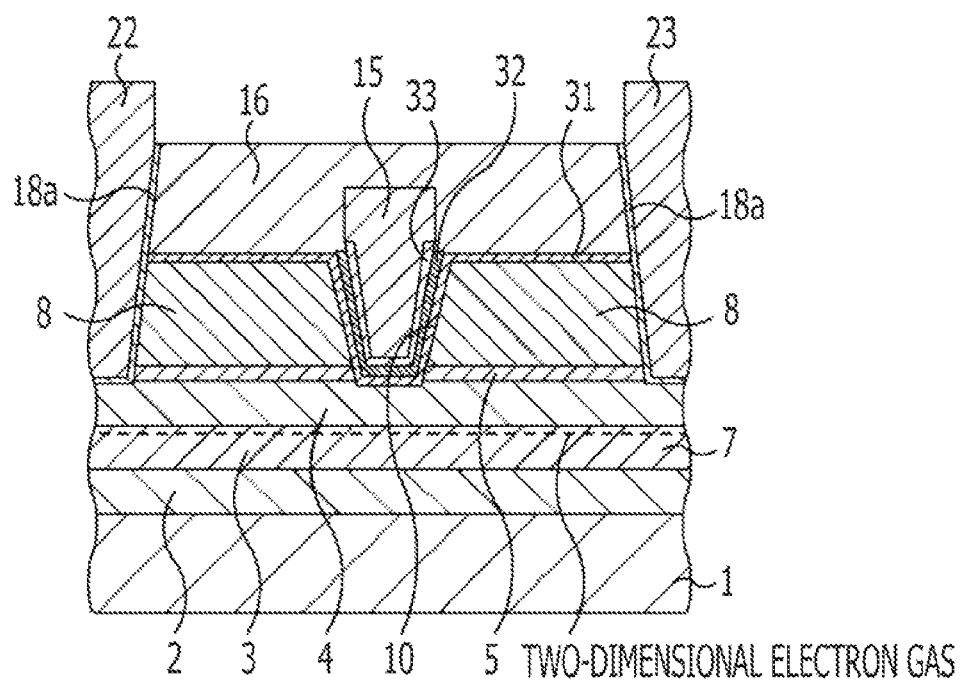

As illustrated in FIG. 3B, the SiC substrate 1 is subjected to heat treatment. This heat treatment is performed for 0 to 180 seconds at about 550° C. to about 650° C. in an atmosphere selected from the group consisting of noble gases, nitrogen, oxygen, ammonia, hydrogen gas, and mixtures thereof. Here, for example, the heat treatment is performed in an N$_2$ atmosphere at 600° C. for 60 seconds. As described in the first embodiment, the low-work-function film 18 is formed into the TaAl$_3$ film 18a by the heat treatment to form spikes, thereby reducing the contact resistance between the electron supply layer 4 and the source electrode 22 and between the electron supply layer 4 and the drain electrode 23. As described below, with respect to the temperature in the heat treatment, the reactivity between Ta and Al is increased at 550° C. or higher, maximized at 650° C., and satisfactorily maintained at 700° C. For this reason, an appropriate temperature in the heat treatment is in the range of about 550° C. to about 700° C. and preferably about 550° C. to about 650° C. as described above.

In this modification, the barrier film 33 is provided between the gate electrode 15 and the high-work-function film 32. The presence of the barrier film 33 prevents the diffusion of Al in the gate electrode 15 to the high-work-function film 32 during the heat treatment. Thus, spikes of Al of the gate electrode 15 are not formed for the gate insulator 31, so that the occurrence of gate leakage is suppressed. Furthermore, the presence of the barrier film 33 results in a predetermined shallow quantum well without diffusing Al having a low work function into a portion directly above the gate insulator 31.

Subsequently, steps the same as those illustrated in FIGS. 1N and 1O according to the first embodiment are performed to form the connecting portions 26a, 26b, and 26c of the gate electrode 15, the source electrode 22, and the drain electrode 23.

Subsequently, steps of forming, for example, an upper interlayer insulator and a line are performed to form the AlGaN/GaN HEMT according to this modification.

Some experiments to check the effects of this modification will be described below.

[Experiment 1]

Figure 4:
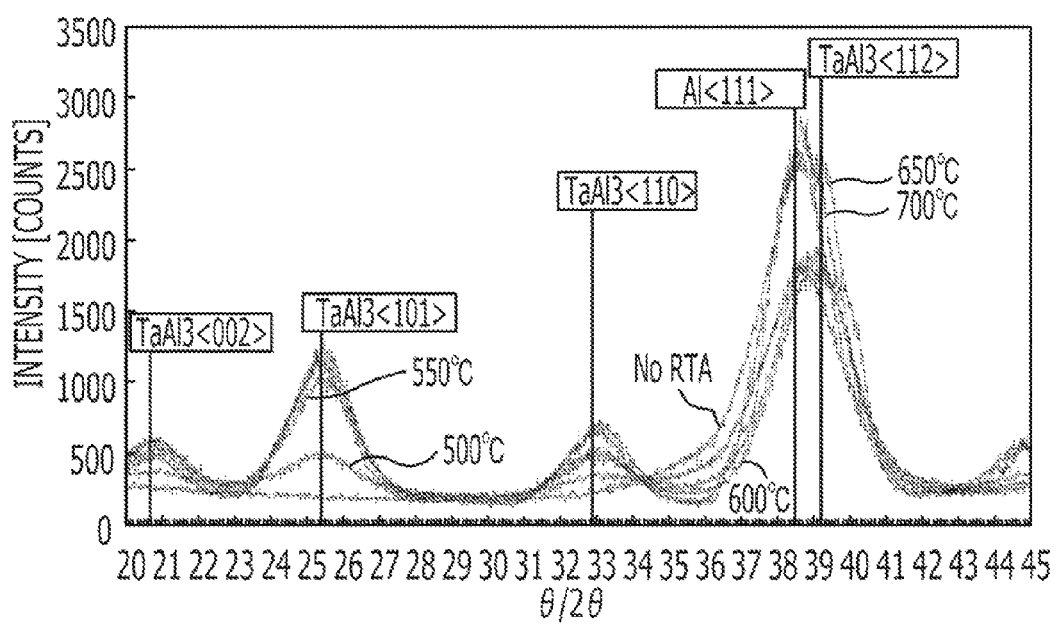
FIG. 4 is a characteristic diagram illustrating the results of Experiment 1 according to the modification of the first embodiment.

Thermal oxide films (silicon oxide films) were formed on predetermined blanket substrates. A Ta film was formed on each of the thermal oxide films so as to have a thickness of about 10 nm. Subsequently, an Al film was formed on the Ta film so as to have a thickness of about 300 nm. In this way, samples were manufactured. These samples were subjected to heat treatment at different temperatures and then characterized by X-ray diffraction spectroscopy (XRD). FIG. 4 illustrates the results. The results demonstrated that the peak of TaAl$_3$ was observed at the heat treatment temperature of about 550° C. This experiment demonstrated that heat treatment at 550° C. to 650° C. allowed Ta and Al to interdiffuse, thereby forming a TaAl$_3$ film.

[Experiment 2]

Figure 5:
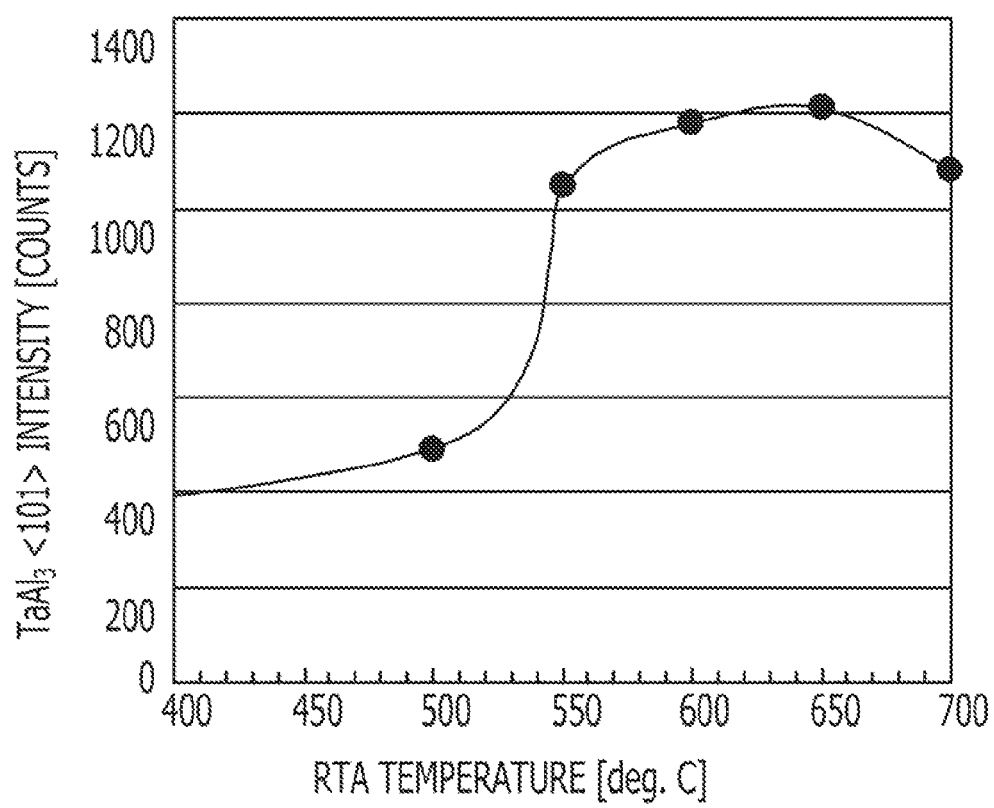
FIG. 5 is a characteristic diagram illustrating the results of Experiment 2 according to the modification of the first embodiment.

In FIG. 4 of Experiment 1, the relationship between the intensity of a peak attributed to TaAl$_3$ <101> and the heat treatment temperature was studied. FIG. 5 illustrates the results. The results demonstrated that the intensity of the peak attributed to TaAl$_3$ <101> was significantly increased at a heat treatment temperature of 550° C. or higher. This experiment demonstrated that in the case where the source electrode 22 and the drain electrode 23, which are contact portions, were subjected to heat treatment, the heat treatment temperature was preferably 550° C. or higher.

[Experiment 3]

Figure 6:
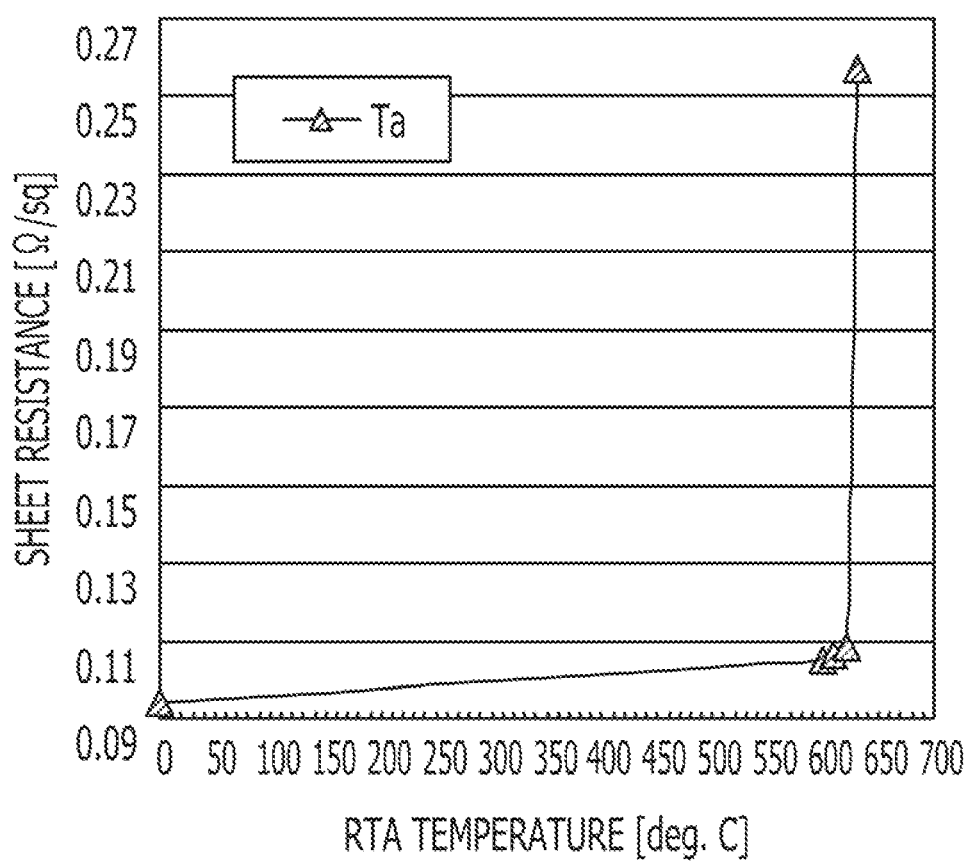
FIG. 6 is a characteristic diagram illustrating the results of Experiment 3 according to the modification of the first embodiment.

Samples manufactured as in Experiment 1 were subjected to heat treatment at different temperatures. The sheet resistance of each heat-treated sample was measured. FIG. 6 illustrates the results. The results demonstrated that the sheet resistance was increased by the heat treatment. This experiment demonstrated that the heat treatment allowed Ta and Al to interdiffuse.

[Experiment 4]

Figure 7:
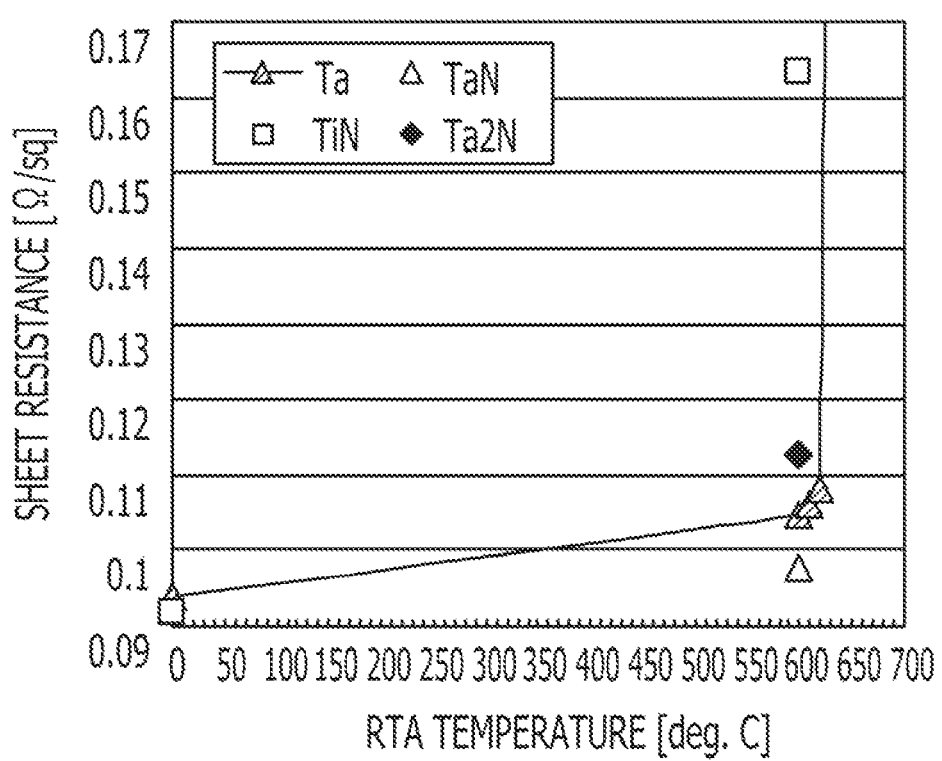
FIG. 7 is a characteristic diagram illustrating the results of Experiment 4 according to the modification of the first embodiment.

Thermal oxide films were formed on blanket substrates. A Ta film, a TaN film, a Ta$_2$N (metal-rich) film, and a TiN film were formed on the respective thermal oxide films. Furthermore, an Al film was formed on each of the Ta film, the TaN film, the Ta$_2$N film, and the TiN film so as to have a thickness of about 300 nm, thereby manufacturing samples. The samples were subjected to heat treatment at different temperatures. The sheet resistance of each heat-treated sample was measured. FIG. 7 illustrates the results. The results demonstrated that the degree of an increase in sheet resistance varied depending on the samples. Ta, TaN, and TiN have work functions of 4.3 eV, 4.6 eV, and 4.8 eV, respectively. FIG. 7 demonstrates that the degree of the increase in the sheet resistance of the sample including TiN having the highest work function is the highest and that TiN and Al interdiffuse easily.

[Experiment 5]

Figure 8:
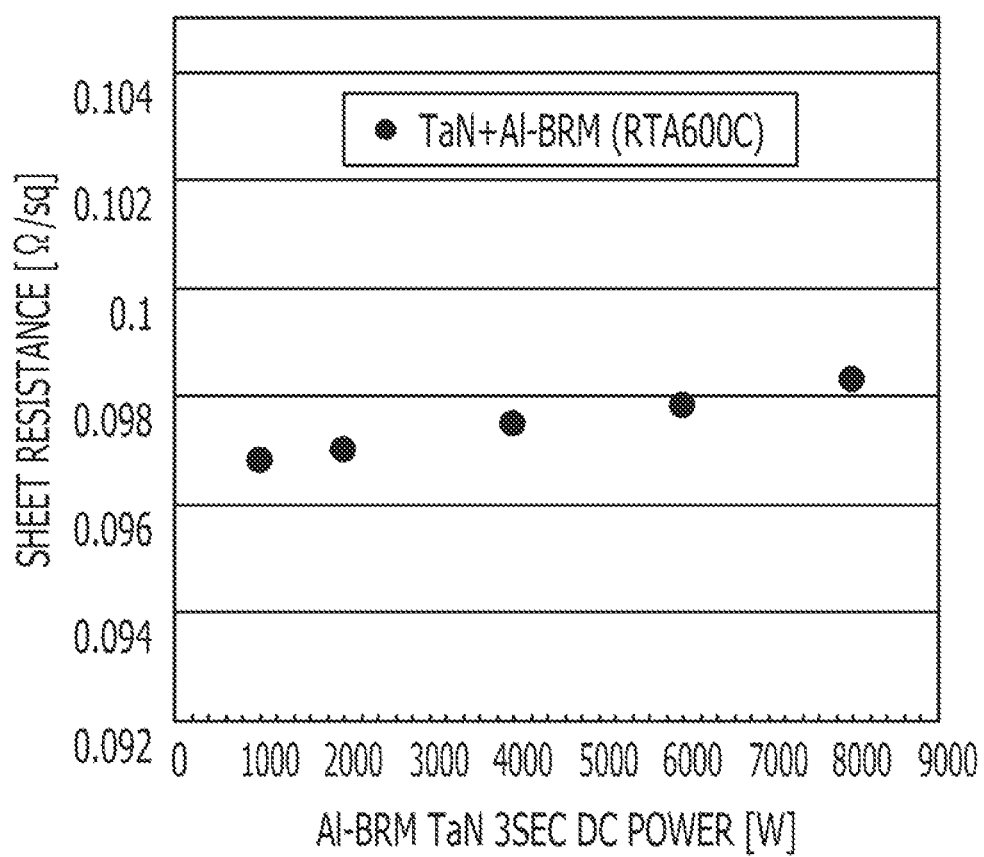
FIG. 8 is a characteristic diagram illustrating the results of Experiment 5 according to the modification of the first embodiment.

Thermal oxide films were formed on blanket substrates. TaN films were formed on the respective thermal oxide films at different deposition conditions. The TaN films of the samples were formed by PVD at different DC power levels, provided that the deposition time and the $N_2$ partial pressure ($N_2/Ar+N_2$) were fixed to about 3 seconds and about 60%, respectively. Furthermore, an Al film was formed on each of the TaN films so as to have a thickness of about 300 nm, thereby manufacturing samples. The samples were subjected to heat treatment at about 600° C. The sheet resistance of each heat-treated sample was measured. FIG. 8 illustrates the results. It is commonly known that in the case of forming a TaN film by PVD, a reduction in DC power results in an increase in the proportion of nitrogen in TaN. Also in this experiment, nitrogen-rich TaN films were manufactured at lower DC power levels. The experimental results demonstrate that an increase in the proportion of nitrogen in TaN results in a reduction in sheet resistance, which means a reduction in the impurity content in Al. This indicates that a higher proportion of nitrogen in TaN results in effective suppression of the reaction with Al, i.e., higher barrier properties against Al.

[Experiment 6]

Figure 9:
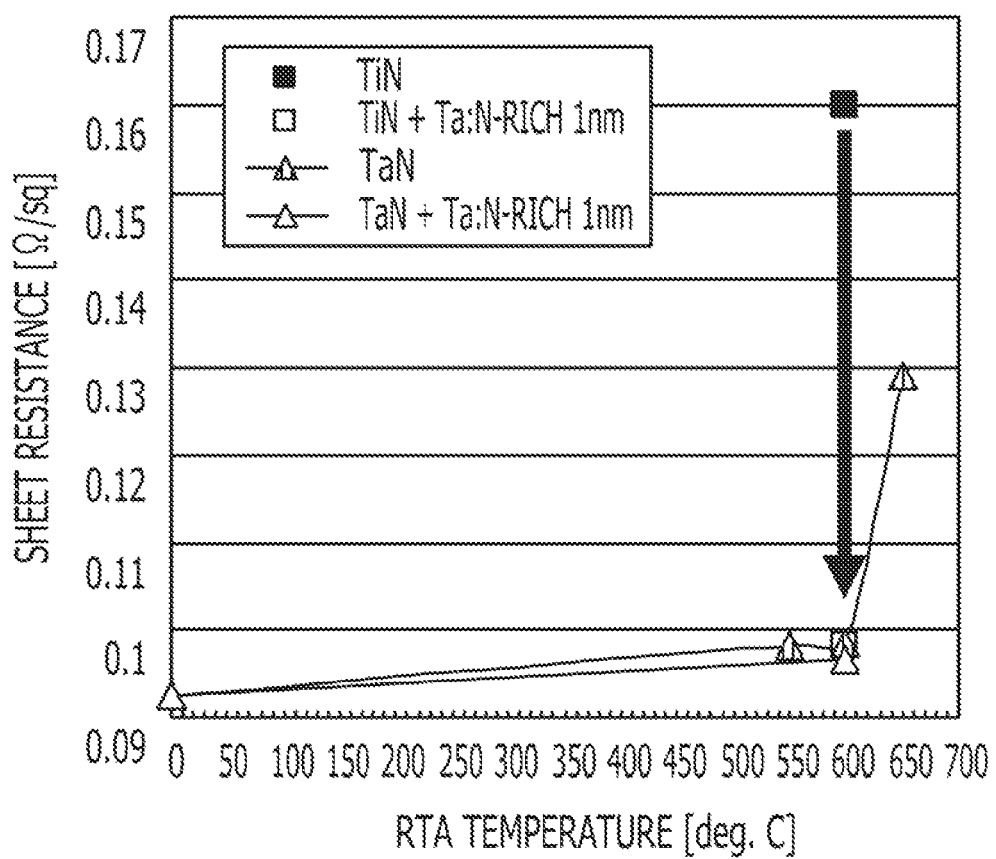
FIG. 9 is a characteristic diagram illustrating the results of Experiment 6 according to the modification of the first embodiment.

A thermal oxide film was formed on a blanket substrate. A TiN film and a nitrogen-rich TaN were formed on the thermal oxide films. Furthermore, an Al film is formed on the TaN film so as to have a thickness of about 300 nm, thereby manufacturing a sample. As reference samples, thermal oxide films were formed on blanket substrates. A TiN film, a TaN film, and a TaN film+a nitrogen-rich TaN film were formed on the respective thermal oxide films. An Al film was formed on each of the films so as to have a thickness of about 300 nm. Each of the nitrogen-rich TaN films was formed by PVD at a DC power as low as about 1 kW so as to have a thickness of about 1 nm, provided that the $N_2$ partial pressure ($N_2/Ar+N_2$) was fixed to about 60%. The resulting TaN film had a very high nitrogen content. The sample and the reference samples were subjected to heat treatment at about 600° C. The sheet resistance of each of the sample and reference samples was measured. FIG. 9 illustrates the results. The sample in which the nitrogen-rich TaN film was arranged between the TiN film and the Al film had a low sheet resistance. This demonstrates that the nitrogen-rich TaN film prevents the TiN film and the Al film from being mixed. This experiment demonstrated that the nitrogen-rich TaN film had excellent barrier properties against Al and is thus suitable as a barrier film against Al.

As described above, according to this modification, the gate electrode 15, the source electrode 22, and the drain electrode 23 of the AlGaN/GaN HEMT are formed not by the lift-off process but by a simple method without causing a defect in any pattern, thereby simply and reliably manufacturing the AlGaN/GaN HEMT having excellent device properties, in which the occurrence of gate leakage is prevented.

[Second Embodiment]

In this embodiment, with respect to an AlGaN/GaN HEMT, the case where a source electrode and a drain electrode are formed before the formation of a gate electrode. Note that components equivalent to those in the first embodiment are designated using the same reference numerals.

In this embodiment, the steps illustrated in FIGS. 1A to 1D are performed as in the first embodiment.

Figure 10A:
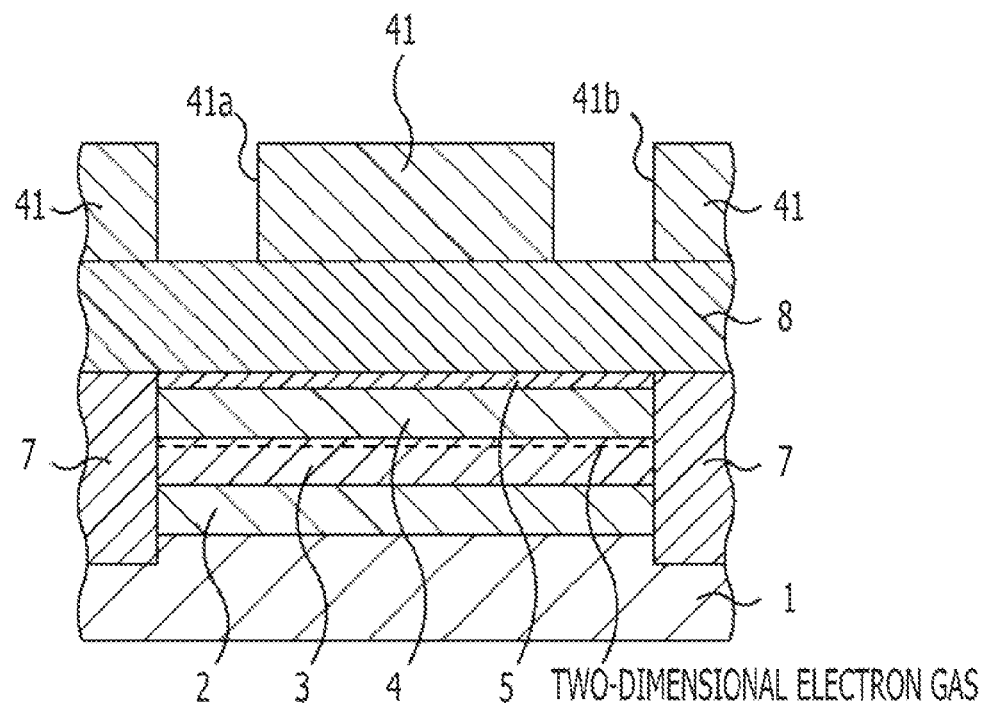
FIGS. 10A to 10N are schematic cross-sectional views of a method of manufacturing an AlGaN/GaN HEMT according to a second embodiment.

As illustrated in FIG. 10A, a resist mask 41 is formed on the first protective insulating film 8.

A resist is applied on the entire surface of the first protective insulating film 8 and processed by lithography, thereby forming the resist mask 41 having a pair of openings 41a and 41b that exposes portions of the first protective insulating film 8 where the source electrode and the drain electrode will be formed.

Figure 10B:
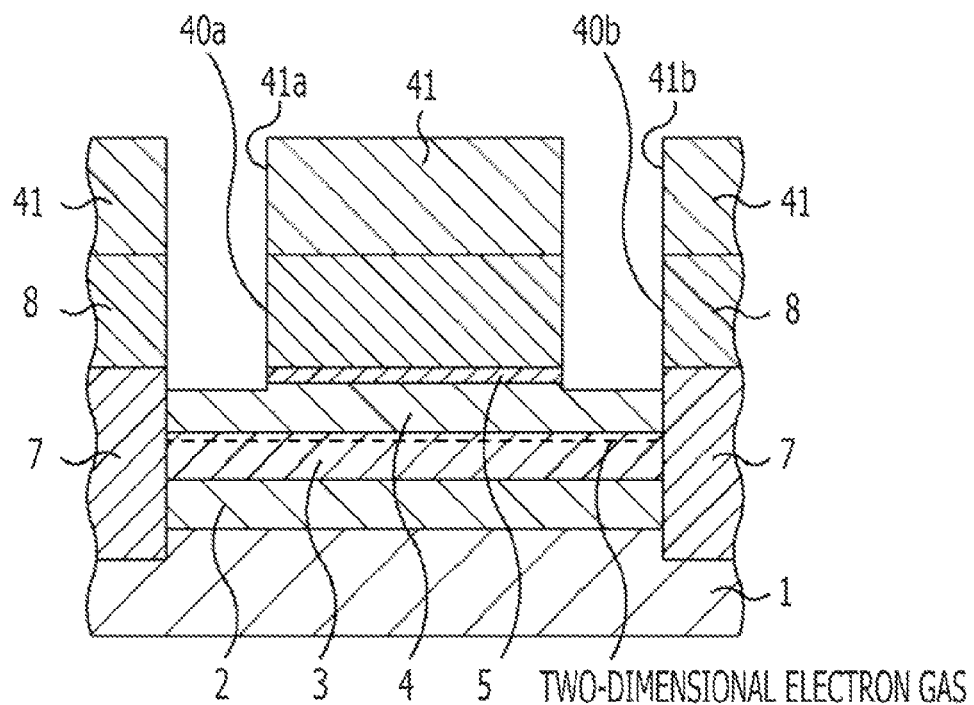

As illustrated in FIG. 10B, a pair of openings 40a and 40b is formed in the first protective insulating film 8 and the cap layer 5.

The first protective insulating film 8 and the cap layer 5 are subjected to dry etching with the resist mask 41 to form the openings 40a and 40b. The dry etching is performed with a fluorine-containing gas, for example, a mixed gas of $CHF_3$, $CF_3$, and Ar, as an etching gas at a pressure of about 1.7 Torr and an RF power of, for example, about 650 W. The openings 40a and 40b that partially expose the surface of the electron supply layer 4 are formed in the cap layer 5 and the first protective insulating film 8 by the dry etching. The exposed portions of the electron supply layer 4 are portions where the source electrode and the drain electrode will be formed. Here, in order to reliably expose the portions of the surface of the electron supply layer 4, as illustrated in the figure, a surface of the electron supply layer 4 may be etched (to form a shallow recess in the surface).

Then the resist mask 41 is removed by ashing or the like.

Figure 10C:
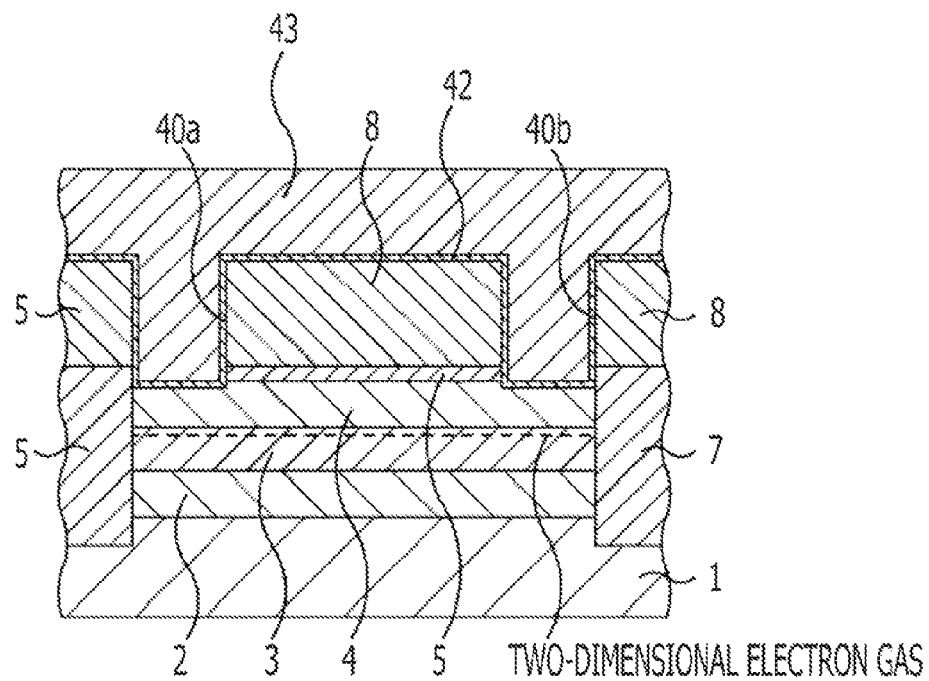

As illustrated in FIG. 10C, after the formation of a low-work-function film 42, a conductive material 43 is deposited.

The low-work-function film 42 is formed on the first protective insulating film 8 as an underlying conductive film so as to cover inner surfaces of the openings 40a and 40b. The low-work-function film 42 is formed by depositing one selected from Al, Ti, metal-rich TiN, Ta, metal-rich TaN, Zr, metal-rich TaC, $NiSi_2$, and Ag in such a manner that the deposited film has a thickness of about 1 nm to about 100 nm. Here, for example, a Ta film is deposited by PVD or the like at a DC power of, for example, 1 kW to 10 kW so as to have a thickness of about 10 nm, thereby forming the low-work-function film 42. The formation of the low-work-function film 42 reduces the barrier between the electrode material and a portion of the electron supply layer 4 directly below the gate electrode, thereby forming the source electrode and the drain electrode with low contact resistance.

The conductive material 43, such as Al, is deposited on the entire surface of the low-work-function film 42 by PVD or the like at a DC power of, for example, 1 kW to 10 kW in such a manner that the resulting film of the conductive material 19 has a thickness of about 300 nm and that the openings 40a and 40b are filled with the conductive material via the low-work-function film 42.

Figure 10D:
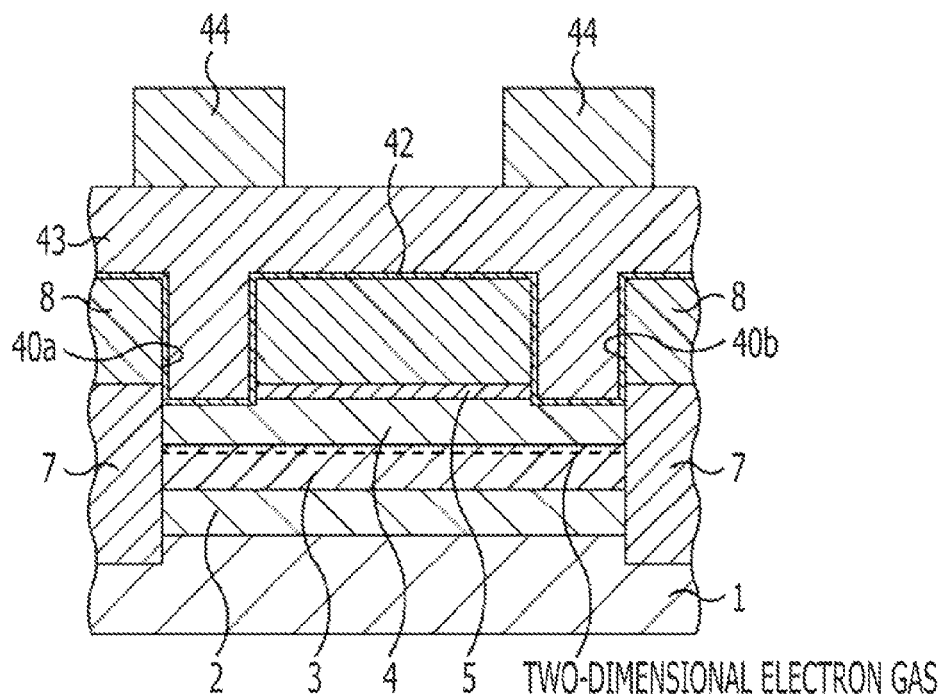

As illustrated in FIG. 10D, a resist mask 44 is formed on the conductive material 43.

A resist is applied on the entire surface of the conductive material 43 and processed by lithography, thereby forming the resist mask 44 that covers portions of the conductive material 43 where the source electrode and the drain electrode will be formed.

Figure 10E:
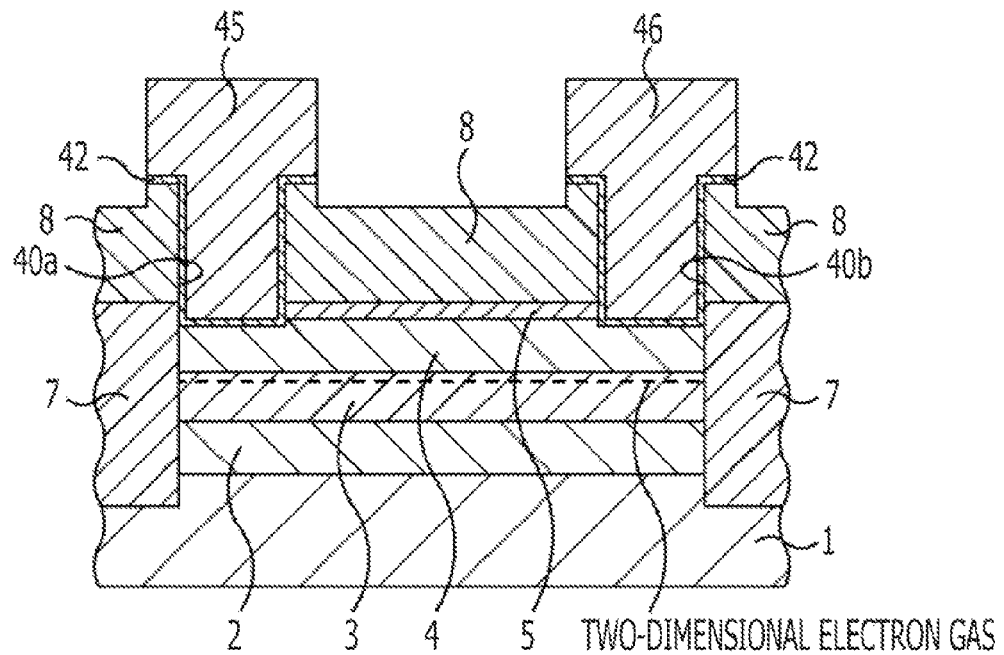

As illustrated in FIG. 10E, a source electrode 45 and a drain electrode 46 are formed.

The conductive material 43 and the low-work-function film 42 are dry-etched using the resist mask 44. Here, in order to reliably separate the source electrode and the drain electrode from each other, as illustrated in the figure, etching may be performed so as to expose a surface of the first protective insulating film 8. This dry etching results in the formation of the source electrode 45 and the drain electrode 46 in which the openings 40a and 40b are filled with the conductive material 43 via the low-work-function film 42 and which protrude from the first protective insulating film 8.

Then the resist mask 44 is removed by ashing or the like.

In this embodiment, the source electrode 45 and the drain electrode 46 of the AlGaN/GaN HEMT are formed by lithography and dry etching. Here, the first protective insulating film 8 is formed, and then the source electrode 45 and the drain electrode 46 are formed in such a manner that the openings 40a and 40b are filled with the conductive material 43. The presence of the first protective insulating film 8 protects the compound semiconductor layers, thereby minimizing damage from, for example, the dry etching during the formation of the source and drain electrodes to the compound semiconductor layers, such as the electron supply layer 4. As described above, in this embodiment, when the source electrode 45 and the drain electrode 46 are formed, the lithography and the dry etching are performed using the first protective insulating film 8, without employing the lift-off process. Unlike the lift-off process, part of the conductive material is not redeposited above the SiC substrate 1, and the satisfactory source electrode 45 and the drain electrode 46 are formed without damaging the compound semiconductor layers.

The SiC substrate 1 is subjected to heat treatment in, for example, an $N_2$ atmosphere at about 600° C. for about 60 seconds.

Figure 10F:
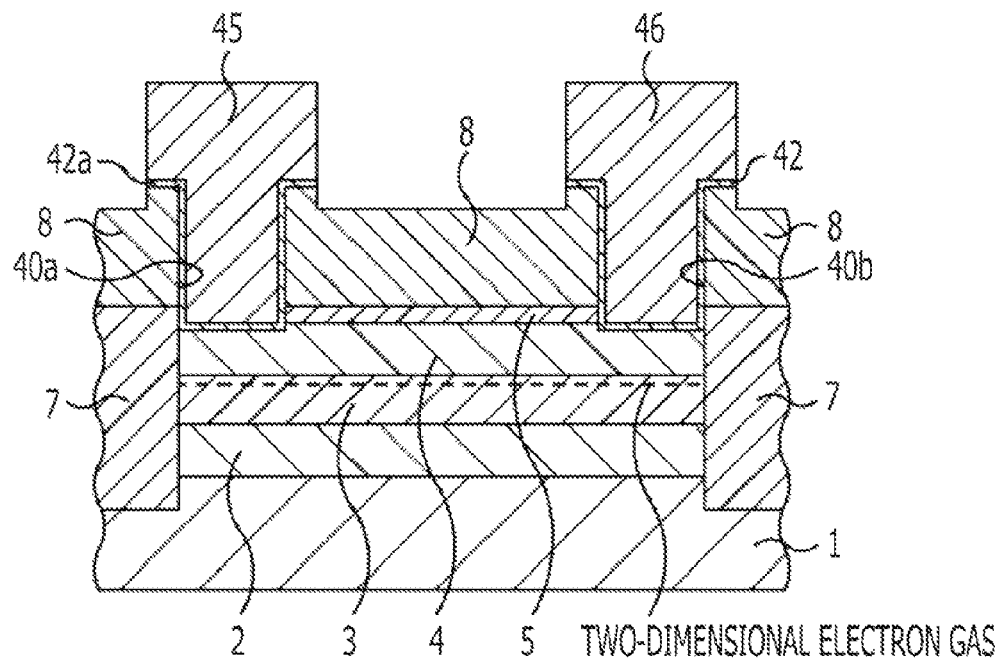

As illustrated in FIG. 10F, the heat treatment allows Ta in the low-work-function film 42 to react with Al in the conductive material 43, so that the low-work-function film 42 is formed into a $TaAl_3$ film 42a. The heat treatment results in the formation of minute spikes of the $TaAl_3$ film 42a at bottoms of the openings 40a and 40b, i.e., portions of the electron supply layer 4 directly below the source electrode 45 and the drain electrode 46, thereby reducing the contact resistance between the electron supply layer 4 and the source electrode 45 and between the electron supply layer 4 and the drain electrode 46. Furthermore, Al has a low work function. This also contributes to a reduction in contact resistance.

Figure 10G:
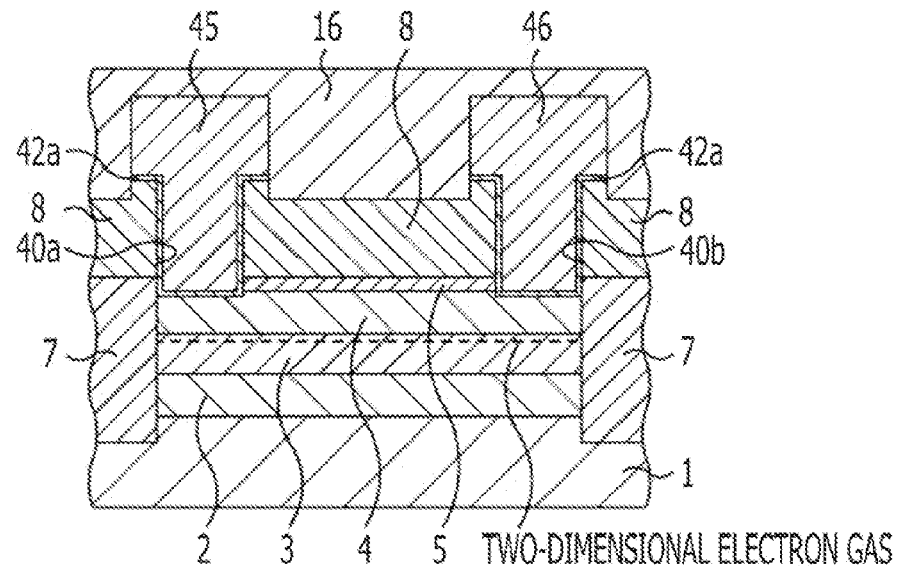

As illustrated in FIG. 10G, the second protective insulating film 16 is formed.

An insulating film, such as a silicon oxide film, having a thickness of about 300 nm is formed on the entire surface of the first protective insulating film 8 by, for example, plasma-enhanced CVD so as to cover the source electrode 45 and the drain electrode 46, thereby forming the second protective insulating film 16. Here, bumps attributed to projecting portions of the source electrode 45 and the drain electrode 46 are formed on portions of the second protective insulating film 16 above the source electrode 45 and the drain electrode 46. To remove the bumps, surface polishing is preferably performed by, for example, CMP. In this case, for example, the silicon oxide film or the like is deposited so as to have a thickness of about 500 nm to about 1000 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the second protective insulating film 16. In FIG. 10G, the second protective insulating film 16 having a surface planarized by CMP is illustrated.

With respect to a method for forming the second protective insulating film, a silicon oxide film or the like may be formed by, for example, spin coating in place of plasma-enhanced CVD and is subjected to curing treatment to form the second protective insulating film.

Figure 10H:
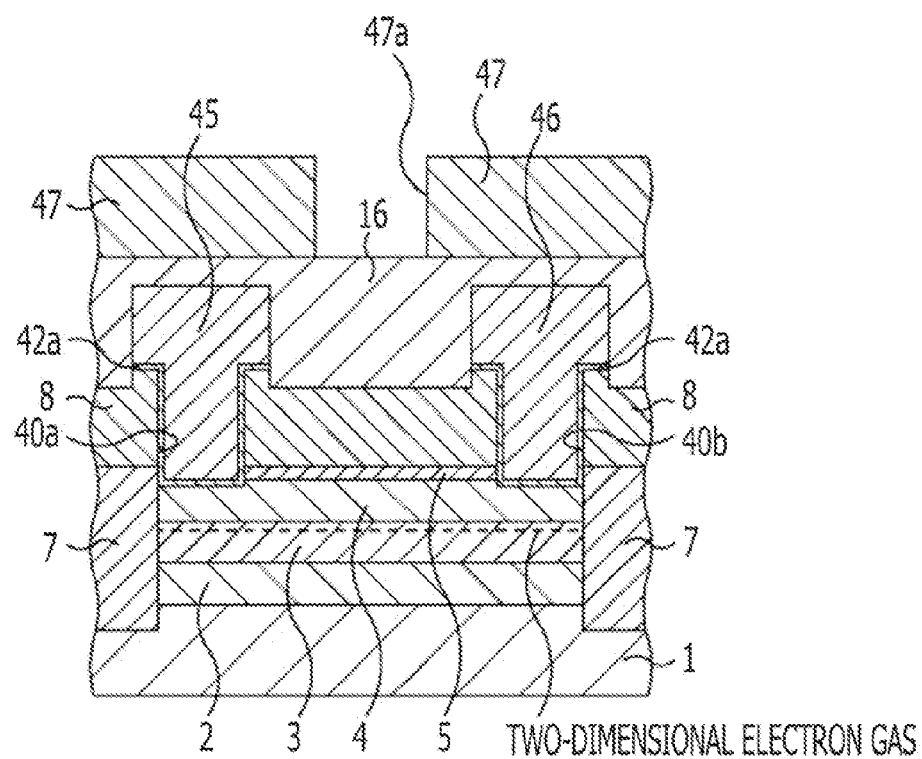

As illustrated in FIG. 10H, a resist mask 47 is formed on the second protective insulating film 16.

A resist is applied on the entire surface of the second protective insulating film 16 and processed by lithography, thereby forming the resist mask 47 having an opening 47a that exposes a portion of the second protective insulating film 16 where the gate electrode will be formed.

Figure 10I:
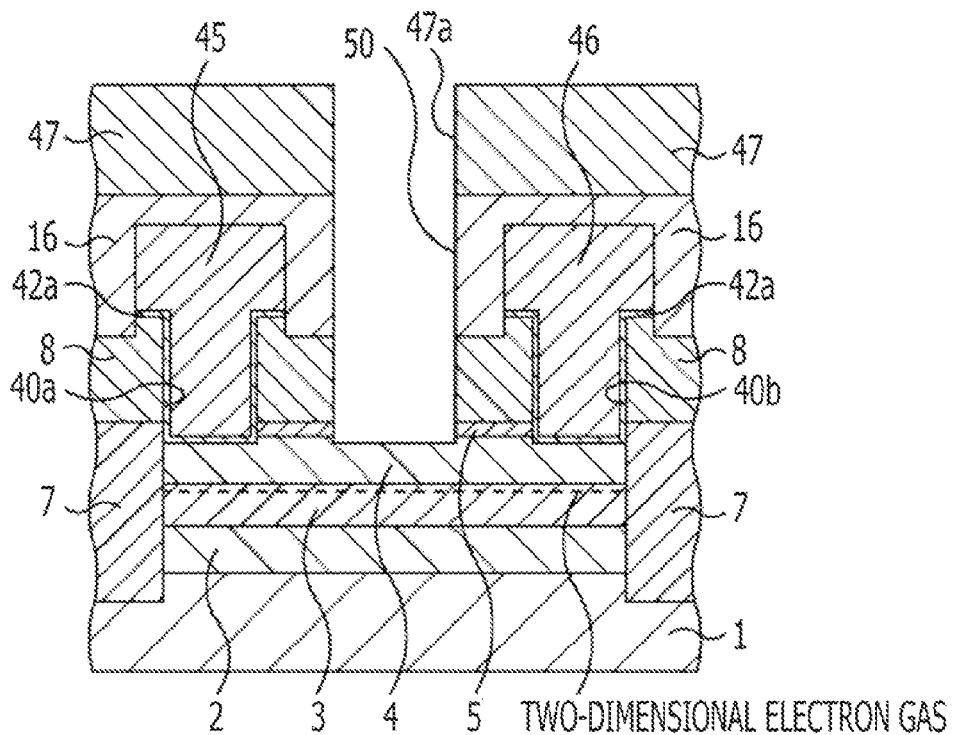

As illustrated in FIG. 10I, the second protective insulating film 16, the first protective insulating film 8, and the cap layer 5 are subjected to dry etching to form an opening 50. The dry etching is performed with a fluorine-containing gas, for example, a mixed gas of $CHF_3$, $CF_3$, and Ar, as an etching gas at a pressure of about 1.7 Torr and an RF power of, for example, about 650 W. The opening 50 that partially exposes the surface of the electron supply layer 4 is formed in the second protective insulating film 16, the first protective insulating film 8, and the cap layer 5 by this dry etching. The exposed portion of the electron supply layer 4 is a portion where the gate electrode will be formed. In this embodiment, as illustrated in the figure, a surface of the electron supply layer 4 is also subjected to dry etching (to form a shallow recess in the surface). This makes it possible to extend a depletion layer directly below the gate electrode and to form a shallow quantum well. That is, the electrical elimination of the 2DEG directly below the gate electrode provides a normally-off operation.

Then the resist mask 47 is removed by ashing or the like.

Figure 10J:
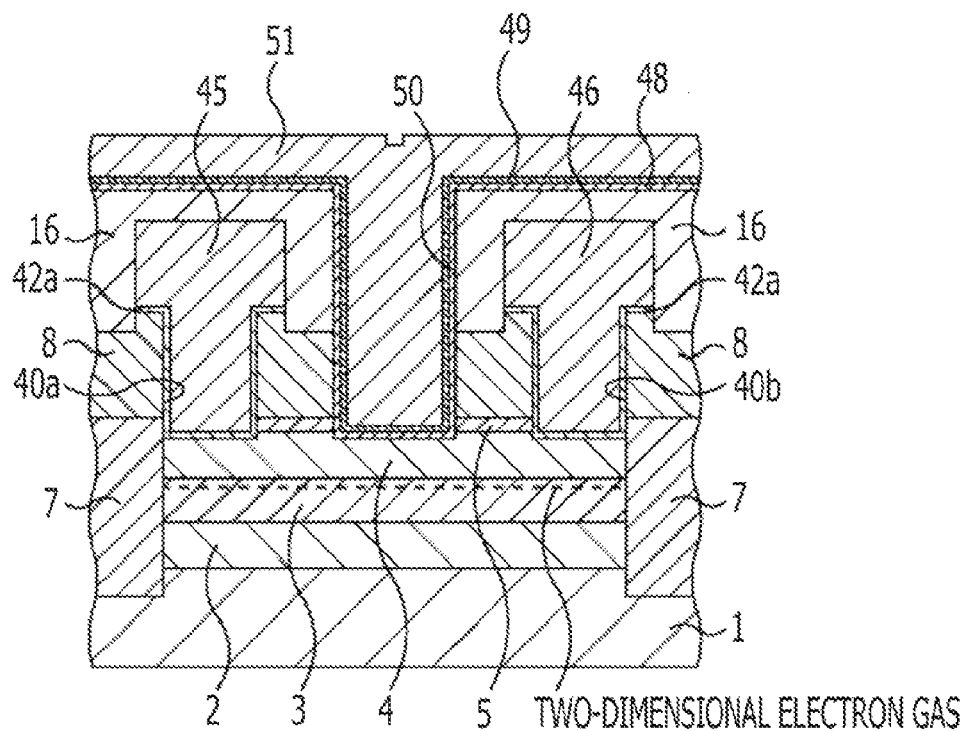

As illustrated in FIG. 10J, after the formation of a gate insulator 48 and a high-work-function film 49, a conductive material 51 is deposited.

The gate insulator 48 and the high-work-function film 49 are sequentially formed on the second protective insulating film 16 so as to cover the inner surface of the opening 50.

The gate insulator 48 is formed by depositing, for example, an AlO film having a thickness of, for example, about 20 nm by ALD or the like. The gate insulator 48 may be formed of a TaO film, or a high-dielectric (high-k) oxide or oxynitride film of Hf, Ti, or Zr, in place of the AlO film. Alternatively, the gate insulator 48 may have a laminated structure of two or more selected from the AlO film, the TaO film, and the high-k film.

The high-work-function film 49 is formed by depositing, for example, a TaN film having a thickness of, for example, about 40 nm by physical vapor deposition (PVD) or the like. The formation of the high-work-function film 49 provides a shallow quantum well directly below the gate electrode, thereby reducing the 2DEG directly below the gate electrode when the gate voltage is 0 V.

The conductive material 51, such as Al, is deposited on the entire surface of the high-work-function film 49 by PVD or the like in such a manner that the resulting film of the conductive material 51 has a thickness of about 20 nm to about 500 nm, for example, about 400 nm and that the opening 50 is filled with the conductive material 51 via the gate insulator 48 and the high-work-function film 49.

Figure 10K:
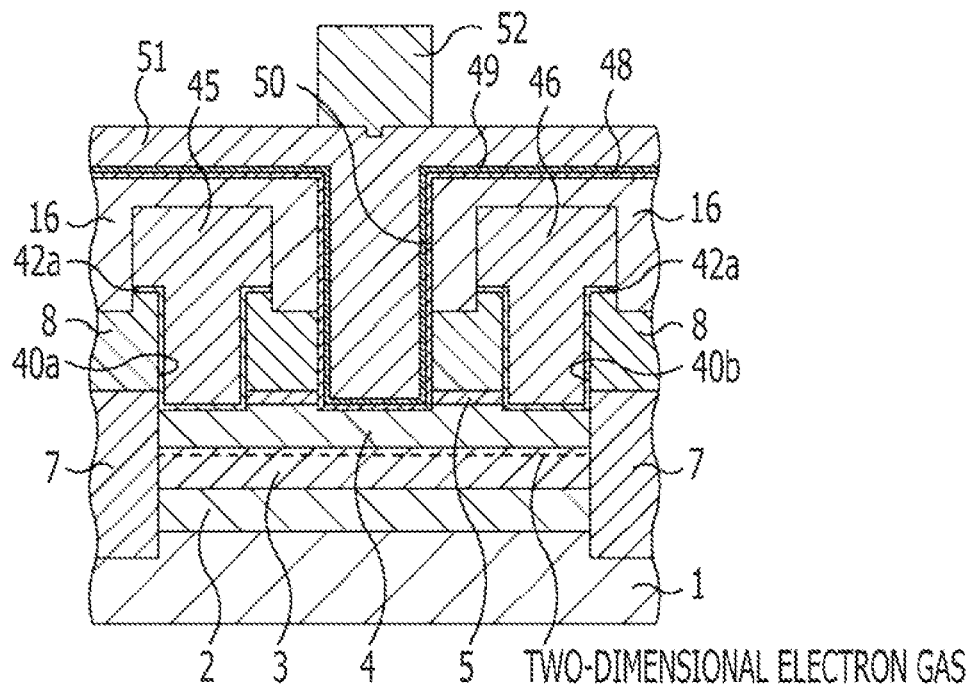

As illustrated in FIG. 10K, a resist mask 52 is formed on the conductive material 51.

A resist is applied on the entire surface of the conductive material 51 and processed by lithography, thereby forming the resist mask 52 that covers a portion of the conductive material 51 where the gate electrode will be formed.

Figure 10L:
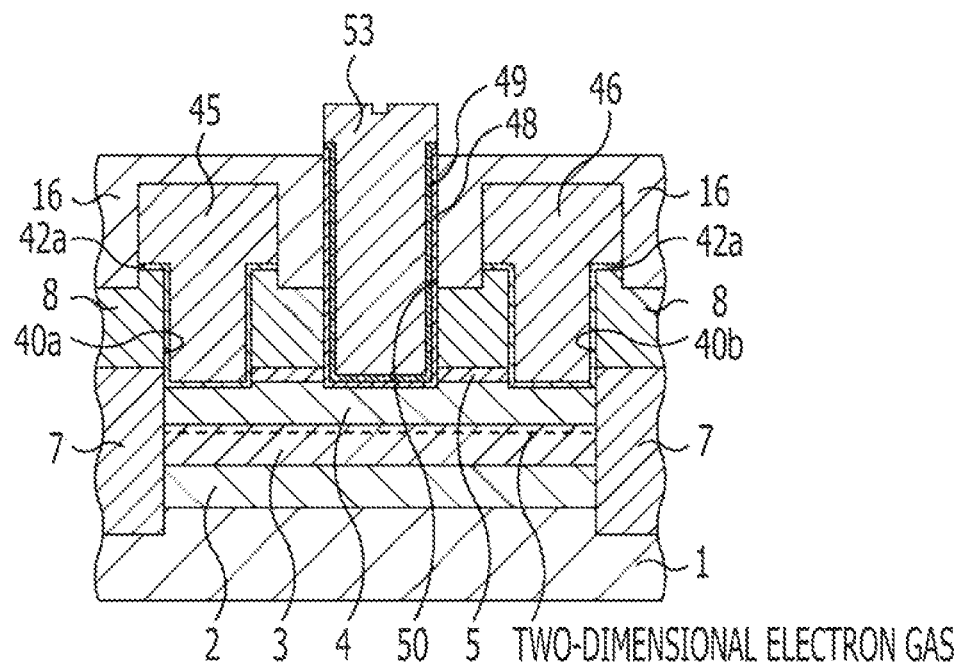

As illustrated in FIG. 10L, a gate electrode 53 is formed.

The conductive material 51, the high-work-function film 49, and the gate insulator 48 are dry-etched using the resist mask 52, thereby forming the gate electrode 53 in which the opening 50 is filled with the conductive material 51 via the gate insulator 48 and the high-work-function film 49 and which protrudes from the second protective insulating film 16. Here, the conductive material 51 and the high-work-function film 49 may be dry-etched to leave the gate insulator 48 on the second protective insulating film 16.

Then the resist mask 52 is removed by ashing or the like.

In this embodiment, the gate electrode 53 of the AlGaN/GaN HEMT is formed by lithography and dry etching. In this case, the first and second protective insulating films 8 and 16 are formed, and then the gate electrode 53 is formed in such a manner that the opening 50 is filled with the conductive material 51. The presence of the first and second protective insulating films 8 and 16 protects the compound semiconductor layers, thereby minimizing damage from, for example, the dry etching during the formation of the gate electrode to the compound semiconductor layers, such as the electron supply layer 4. As described above, in this embodiment, when the gate electrode 53 is formed, the lithography and the dry etching are performed using the first and second protective insulating films 8 and 16, without employing the lift-off process. Unlike the lift-off process, part of the conductive material is not redeposited above the SiC substrate 1, and the satisfactory gate electrode 53 is formed without damaging the compound semiconductor layers.

In this embodiment, the source electrode 45 and the drain electrode 46 are formed before the formation of the gate electrode 53. Thus, heat treatment to reduce the contact resistance of the source electrode 45 and the drain electrode 46 can be performed in a state in which the gate electrode is not formed. So, the barrier layer against Al as described in the modification of the first embodiment may not be formed, thereby leading to a simple manufacturing process.

Figure 10M:
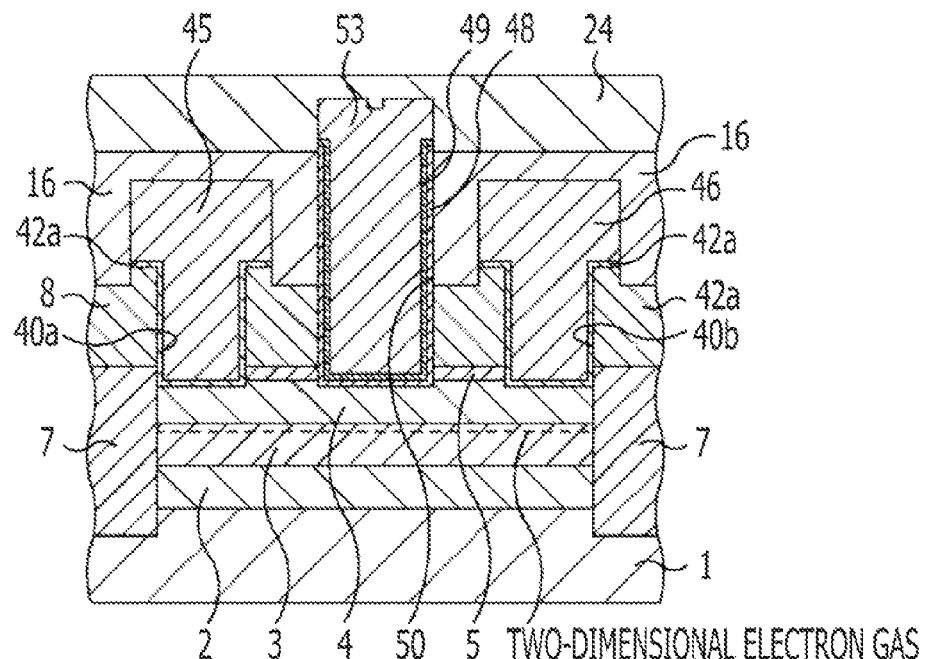

As illustrated in FIG. 10M, the interlayer insulator 24 is formed.

An insulating film, such as a silicon oxide film, having a thickness of about 1000 nm is formed on the entire surface of the second protective insulating film 16 by, for example, plasma-enhanced CVD so as to cover the gate electrode 53, thereby forming the interlayer insulator 24. Here, a bump attributed to a projecting portion of the gate electrode 53 is formed on a portion of the interlayer insulator 24 above the gate electrode 53. To remove the bump, surface polishing is preferably performed by, for example, chemical-mechanical polishing (CMP). In this case, the silicon oxide film or the like is deposited so as to have a thickness of about 1000 nm to about 1500 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the interlayer insulator 24. In FIG. 10M, the interlayer insulator 24 having a surface planarized by CMP is illustrated.

With respect to a method for forming the interlayer insulator, a silicon oxide film or the like may be formed by, for example, spin coating in place of plasma-enhanced CVD and is subjected to curing treatment to form the interlayer insulator.

Figure 10N:
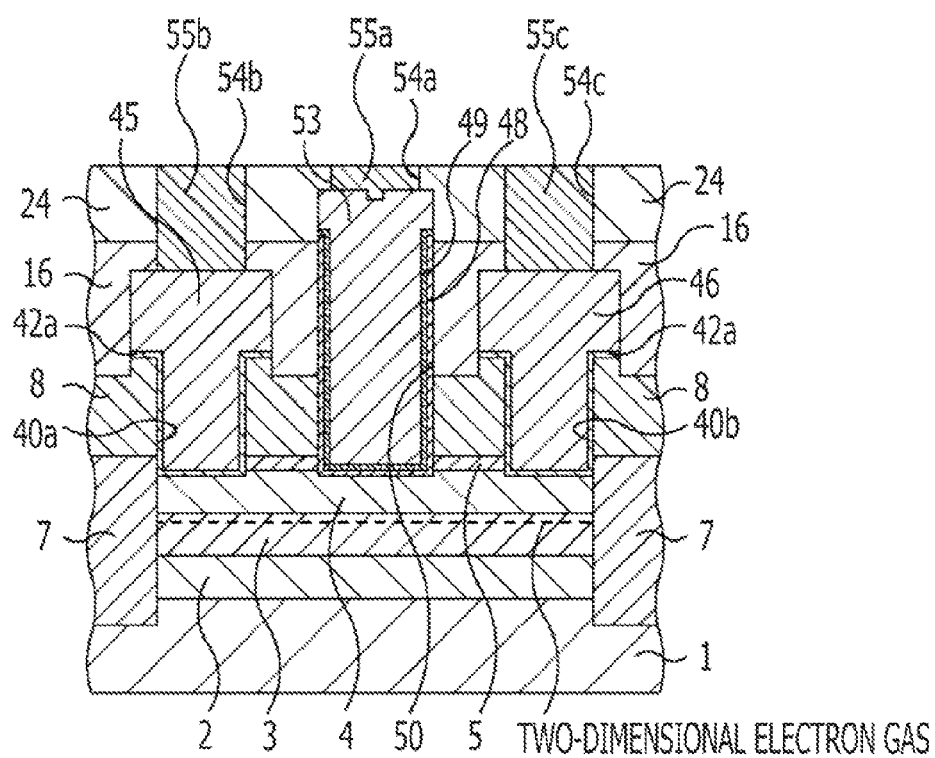

As illustrated in FIG. 10N, a connecting portion 55a of the gate electrode 53, a connecting portion 55b of the source electrode 45, and a connecting portion 55c of the drain electrode 46 are formed.

The second protective insulating film 16 and the interlayer insulator 24 are processed by lithography and dry etching, thereby forming openings 54a, 54b, and 54c that partially expose respective surfaces of the gate electrode 53, the source electrode 45, and the drain electrode 46.

A conductive material, such as Al, is deposited on the interlayer insulator 24 by, for example, sputtering or plating in such a manner that the openings 54a, 54b, and 54c are filled with the conductive material. The conductive material is polished by CMP using a surface of the interlayer insulator 24 as a polishing stopper. In this way, the openings 54a, 54b, and 54c are filled with the conductive material to form the connecting portion 55a of the gate electrode 53, the connecting portion 55b of the source electrode 45, and the connecting portion 55c of the drain electrode 46.

Subsequently, steps of forming, for example, an upper interlayer insulator and a line are performed to form the AlGaN/GaN HEMT according to this embodiment.

According to this embodiment, the gate electrode 53, the source electrode 45, and the drain electrode 46 of the AlGaN/GaN HEMT are formed not by the lift-off process but by a simple method without causing a defect in any pattern, thereby simply and reliably manufacturing the AlGaN/GaN HEMT having excellent device properties, in which the occurrence of gate leakage is prevented.

[Third Embodiment]

In this embodiment, as with the first embodiment, the case where a gate electrode is formed before the formation of a source electrode and drain electrode is described. This embodiment is characterized by etching to form the gate electrode, the source electrode, and the drain electrode. Note that components equivalent to those in the first embodiment are designated using the same reference numerals.

In this embodiment, the step illustrated in FIG. 1A is performed as in the first embodiment.

Figure 11A:
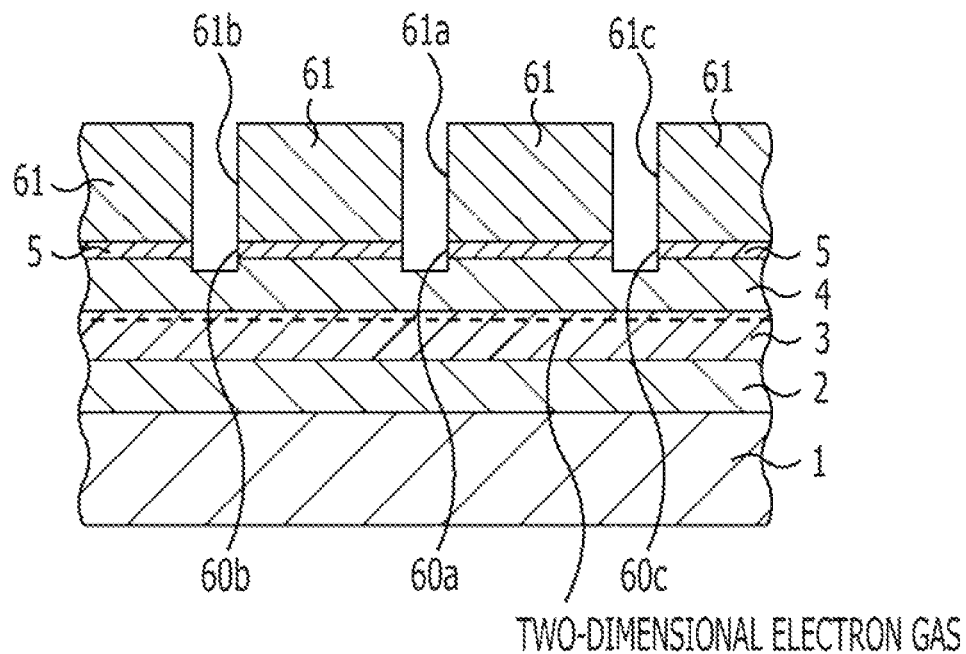
FIGS. 11A to 11U are schematic cross-sectional views of a method of manufacturing an AlGaN/GaN HEMT according to a third embodiment.

Subsequently, as illustrated in FIG. 11A, openings 60a, 60b, and 60c are formed in the cap layer 5.

A resist is applied on the entire surface of the cap layer 5 and processed by lithography, thereby forming a resist mask 61 having openings 61a, 61b, and 61c that exposes portions of the cap layer 5 where the gate electrode, the source electrode, and the drain electrode will be formed.

The cap layer 5 is dry-etched with the resist mask 61 to form the openings 61a, 61b, and 61c. In the dry etching, chlorine gas is used as an etching gas. A parallel plate-type etching apparatus, an electron cyclotron resonance (ECR) etching apparatus, an inductively coupled plasma (ICP) etching apparatus, or the like is used. In the case of using the parallel plate-type etching apparatus, for example, etching is performed at a substrate temperature of 25° C. to 150° C., a pressure of 10 mTorr to 2 Torr, and an RF power of, for example, 50 W to 500 W. In the case of using the ECR etching apparatus or the ICP etching apparatus, for example, etching is performed at a pressure of 1 mTorr to 50 mTorr and a bias power of, for example, 0 W to 80 W.

The openings 60a, 60b, and 60c that expose portions of the electron supply layer 4 are formed in the cap layer 5 by the dry etching. The exposed portions of the electron supply layer 4 are portions where the gate electrodes will be formed. In this embodiment, as illustrated in the figure, a surface of the electron supply layer 4 is etched (to form shallow recesses in the surface). As a result, with respect to the opening 61a, it is possible to extend a depletion layer directly below the gate electrode and to form a shallow quantum well. That is, the electrical elimination of the 2DEG directly below the gate electrode provides a normally-off operation.

In this embodiment, the case where the openings 60a, 60b, and 60c are simultaneously formed is exemplified. Alternatively, each of the openings may be separately formed. Also in this case, as described above, when the opening 60a is formed, the surface of the electron supply layer 4 is subjected to dry etching. Furthermore, in order to reliably etch the cap layer 5, also for the openings 60b and 60c, the surface of the electron supply layer 4 is preferably subjected to dry etching.

Then the resist mask 61 is removed by ashing or the like.

Here, the electron supply layer 4 may be physically damaged by etching when the openings 60a, 60b, and 60c are formed. The physical damage indicates the occurrence of the cleavage of interatomic bonds in the electron supply layer 4. In particular, in the case where the shallow recesses are formed in the surface of the electron supply layer 4, care may be required. If the electron supply layer 4 is physically damaged, a predetermined quantum well is not formed, so that the 2DEG is not formed even when a gate voltage is applied.

Figure 11B:
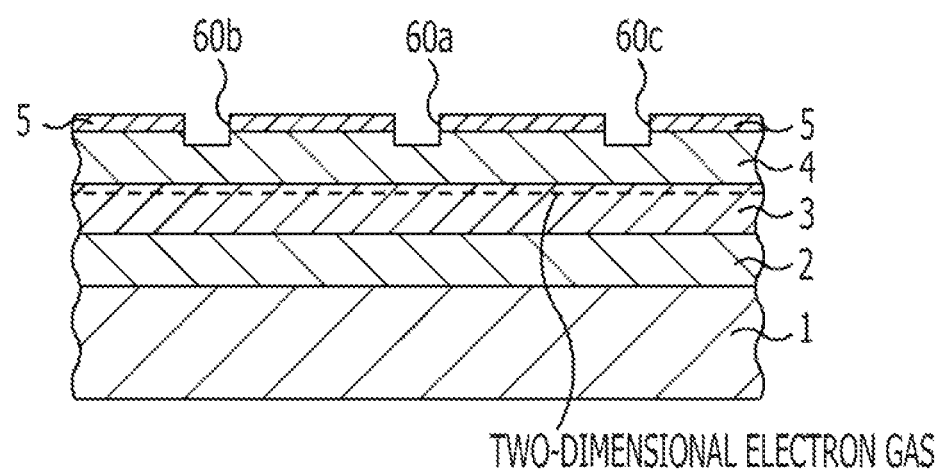

In this embodiment, assuming that the electron supply layer 4 is damaged by dry etching, heat treatment is performed in order to recover the damage. As illustrated in FIG. 11B, the SiC substrate 1 is subjected to heat treatment. The heat treatment is performed in, for example, a nitrogen atmosphere for 0 to 180 seconds at about 700° C. to about 900° C. The heat treatment may be performed by what is called 0-second annealing (msec annealing). The heat treatment results in the recombination of the cleaved interatomic bonds in the electron supply layer 4 due to dry etching when the openings 60a, 60b, and 60c are formed, thereby recover the physical damage. As described below, a temperature range in which the physical damage is sufficiently recovered is about 700° C. to about 900° C. Thus, this temperature range is an appropriate temperature range for the heat treatment.

Figure 11C:
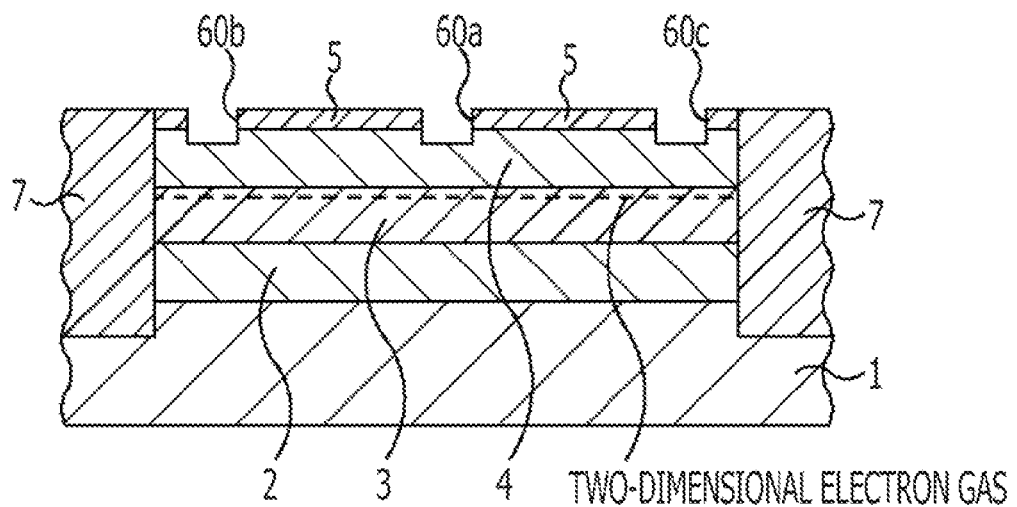

As illustrated in FIG. 11C, the element isolation structures 7 are formed.

A resist mask that covers an element active region and exposes element isolation regions on the cap layer 5 is formed. An impurity, such as Ar, is ion-implanted into the element active region extending to the cap layer 5, the electron supply layer 4, the electron transit layer 3, the buffer layer 2, and an upper portion of the SiC substrate 1 using the resist mask. The ion implantation is performed at an acceleration energy of, for example, about 100 eV and a dose of, for example, about $1.0 \times 10^{13}/cm^2$. The element isolation structures 7 are formed by the ion implantation. In the element isolation structures 7, the crystal structures of AlN, GaN, and AlGaN are broken to eliminate the 2DEG in the element isolation structures 7; hence, the element isolation structures 7 serve as insulating regions.

Then the resist mask is removed by ashing or the like.

The element isolation structures 7 serve as the insulating regions due to the breakage of the crystal structure. Thus, for example, if the heat treatment for damage recovery is performed after the formation of the element isolation structures 7, the cleaved interatomic bonds in the element isolation structures 7 are also recombined, thereby eliminating the insulation required for element isolation. In this embodiment, the heat treatment for damage recovery is thus performed before the formation of the element isolation structures 7. This makes it possible to ensure the damage recovery of the electron supply layer 4 and the formation of the predetermined element isolation structures 7.

Figure 11D:
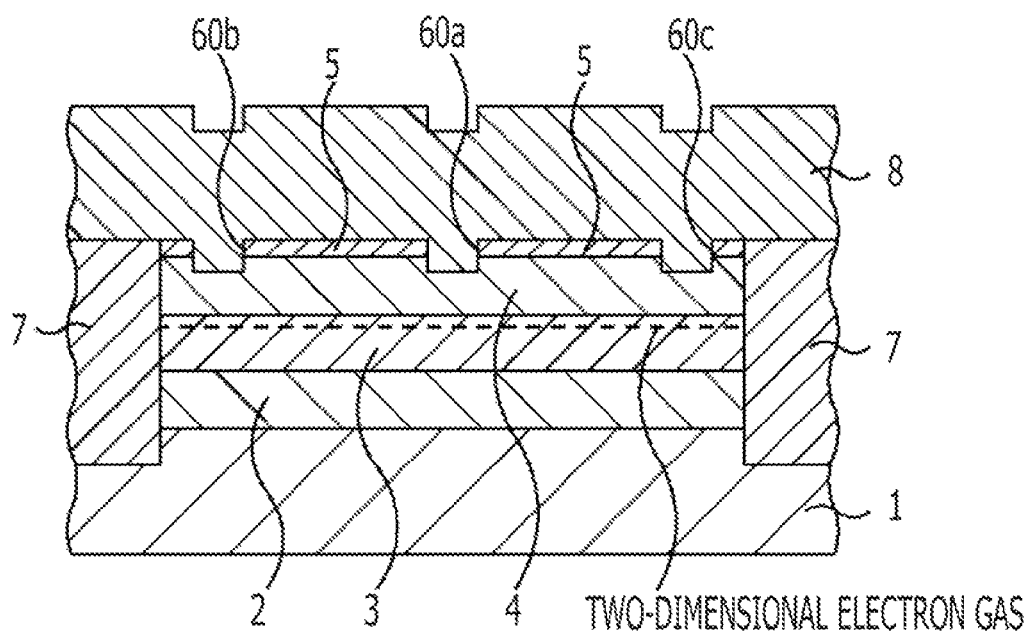

As illustrated in FIG. 11D, the first protective insulating film 8 is formed.

An insulating film, for example, a silicon nitride film, having a thickness of about 20 nm to 500 nm, for example, about 300 nm is formed on the entire surface above the SiC substrate 1 by, for example, plasma-enhanced CVD, thereby forming the first protective insulating film 8. The first protective insulating film 8 may be formed by thermal CVD or ALD in place of plasma-enhanced CVD. Furthermore, the first protective insulating film 8 may be formed of a silicon oxide film. Alternatively, the first protective insulating film 8 may have a laminated structure of a silicon nitride film and a silicon oxide film.

Figure 11E:
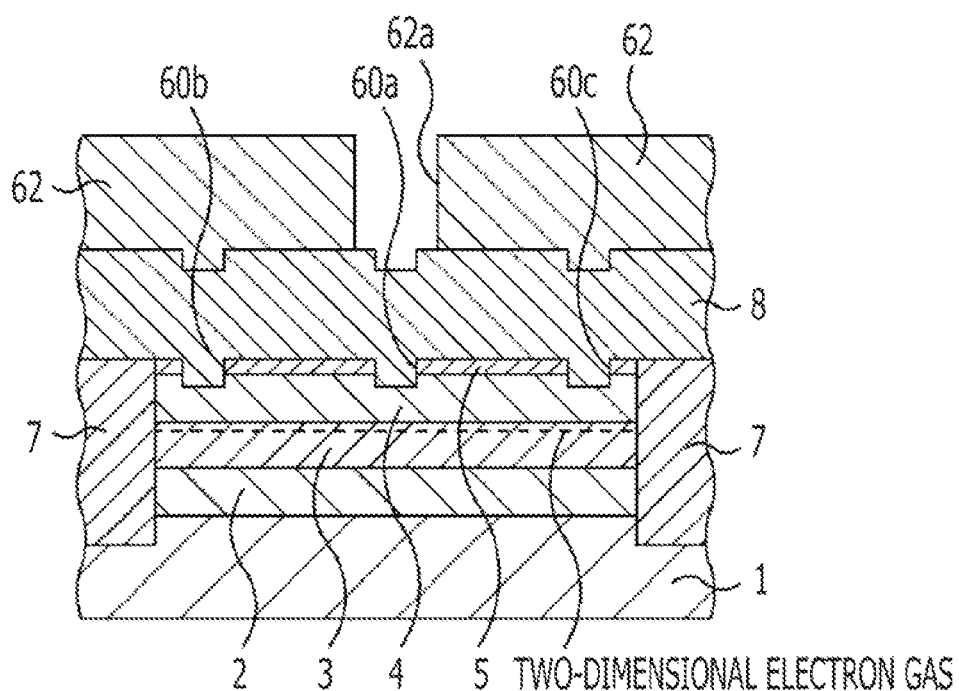

As illustrated in FIG. 11E, a resist mask 62 is formed on the first protective insulating film 8.

A resist is applied on the entire surface of the first protective insulating film 8 and processed by lithography, thereby forming the resist mask 62 having an opening 62a that exposes a portion of the first protective insulating film 8 where the gate electrode will be formed.

Figure 11F:
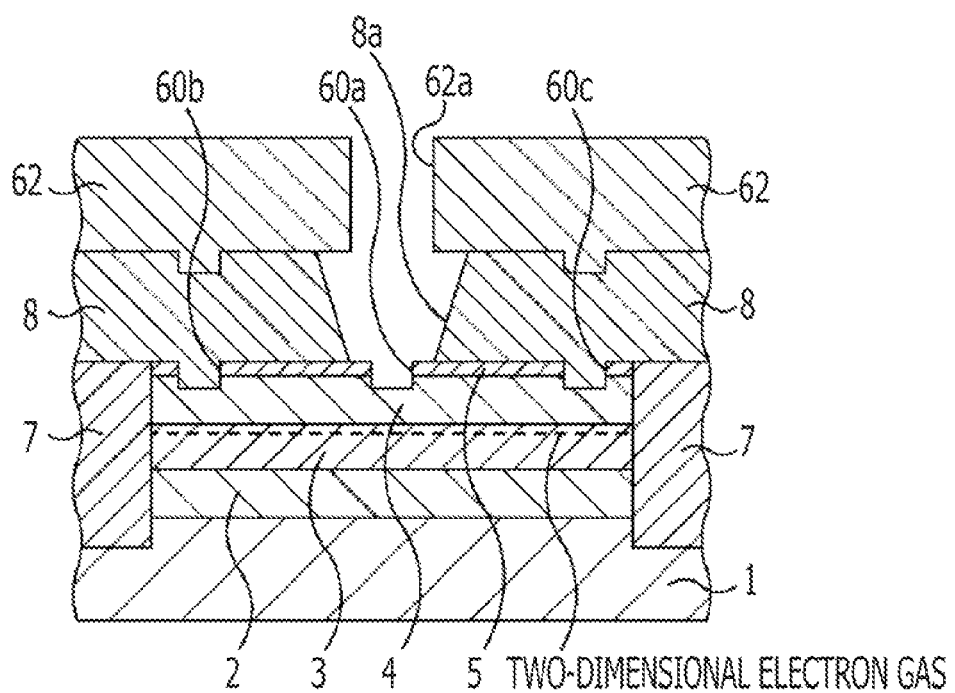

As illustrated in FIG. 11F, an opening 8a is formed by damage-less etching in a portion of the first protective insulating film 8 where the gate electrode will be formed.

As described above, in a compound semiconductor device, such as an AlGaN/GaN HEMT, if the electron supply layer 4 is physically damaged by etching, a predetermined quantum well is not formed, so that the 2DEG is not formed even when a gate voltage is applied. Thus, special care is required. In this embodiment, in order to prevent physical damage to the electron supply layer 4 also in etching the first protective insulating film 8, the damage-less etching is performed using the resist mask 62. The damage-less etching employed here is what is called isotropic etching. Wet etching or isotropic dry etching under specific conditions is employed.

In the case where wet etching is performed, a fluorine-containing chemical solution is used as an etching solution. Examples of the etching solution include a mixed solution containing 0.1%-50% hydrofluoric acid and 50%-0.1% water; and a mixed solution containing 0.1%-25% hydrofluoric acid, 0.1%-25% ammonium fluoride, and 50%-99.8% water.

In the case where dry etching is performed, for example, a parallel plate-type etching process, an ECR etching process, an ICP etching process, or a downflow etching process is employed.

For example, in the case of the parallel plate-type etching process, etching is performed in an atmosphere selected from $CF_4$, $SF_6$, $CHF_3$, and a fluorine-containing gas at a substrate temperature of about 25° C. to about 200° C., a pressure of 10 mTorr to 2 Torr, and an RF power of 10 W to 400 W.

For example, in the case of the ECR etching process, etching is performed in an atmosphere selected from $CF_4$, $SF_6$, $CHF_3$, and a fluorine-containing gas at a substrate temperature of about 25° C. to about 200° C., a pressure of 1 mTorr to 1 Torr, and an RF power of 5 W to 80 W.

For example, in the case of the ICP etching process, etching is performed in an atmosphere selected from $CF_4$, $SF_6$, $CHF_3$, and a fluorine-containing gas at a substrate temperature of about 25° C. to about 200° C., a pressure of 1 mTorr to 50 mTorr, and a bias power of 5 W to 80 W.

For example, in the case of the downflow etching process, etching is performed in an atmosphere selected from $CF_4$, $SF_6$, and a fluorine-containing gas at a substrate temperature of about 25° C. to about 200° C., a pressure of 300 mTorr to 3 Torr, and a power of 100 W to 1500 W.

The first protective insulating film 8 is subjected to the damage-less etching to form the opening 8a in the first protective insulating film 8, the opening 8a having a shape in which the diameter of an upper portion of the opening 8a is larger than that of the opening 62a in the resist mask 62 and the diameter of a lower portion of the opening 8a is smaller than the diameter of the upper portion. The opening 8a communicates with the opening 60a to form one opening. Although the bottom of the opening 60a, i.e., the recess (where the gate electrode will be formed) of the electron supply layer 4, is exposed at the bottom of the opening 8a, the recess is not physically damaged. Thus, a predetermined satisfactory 2DEG is formed in the vicinity of the interface between the electron transit layer 3 and the electron supply layer 4.

Then the resist mask 62 is removed by ashing or the like.

Figure 11G:
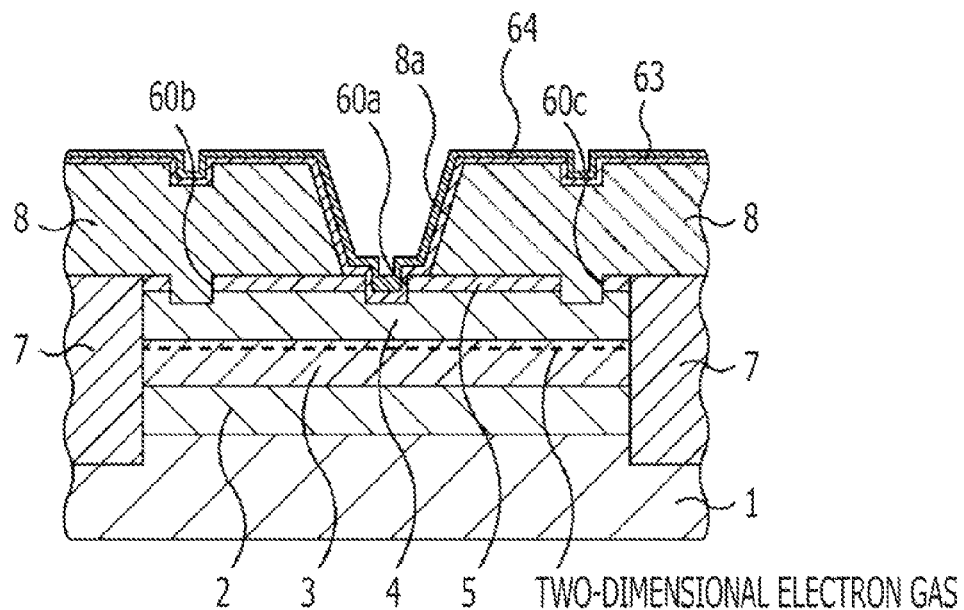

As illustrated in FIG. 11G, a gate insulator 63 and a high-work-function film 64 are formed.

The gate insulator 63 and the high-work-function film 64 are formed on the first protective insulating film 8 so as to cover inner surfaces of the openings 8a and 60a.

The gate insulator 63 is formed by depositing, for example, an AlO film having a thickness of, for example, about 20 nm by ALD or the like. The gate insulator 63 may be formed of a TaO film, or a high-dielectric (high-k) oxide or oxynitride film of Hf, Ti, or Zr, in place of the AlO film. Alternatively, the gate insulator 63 may have a laminated structure of two or more selected from the AlO film, the TaO film, and the high-k film.

After the formation of the gate insulator 63, heat treatment may be performed at, for example, about 550° C. for about 60 seconds.

The high-work-function film 64 is formed by depositing, for example, a TaN film having a thickness of, for example, about 40 nm by physical vapor deposition (PVD) or the like. The term "high-work-function film" indicates a film composed of a conductive material having a work function of 4.5 eV or more. The formation of the high-work-function film 64 provides a shallow quantum well directly below the gate electrode, thereby reducing the 2DEG directly below the gate electrode when the gate voltage is 0 V.

Figure 11H:
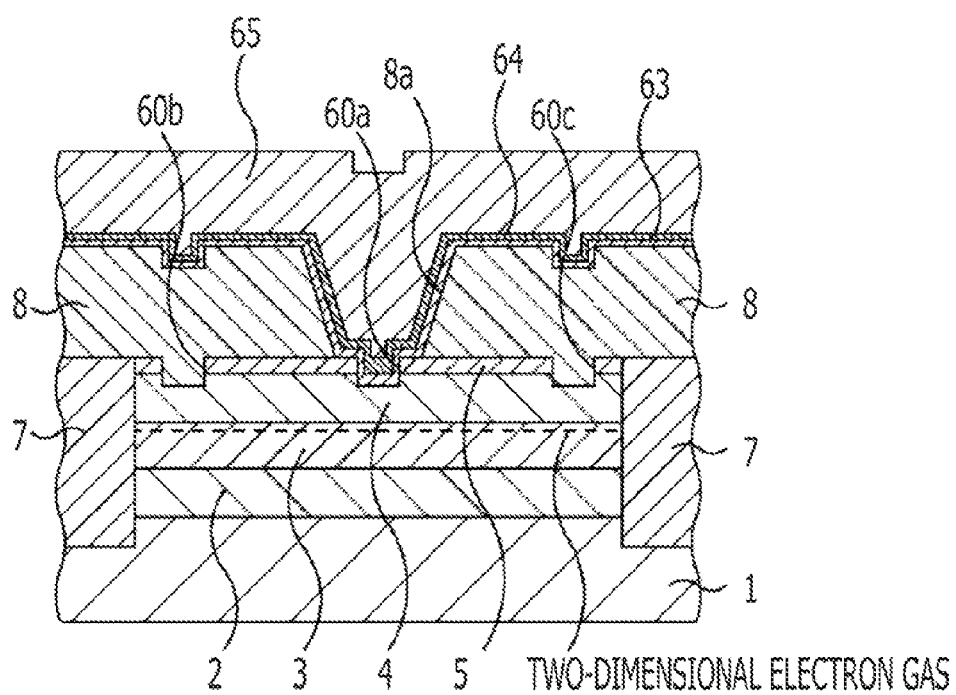

As illustrated in FIG. 11H, a conductive material 65 is formed on the high-work-function film 64.

The conductive material 65, such as Al, is deposited on the entire surface of the high-work-function film 64 by PVD or the like in such a manner that the resulting film of the conductive material 65 has a thickness of about 20 nm to about 500 nm, for example, about 400 nm and that the openings 8a and 60a is filled with the conductive material 65 via the gate insulator 63 and the high-work-function film 64.

Figure 11I:
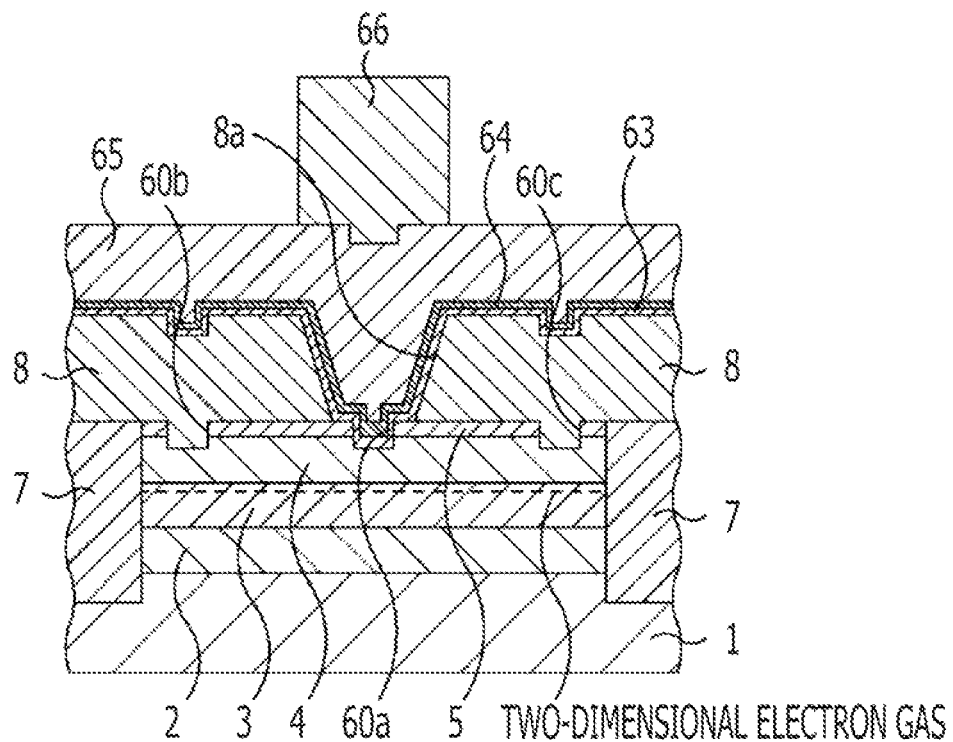

As illustrated in FIG. 11I, a resist mask 66 is formed on the conductive material 65.

A resist is applied on the entire surface of the conductive material 65 and processed by lithography, thereby forming the resist mask 66 that covers a portion of the conductive material 65 where the gate electrode will be formed.

Figure 11J:
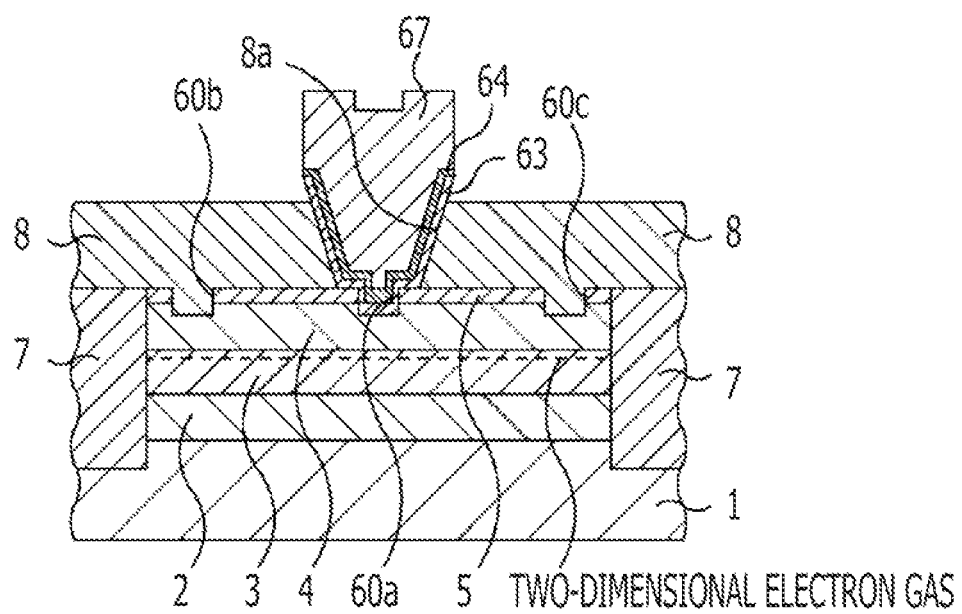

As illustrated in FIG. 11J, a gate electrode 67 is formed.

The conductive material 65, the high-work-function film 64, and the gate insulator 63 are dry-etched using the resist mask 66. Here, in order to reliably form the gate electrode, as illustrated in the figure, etching may be performed so as to expose a surface of the first protective insulating film 8. The dry etching results in the formation of the gate electrode 67 in which the openings 8a and 60a are filled with the conductive material 65 via the gate insulator 63 and the high-work-function film 64 and which protrudes from the first protective insulating film 8.

Then the resist mask 66 is removed by ashing or the like.

In this embodiment, the gate electrode 67 of the AlGaN/GaN HEMT is formed by lithography and dry etching. In this case, the first protective insulating film 8 is formed, and then the gate electrode 67 is formed in such a manner that the opening 8a in the first protective insulating film 8 is filled with the conductive material 65. The presence of the first protective insulating film 8 and the damage-less etching prevent physical damage to the electron supply layer 4 when the gate electrode is formed. As described above, in this embodiment, when the gate electrode 67 is formed, the lithography and the damage-less etching are performed using the first protective insulating film 8, without employing the lift-off process. Unlike the lift-off process, part of the conductive material is not redeposited above the SiC substrate 1, and the satisfactory gate electrode 67 is formed without physically damaging the compound semiconductor layers.

Figure 11K:
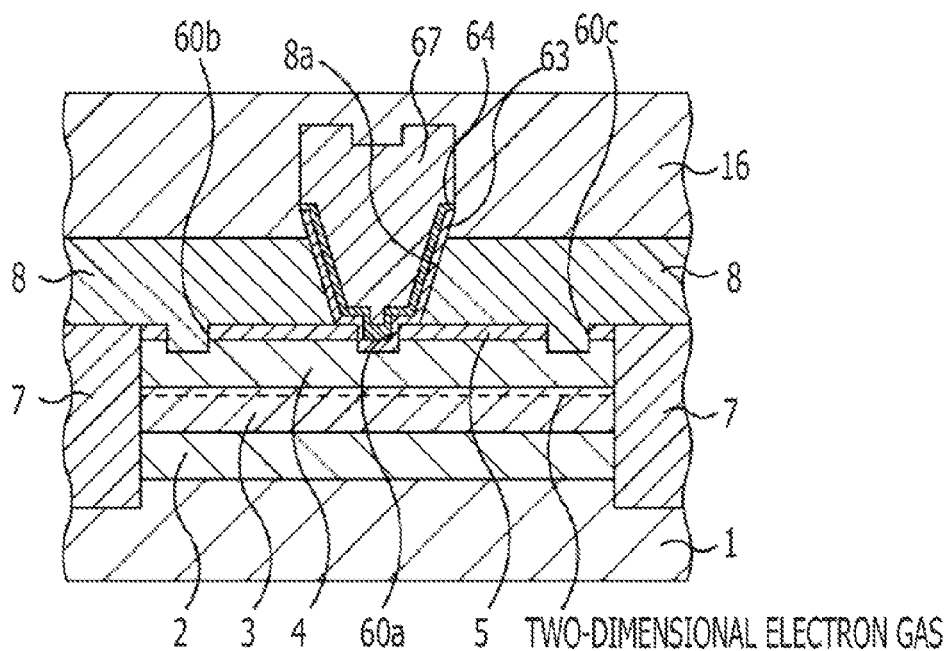

As illustrated in FIG. 11K, the second protective insulating film 16 is formed.

An insulating film, such as a silicon oxide film, having a thickness of about 300 nm is formed on the entire surface of the first protective insulating film 8 by, for example, plasma-enhanced CVD so as to cover the gate electrode 67, thereby forming the second protective insulating film 16. Here, a bump attributed to a projecting portion of the gate electrode 67 is formed on a portion of the second protective insulating film 16 above the gate electrode 67. To remove the bump, surface polishing is preferably performed by, for example, CMP. In this case, the silicon oxide film or the like is deposited so as to have a thickness of about 500 nm to about 1000 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the second protective insulating film 16. In FIG. 11K, the second protective insulating film 16 having a surface planarized by CMP is illustrated.

With respect to a method for forming the second protective insulating film, a silicon oxide film or the like may be formed by, for example, spin coating in place of plasma-enhanced CVD and is subjected to curing treatment to form the second protective insulating film.

Figure 11L:
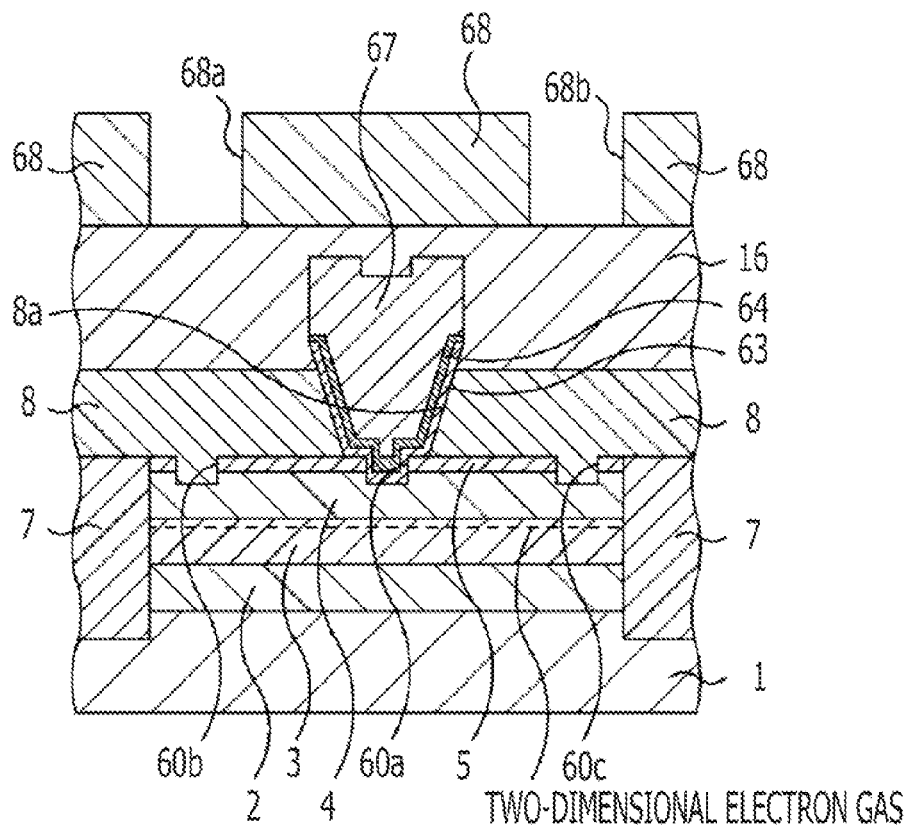

As illustrated in FIG. 11L, a resist mask 68 is formed on the second protective insulating film 16.

A resist is applied on the entire surface of the second protective insulating film 16 and processed by lithography, thereby forming the resist mask 68 having a pair of openings 68a and 68b that exposes portions of the second protective insulating film 16 where the source electrode and the drain electrode will be formed.

Figure 11M:
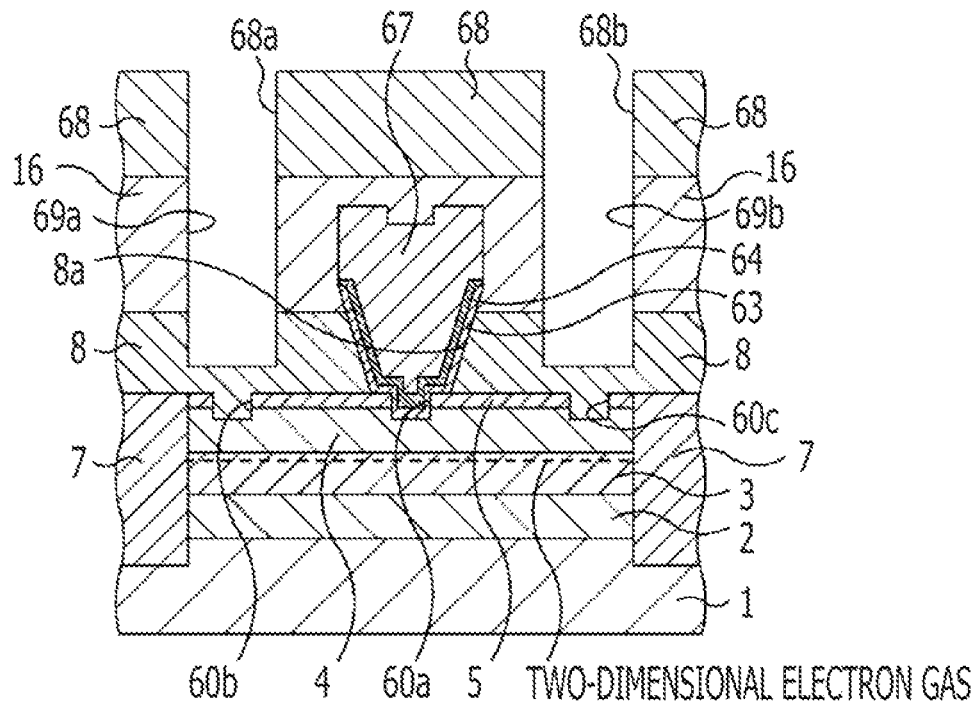
Figure 11N:
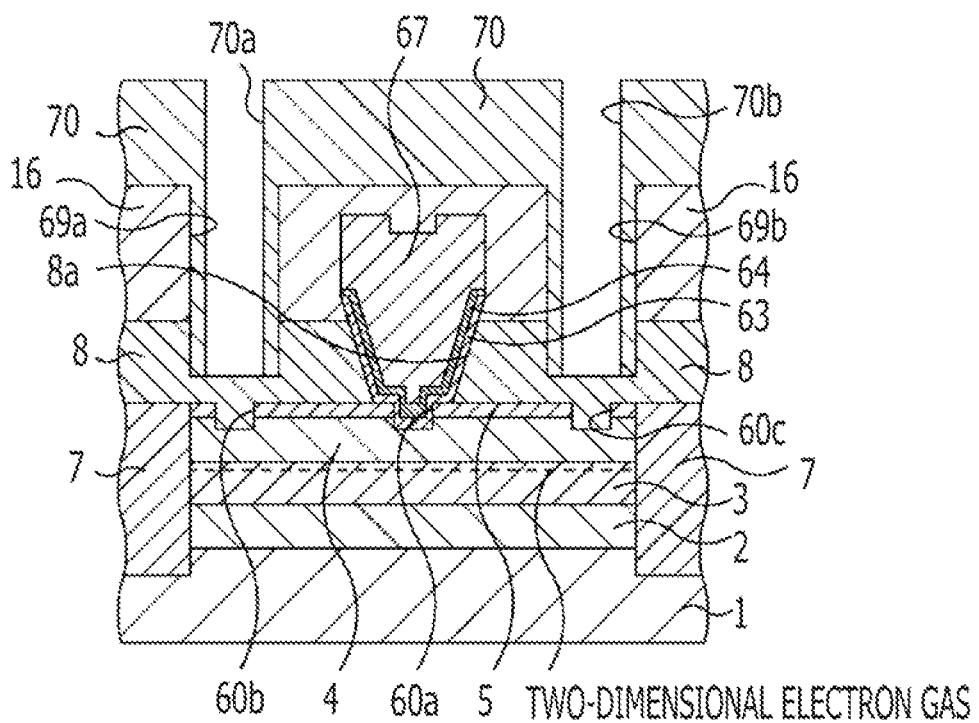

In steps illustrated in FIGS. 11M and 11N, two-stage etching is performed.

As illustrated in FIG. 11M, a pair of openings 69a and 69b is formed so as to extend from a surface of the second protective insulating film 16 to the middle portion of the first protective insulating film 8.

The openings 69a and 69b are formed by dry etching from the surface of the second protective insulating film 16 to the middle portion of the first protective insulating film 8 using the resist mask 68. The dry etching is performed at a pressure of about 1.7 Torr and an RF power of, for example, about 650 W using a fluorine-containing gas, such as a mixed gas of $CHF_3$, $CF_3$, and Ar, as an etching gas in such a manner that etching is stopped at the middle of the first protective insulating film 8. This dry etching results in the formation of the openings 69a and 69b, each extending to the middle portion of the first protective insulating film 8 through the second protective insulating film 16, and the first protective insulating film 8 being left at the bottom of each of the openings 69a and 69b.

Then the resist mask 69 is removed by ashing or the like.

The dry etching illustrated in FIG. 11M is performed so as to expose the middle portion of the first protective insulating film 8. Thus, the first protective insulating film 8 is left at the bottom of each of the openings 69a and 69b. So, the dry etching does not physically damage the electron supply layer 4.

As illustrated in FIG. 11N, a resist mask 70 is formed.

A resist is applied on the entire surface of the second protective insulating film 16 in such a manner that the openings 69a and 69b are filled with the resist. The resist is processed by lithography, thereby forming the resist mask 70 having a pair of openings 70a and 70b that are located in the openings 69a and 69b, the resist mask 70 covering the second protective insulating film 16 and inner side walls of the openings 69a and 69b, and the diameter (width) of each of the openings 70a and 70b being a smaller than that of a corresponding one of the openings 69a and 69b.

Figure 11O:
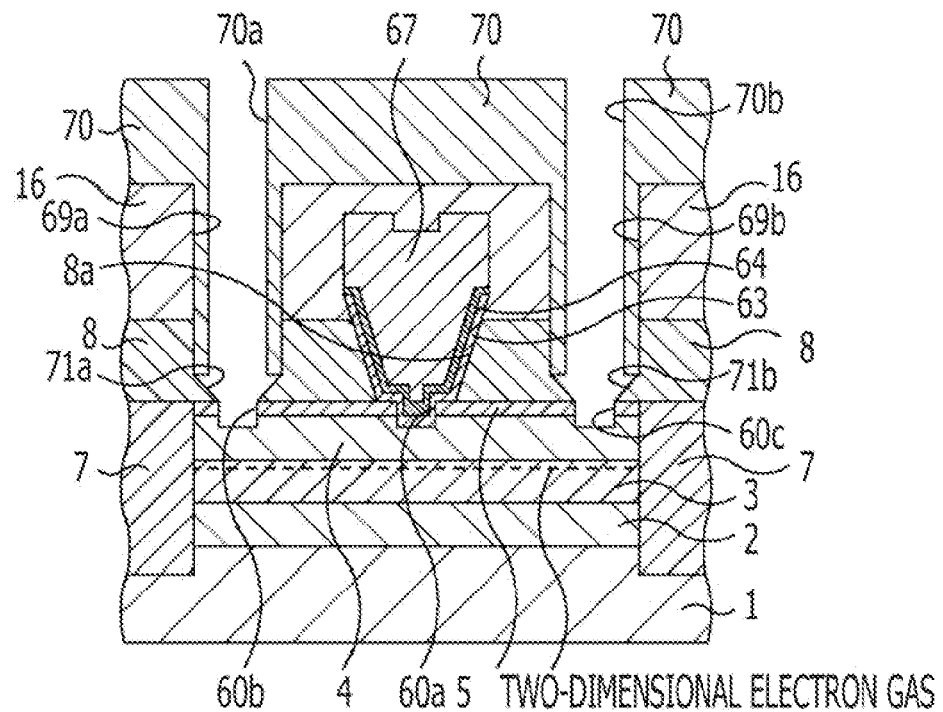

As illustrated in FIG. 11O, a pair of openings 71a and 71b is formed in the first protective insulating film 8 by damageless etching.

For a compound semiconductor device, such as an AlGaN/GaN HEMT, if the electron supply layer 4 is physically damaged by etching, a predetermined quantum well is not formed, so that the 2DEG is not formed even when a gate voltage is applied. Thus, special care is required. In this embodiment, in order to prevent physical damage to the electron supply layer 4 also in etching the first protective insulating film 8, the damage-less etching is performed using the resist mask 70. The damage-less etching employed here is isotropic etching. Wet etching or isotropic dry etching under specific conditions is employed.

In the case where wet etching is performed, it is possible to use an etching solution the same as that used in the wet etching of the damage-less etching described in FIG. 11E.

In the case where dry etching is performed, it is possible to use an etching apparatus and etching conditions the same as those in the dry etching of the damage-less etching described in FIG. 11F.

The first protective insulating film 8 is subjected to the damage-less etching to form the openings 71a and 71b in the first protective insulating film 8, the openings 71a and 71b each having a shape in which the diameter of an upper portion of each of the openings 71a and 71b is larger than that of the opening 70a in the resist mask 70 and the diameter of a lower portion of each of the openings 71a and 71b is smaller than the diameter of the upper portion. The openings 71a and 69a communicate with the opening 60b to form one opening. The openings 71b and 69b communicate with the opening 60c to form one opening. The bottom of the opening 60b, i.e., the recess (where the source electrode will be formed) of the electron supply layer 4, is exposed at the bottom of the opening 71a. The bottom of the opening 60c, i.e., the recess (where the drain electrode will be formed) of the electron supply layer 4, is exposed at the bottom of the opening 71b. These recesses are not physically damaged because of the damage-less etching. Thus, a predetermined satisfactory 2DEG is formed in the vicinity of the interface between the electron transit layer 3 and the electron supply layer 4.

Then the resist mask 70 is removed by ashing or the like.

Figure 11P:
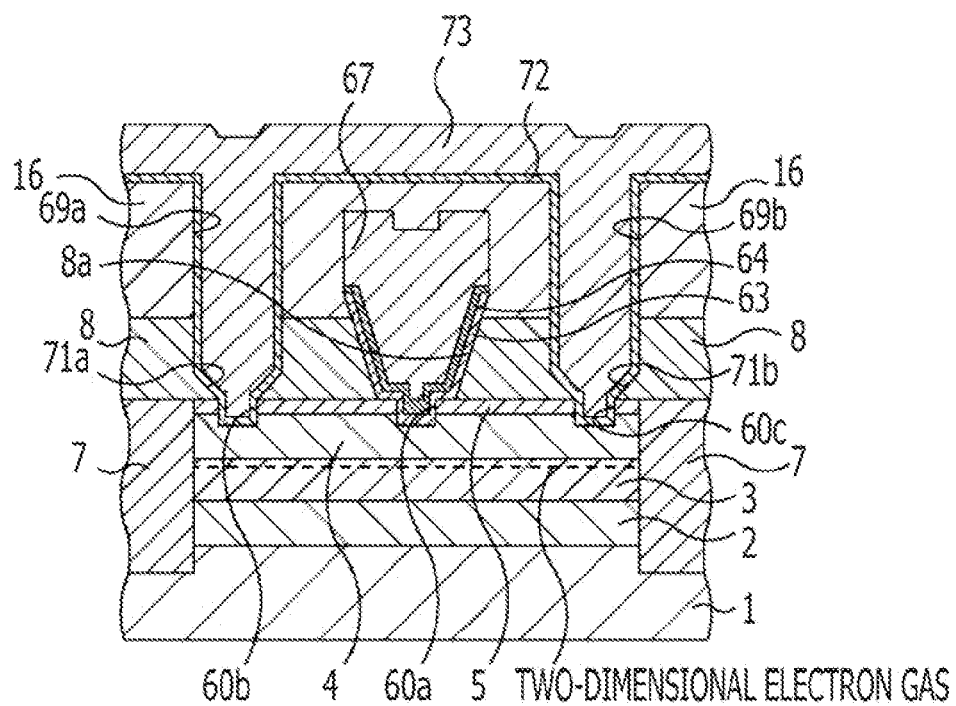

As illustrated in FIG. 11P, after the formation of a low-work-function film 72, a conductive material 73 is deposited.

The low-work-function film 72 is formed on the second protective insulating film 16 as an underlying conductive film so as to cover the inner surface of the opening (referred to as an "opening A") into which the openings 60b, 71a, and 69a are integrally formed and to cover the inner surface of the opening (referred to as an "opening B") into which the openings 60c, 71b, and 69b are integrally formed. The low-work-function film 72 is formed by depositing one selected from Al, Ti, metal-rich TiN, Ta, metal-rich TaN, Zr, metal-rich TaC, NiSi$_2$, and Ag in such a manner that the deposited film has a thickness of about 1 nm to about 100 nm. Here, for example, a Ta film is deposited by PVD or the like at a DC power of, for example, 1 kW to 10 kW so as to have a thickness of about 10 nm, thereby forming the low-work-function film 72. The formation of the low-work-function film 72 reduces the barrier between the electrode material and a portion of the electron supply layer 4 directly below the gate electrode, thereby forming the source electrode and the drain electrode with low contact resistance.

The conductive material 73, such as Al, is deposited on the entire surface of the low-work-function film 72 by PVD or the like at a DC power of, for example, 1 kW to 10 kW in such a manner that the resulting film of the conductive material 73 has a thickness of about 300 nm and that the openings A and B are filled with the conductive material via the low-work-function film 72.

Figure 11Q:
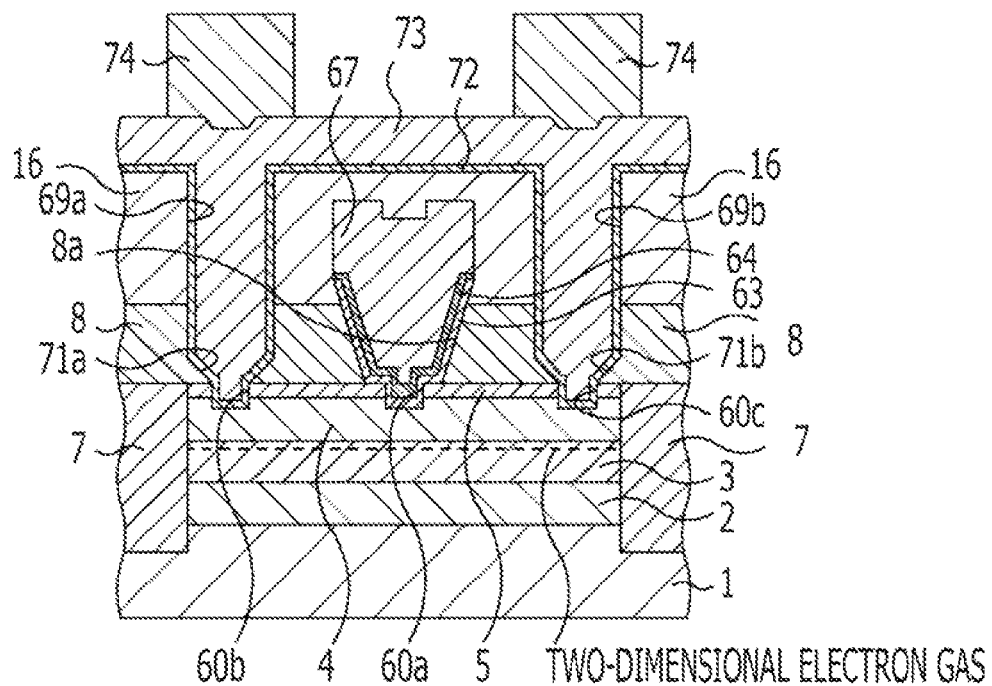

As illustrated in FIG. 11Q, a resist mask 74 is formed on the conductive material 73.

A resist is applied on the entire surface of the conductive material 73 and processed by lithography, thereby forming the resist mask 74 that covers portions of the conductive material 73 where the source electrode and the drain electrode will be formed.

Figure 11R:
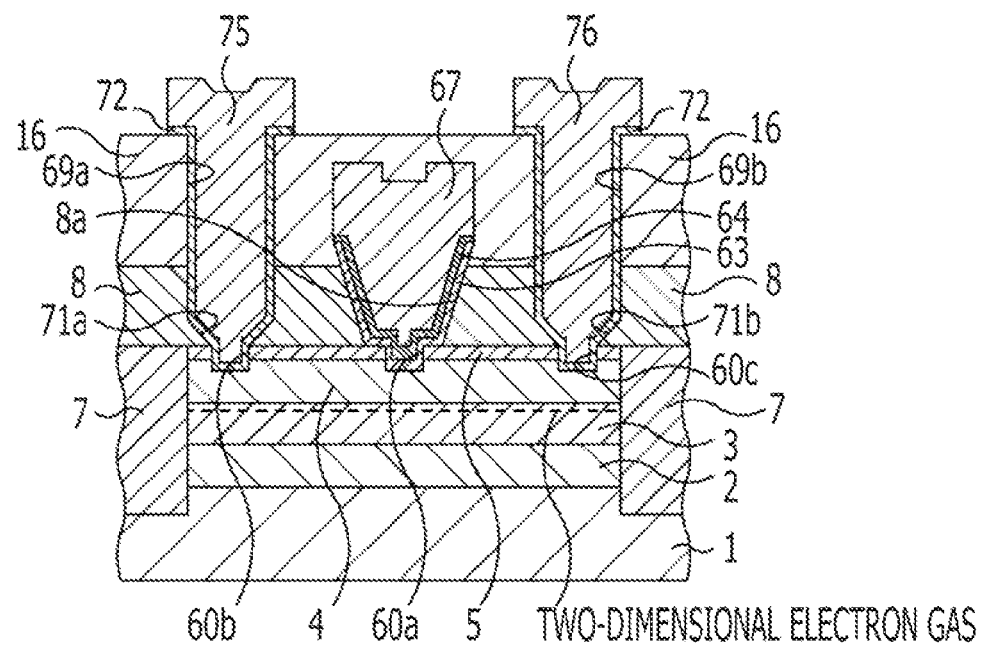

As illustrated in FIG. 11R, a source electrode 75 and a drain electrode 76 are formed.

The conductive material 73 and the low-work-function film 72 are dry-etched using the resist mask 74, thereby forming the source electrode 75 and the drain electrode 76 in which the openings A and B are filled with the conductive material 73 via the low-work-function film 72 and which protrude from the second protective insulating film 16.

Then the resist mask 74 is removed by ashing or the like.

In this embodiment, the source electrode 75 and the drain electrode 76 of the AlGaN/GaN HEMT are formed by lithography and dry etching. In this case, the source electrode 75 and the drain electrode 76 are formed in such a manner that the openings A and B are filled with the conductive material 73. The presence of the first and second protective insulating films 8 and 16 and the damage-less etching of the first protective insulating film 8 prevent physical damage to the electron supply layer 4 when the source and drain electrodes are formed. As described above, in this embodiment, when the source electrode 75 and the drain electrode 76 are formed, the lithography and the damage-less etching are performed using the first protective insulating films 8 and 16, without employing the lift-off process. Unlike the lift-off process, part of the conductive material is not redeposited above the SiC substrate 1, and the satisfactory source electrode 75 and the satisfactory drain electrode 76 are formed without physically damaging the electron supply layer 4.

The SiC substrate 1 is subjected to heat treatment in, for example, an N$_2$ atmosphere at about 600° C. for about 60 seconds.

Figure 11S:
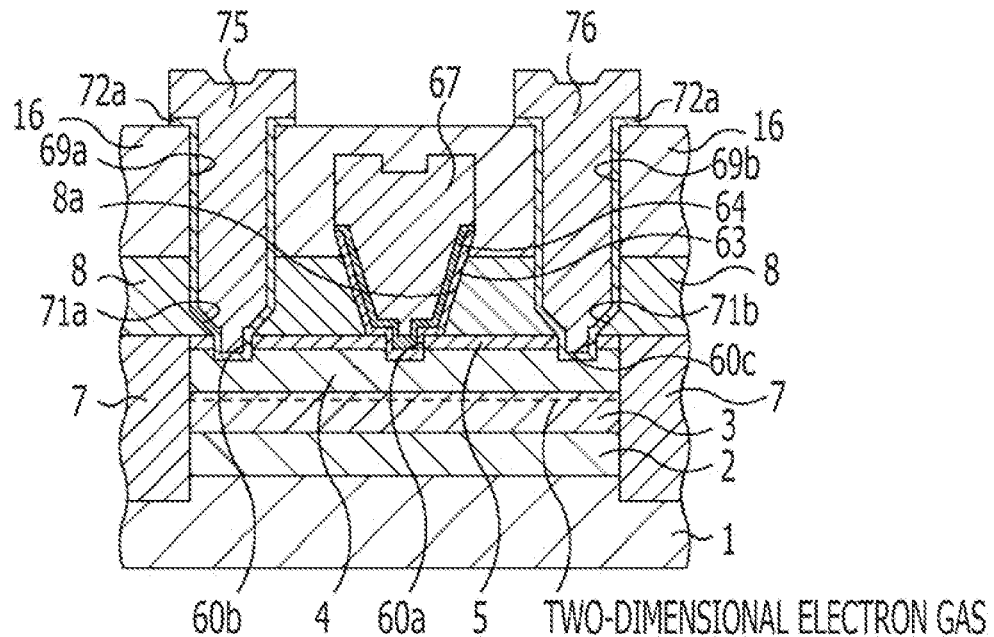

As illustrated in FIG. 11S, the heat treatment allows Ta in the low-work-function film 72 to react with Al in the conductive material 73, so that the low-work-function film 72 is formed into a TaAl$_3$ film 72a. The heat treatment results in the formation of minute spikes of the TaAl$_3$ film 72a at bottoms of the openings A and B, i.e., portions of the electron supply layer 4 directly below the source electrode 75 and the drain electrode 76, thereby reducing the contact resistance between the electron supply layer 4 and the source electrode 75 and between the electron supply layer 4 and the drain electrode 76. Furthermore, Al has a low work function. This also contributes to a reduction in contact resistance.

Figure 11T:
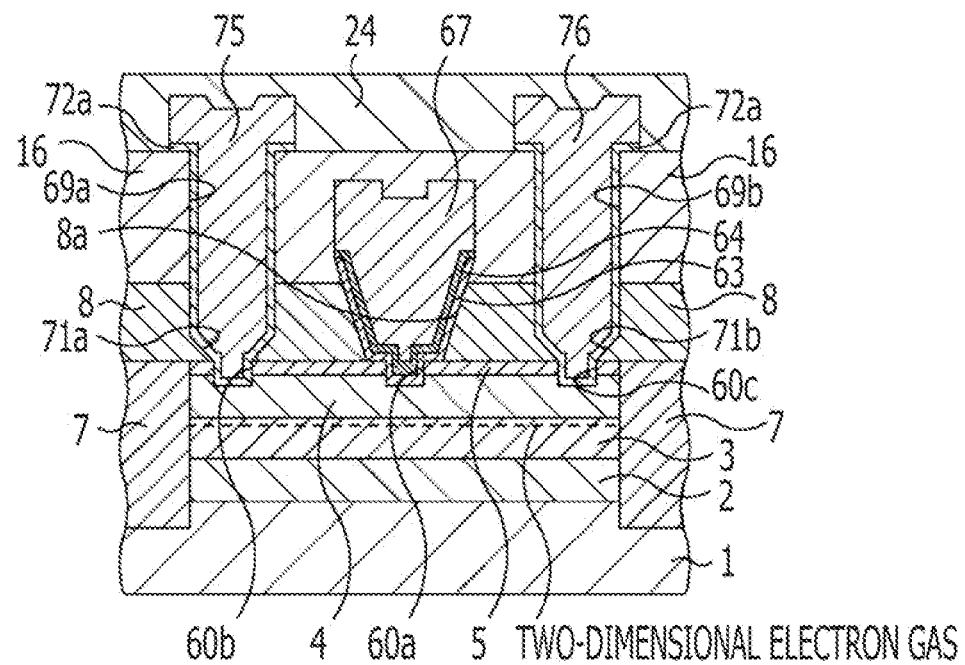

As illustrated in FIG. 11T, the interlayer insulator 24 is formed.

An insulating film, such as a silicon oxide film, having a thickness of about 1000 nm is formed on the entire surface of the second protective insulating film 16 by, for example, plasma-enhanced CVD so as to cover the source electrode 75 and the drain electrode 76, thereby forming the interlayer insulator 24. Here, bumps attributed to projecting portions of the source electrode 75 and the drain electrode 76 are formed on portions of the second protective insulating film 16 above the source electrode 75 and the drain electrode 76. To remove the bumps, surface polishing is preferably performed by, for example, chemical-mechanical polishing (CMP). In this case, the silicon oxide film or the like is deposited so as to have a thickness of about 1000 nm to about 1500 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the interlayer insulator 24. In FIG. 11T, the interlayer insulator 24 having a surface planarized by CMP is illustrated.

With respect to a method for forming the interlayer insulator, a silicon oxide film or the like may be formed by, for example, spin coating in place of plasma-enhanced CVD and is subjected to curing treatment to form the interlayer insulator.

Figure 11U:
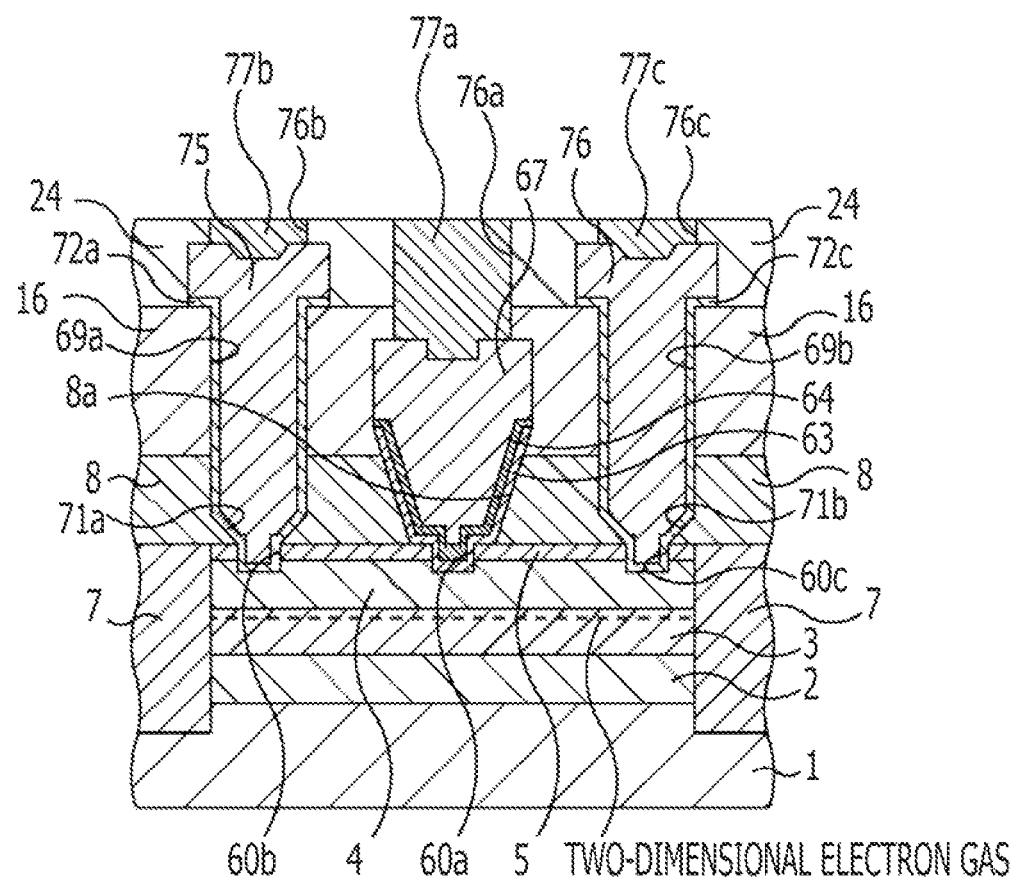

As illustrated in FIG. 11U, a connecting portion 77a of the gate electrode 67, a connecting portion 77b of the source electrode 75, and a connecting portion 77c of the drain electrode 76 are formed.

The second protective insulating film 16 and the interlayer insulator 24 are processed by lithography and dry etching, thereby forming openings 76a, 76b, and 76c that partially expose respective surfaces of the gate electrode 67, the source electrode 75, and the drain electrode 76.

A conductive material, such as Al, is deposited on the interlayer insulator 24 by, for example, sputtering or plating in such a manner that the openings 76a, 76b, and 76c are filled with the conductive material. The conductive material is polished by CMP using a surface of the interlayer insulator 24 as a polishing stopper. In this way, the openings 76a, 76b, and 76c are filled with the conductive material to form the connecting portion 77a of the gate electrode 67, the connecting portion 77b of the source electrode 75, and the connecting portion 77c of the drain electrode 76.

Subsequently, steps of forming, for example, an upper interlayer insulator and a line are performed to form the AlGaN/GaN HEMT according to this embodiment.

According to this embodiment, the gate electrode 67, the source electrode 75, and the drain electrode 76 of the AlGaN/GaN HEMT are formed not by the lift-off process but by a simple method without causing a defect in any pattern, thereby simply and reliably manufacturing the AlGaN/GaN HEMT with excellent device properties.

Some experiments to check the effects of this modification will be described below.

[Experiment 1]

Figure 12A:
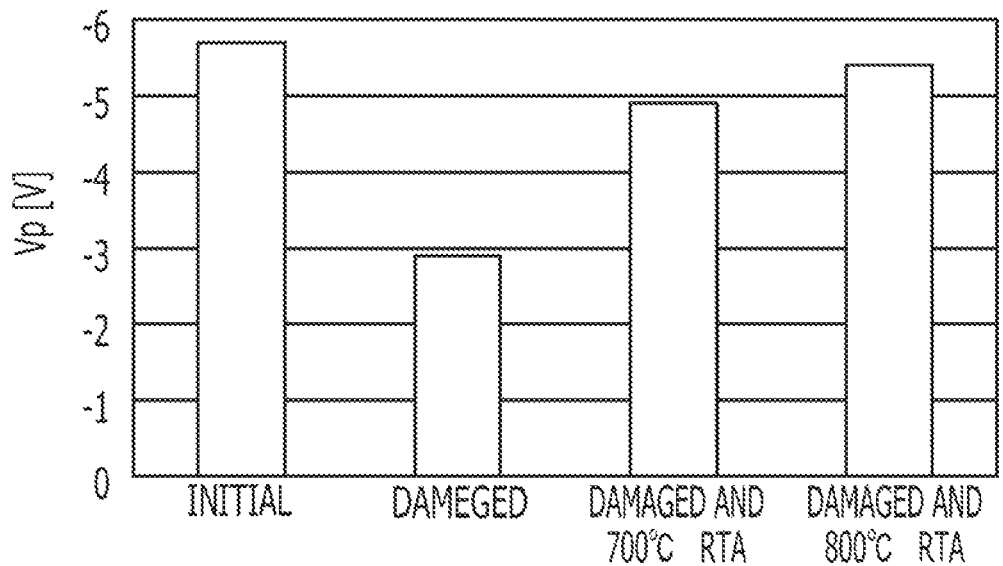
FIGS. 12A and 12B illustrate the results of Experiment 1 according to a modification of the third embodiment.
Figure 12B:
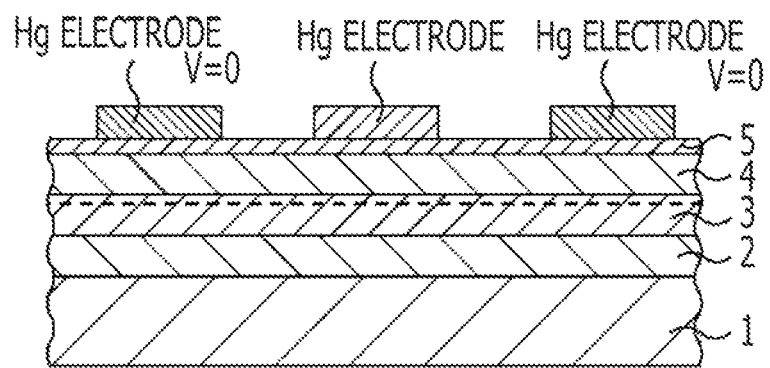

Predetermined blanket substrates, for example, structures illustrated in FIG. 12B (structures illustrated in FIG. 1A), were subjected to plasma-induced damage and heat treatment (RTA treatment), thereby forming samples. The heat treatment was performed at about 700° C. or about 800° C. Mercury (Hg) electrodes were appropriately formed on each sample as illustrated in the figure. The 2DEG was evaluated using the samples. FIG. 12A illustrates the results. The evaluation of the 2DEG was performed by C-V measurement using the Hg electrodes. In the case where C-V characteristics are measured when the voltage of the periphery of a surface of each sample is maintained at 0 V, the central electrode has capacitance at 0 V. Furthermore, when a negative voltage is applied, the capacitance of the central electrode is eliminated at a specific voltage. In general, the voltage is referred to as Vp. Vp shifts toward 0 V when the 2DEG is eliminated by physical damage. That is, the results demonstrated that the 2DEG that had been eliminated by the heat treatment at about 700° C. or about 800° C. was recovered. The degree of the recovery of the sample subjected to heat treatment at about 800° C. is higher than that of the sample subjected to heat treatment at about 700° C.

[Experiment 2]

Figure 13:
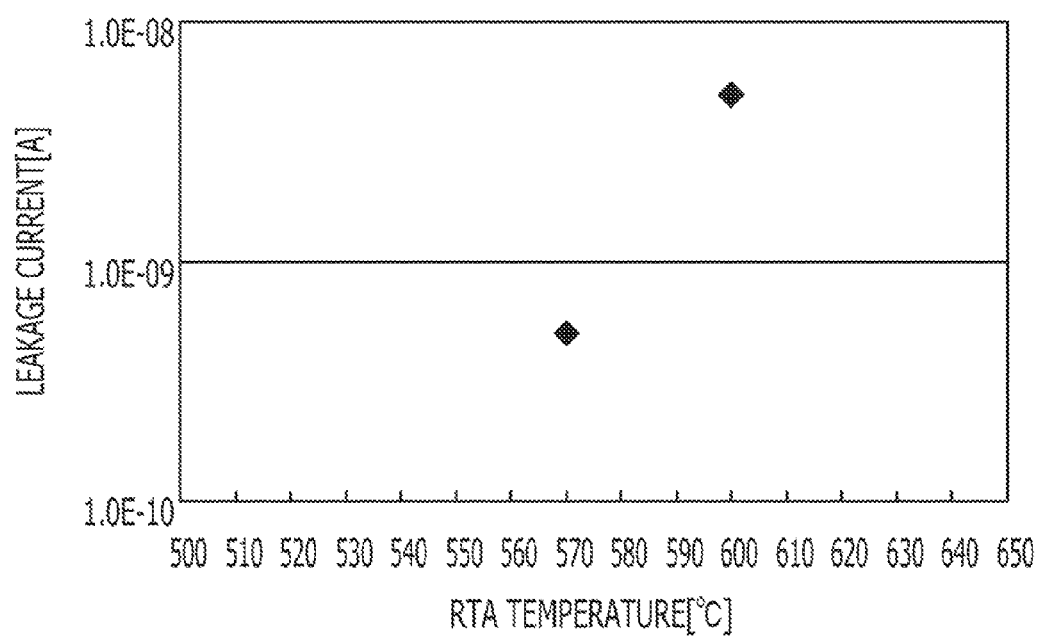
FIG. 13 is a characteristic diagram illustrating the results of Experiment 2 according to the modification of the third embodiment.

An element isolation structure (the same as the element isolation structure 7 illustrated in FIG. 11C) having a width of about 2 μm (distance between effective regions) was formed in the structures illustrated in FIG. 1A. The source electrode 75 and the drain electrode 76 illustrated in FIG. 11U were formed in the structure with the element isolation structure provided therebetween, thereby manufacturing a sample. A current was measured when a contact voltage of 10 V was applied using the sample. FIG. 13 illustrates the results. In FIG. 13, the heat treatment (RTA) temperature of the horizontal axis indicates the heat treatment temperature at which the source electrode 75 and the drain electrode 76 are formed. The results indicate that the slight recovery of the interatomic bonds in the electron supply layer 4 by the heat treatment is started. This demonstrates that the heat treatment for damage recovery illustrated in FIG. 11B is preferably performed before the step of forming the element isolation structures 7.

[Experiment 3]

Figure 14:
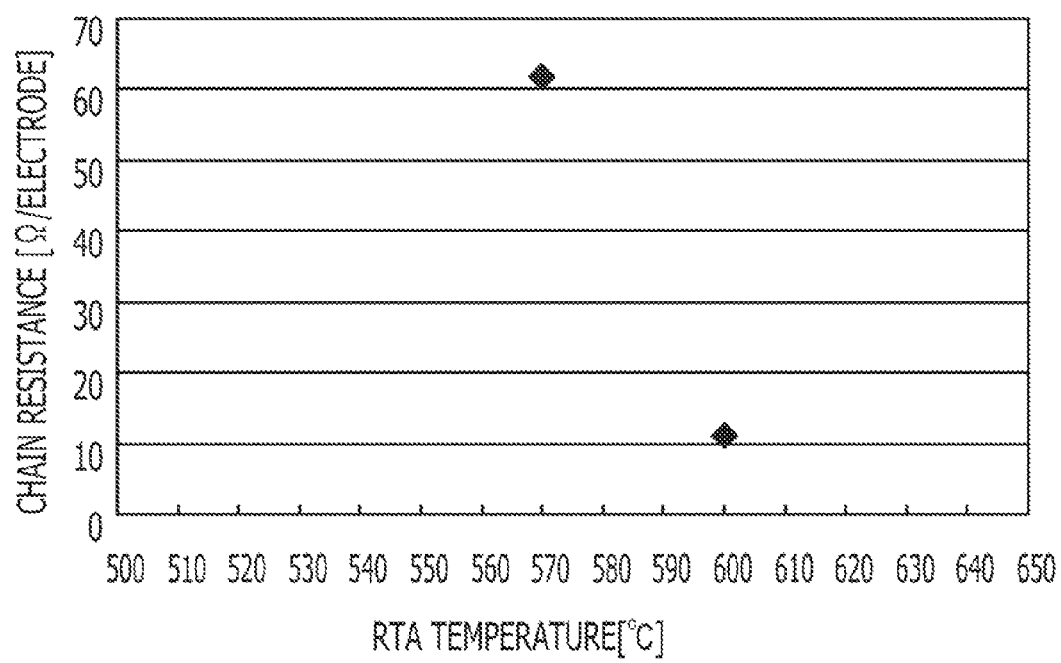
FIG. 14 is a characteristic diagram illustrating the results of Experiment 3 according to the modification of the third embodiment.

According to this embodiment, electrical properties of an actually manufactured pattern for the measurement of contact resistance were measured. FIG. 14 illustrates the results. The pattern had a chain of 100 electrodes. The horizontal axis indicates a value obtained by dividing the chain resistance by the number of the electrodes. In FIG. 14, the chain resistance varies depending on the heat treatment temperature at which the source and drain electrodes are formed. A higher temperature at which the source and drain electrodes are formed results in a lower contact resistance. In this embodiment, it was found that suitable low contact resistance was obtained.

[Modification]

A modification of the third embodiment will be described below. In this modification, although the structure of an AlGaN/GaN HEMT and a method for manufacturing the AlGaN/GaN HEMT are disclosed as in the third embodiment, the structure of the underlying layers of the gate electrode in the modification differs slightly from that in the third embodiment. Note that components equivalent to those in the third embodiment are designated using the same reference numerals.

In this modification, the steps illustrated in FIG. 1A and FIGS. 11A to 11F are performed as in the third embodiment.

Figure 15A:
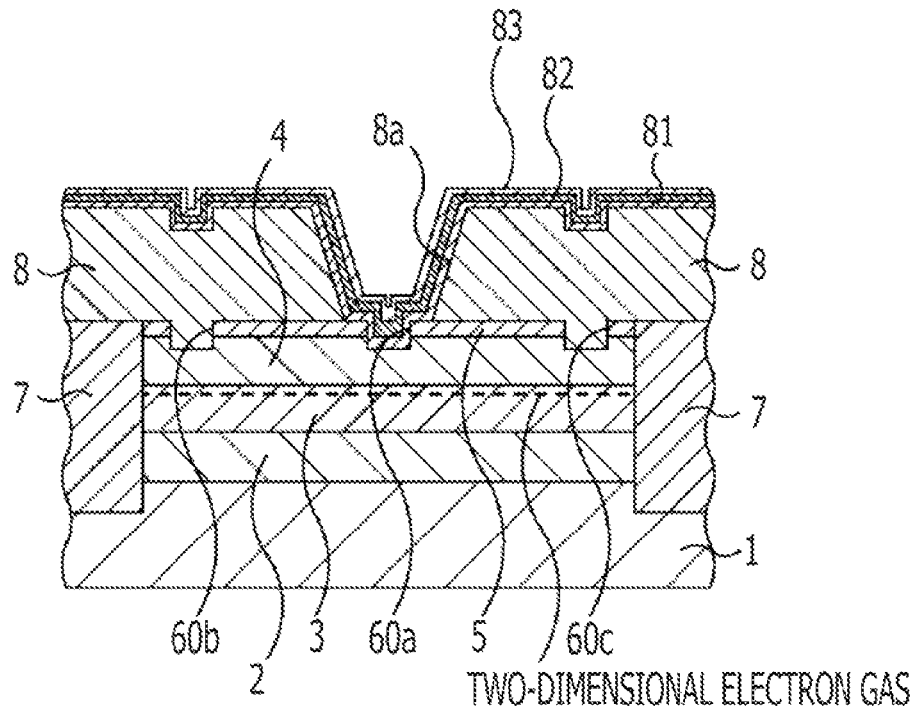
FIGS. 15A and 15B are schematic cross-sectional views illustrating main steps of a method of manufacturing an AlGaN/GaN HEMT according to the modification of the third embodiment.

As illustrated in FIG. 15A, a gate insulator 81, a high-work-function film 82, and a barrier film 83 are formed. In a step the same as that illustrated in FIG. 11H, the conductive material 65 is deposited so as to come into contact with the barrier film 83.

The gate insulator 81, the high-work-function film 82, and the barrier film 83 are formed on the first protective insulating film 8 so as to cover inner surfaces of the openings 8a and 60a.

The gate insulator 81 is formed of an oxide or oxynitride film of one selected from Si, Al, Ti, Ta, Hf, La, Y, and Ni. Alternatively, the gate insulator 81 has a laminated structure of two or more selected from these films. Here, for example, an AlO film is deposited so as to have a thickness of, for example, about 1 nm to about 50 nm, thereby forming the gate insulator 81.

The high-work-function film 82 is formed by depositing one selected from Au, Ni, Co, nitrogen-rich TiN, nitrogen-rich TaN, carbon-rich TaC, Pt, W, Ru, $Ni_3Si$, and Pd in such a manner that the deposited film has a thickness of about 1 nm to about 100 nm. Here, for example, nitrogen-rich TiN is deposited so as to have a thickness of about 20 nm, thereby forming the high-work-function film 82.

The barrier film 83 is formed by depositing, for example, a TaN film using PVD, ALD, or the like in such a manner that the TaN film has a thickness of, for example, about 0.1 nm to about 50 nm.

The barrier film 83 is provided between the high-work-function film 82 and the conductive material 65. The presence of the barrier film 83 prevents Al in the conductive material 65 from reaching a portion of the electron supply layer 4 directly below the gate electrode through the gate insulator 81 when the SiC substrate 1 is subjected to heat treatment at 550° C. to 650° C. in the subsequent step. A higher proportion of nitrogen in the barrier film 83 results in higher barrier properties of the barrier film 83. In the case where nitrogen-rich TaN is formed as the barrier film 83, the resulting nitrogen-rich TaN film preferably has a thickness of 0.1 nm to 10 nm.

Alternatively, without forming the barrier film 83, the high-work-function film 82 may be formed of a nitrogen-rich TaN film in the same way as the barrier film 83 (that is, the high-work-function film 82 is formed so as to also serve as a barrier film), and then the conductive material 65 may be deposited so as to come into contact with the high-work-function film 82.

Steps the same as those illustrated in FIGS. 11I to 11R according to the first embodiment are performed.

In the step illustrated in FIG. 11J, the conductive material 65, the barrier film 83, the high-work-function film 82, and the gate insulator 81 are dry-etched using the resist mask 66 to form the gate electrode 67.

Figure 15B:
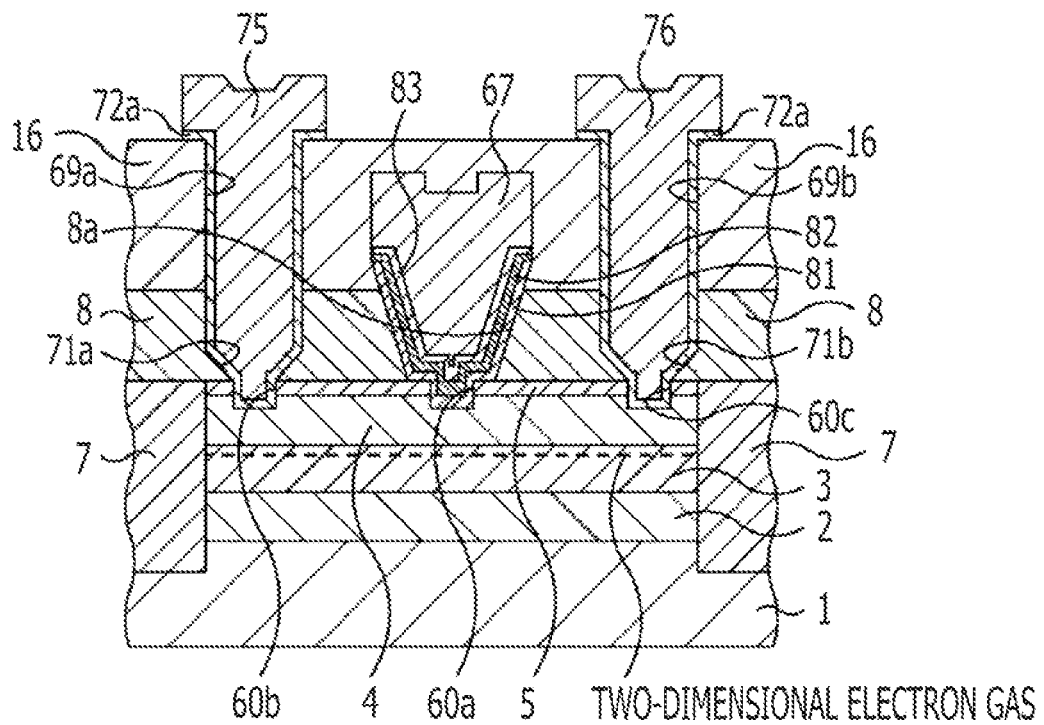

As illustrated in FIG. 15B, the SiC substrate 1 is subjected to heat treatment. This heat treatment is performed for 0 to 180 seconds at 550° C. to 650° C. in an atmosphere selected from the group consisting of noble gases, nitrogen, oxygen, ammonia, hydrogen gas, and mixtures thereof. Here, for example, the heat treatment is performed in an $N_2$ atmosphere at about 600° C. for about 60 seconds. As described in the first embodiment, the low-work-function film 72 is formed into the $TaAl_3$ film 72a by the heat treatment to form spikes, thereby reducing the contact resistance between the electron supply layer 4 and the source electrode 75 and between the electron supply layer 4 and the drain electrode 76.

In this modification, the barrier film 83 is provided between the gate electrode 67 and the high-work-function film 82. The presence of the barrier film 83 prevents the diffusion of Al in the gate electrode 67 to the high-work-function film 82 during the heat treatment. Thus, spikes of Al of the gate electrode 67 are not formed for the gate insulator 81, so that the occurrence of gate leakage is suppressed. Furthermore, the presence of the barrier film 83 results in a predetermined shallow quantum well without diffusing Al having a low work function into a portion directly above the gate insulator 81.

Steps the same as those illustrated in FIGS. 11T and 11U according to the first embodiment are sequentially performed to form the connecting portions 77a, 77b, and 77c of the gate electrode 67, the source electrode 75, and the drain electrode 76.

Subsequently, steps of forming, for example, an upper interlayer insulator and a line are performed to form the AlGaN/GaN HEMT according to this modification.

According to this modification, the gate electrode 67, the source electrode 75, and the drain electrode 76 of the AlGaN/GaN HEMT are formed not by the lift-off process but by a simple method without causing a defect in any pattern, thereby simply and reliably manufacturing the AlGaN/GaN HEMT having excellent device properties, in which the occurrence of gate leakage is prevented.

[Fourth Embodiment]

In this embodiment, with respect to an AlGaN/GaN HEMT, the case where a source electrode and a drain electrode are formed before the formation of a gate electrode. Note that components equivalent to those in the third embodiment are designated using the same reference numerals.

In this embodiment, the steps illustrated in FIG. 1A and FIGS. 11A to 11D are performed as in the third embodiment.

Figure 16A:
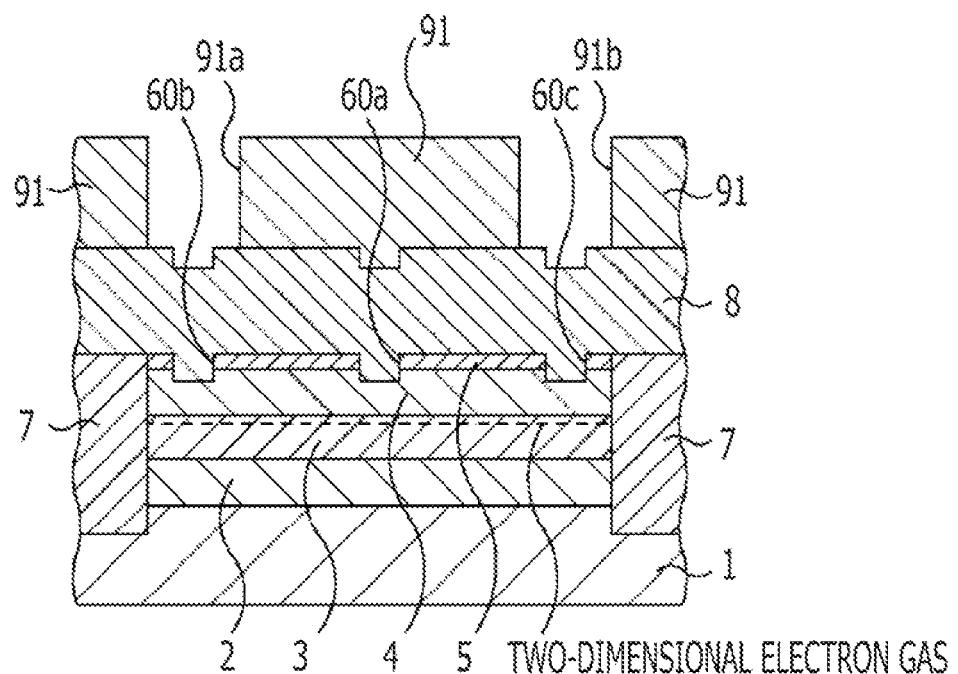
FIGS. 16A to 16P are schematic cross-sectional views of a method of manufacturing an AlGaN/GaN HEMT according to a fourth embodiment.

As illustrated in FIG. 16A, a resist mask 91 is formed on the first protective insulating film 8.

A resist is applied on the entire surface of the first protective insulating film 8 and processed by lithography, thereby forming the resist mask 91 having a pair of openings 91a and 91b that exposes portions of the first protective insulating film 8 where the source electrode and the drain electrode will be formed.

Figure 16B:
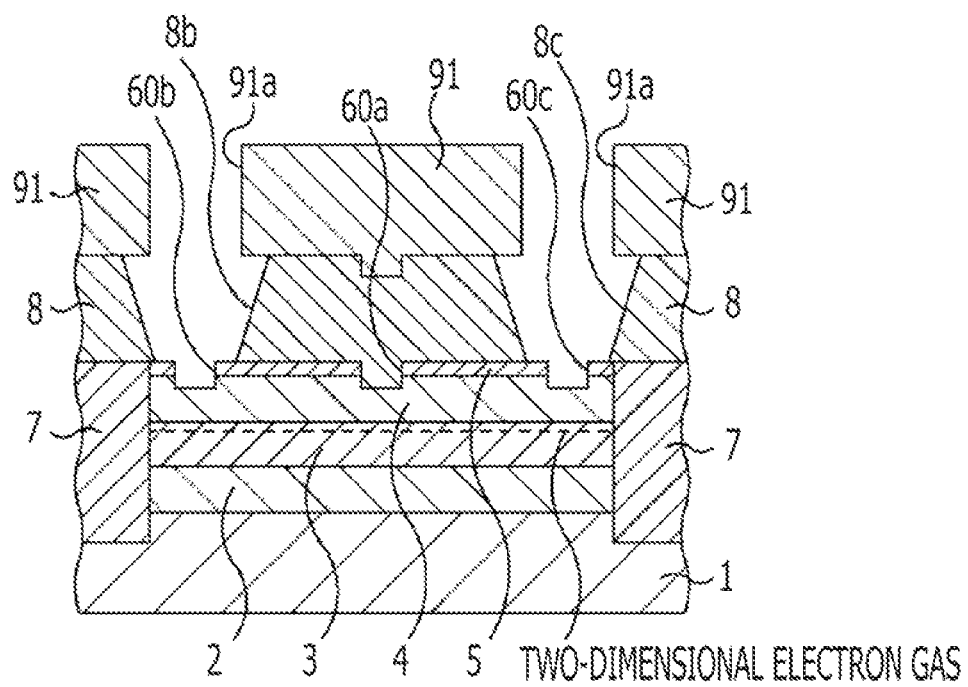

As illustrated in FIG. 16B, a pair of openings 8b and 8c is formed by damage-less etching in a portion of the first protective insulating film 8 where the source electrode and the drain electrode will be formed.

The damage-less etching is what is called isotropic etching. Wet etching or isotropic dry etching under specific conditions is employed.

In the case where wet etching is performed, it is possible to use an etching solution the same as that used in the wet etching of the damage-less etching described in FIG. 11F according to the third embodiment.

In the case where dry etching is performed, it is possible to use an etching apparatus and etching conditions the same as those in the dry etching of the damage-less etching described in FIG. 11F according to the third embodiment.

The first protective insulating film 8 is subjected to the damage-less etching to form the openings 8b and 8c in the first protective insulating film 8, the openings 8b and 8c each having a shape in which the diameter of an upper portion of each of the openings 8b and 8c is larger than that of a corresponding one of the openings 91a and 91b in the resist mask 91 and the diameter of a lower portion of each of the openings 8b and 8c is smaller than that of the corresponding upper portion. Each of the openings 8b and 8c communicates with a corresponding one of openings 60b and 60c to form one opening. The bottom of the opening 60b, i.e., the recess (where the source electrode will be formed) of the electron supply layer 4, is exposed at the bottom of the opening 8b. The bottom of the opening 60c, i.e., the recess (where the drain electrode will be formed) of the electron supply layer 4, is exposed at the bottom of the opening 8c. These recesses are not physically damaged because of the damage-less etching. Thus, a predetermined satisfactory 2DEG is formed in the vicinity of the interface between the electron transit layer 3 and the electron supply layer 4.

Then the resist mask 91 is removed by ashing or the like.

Figure 16C:
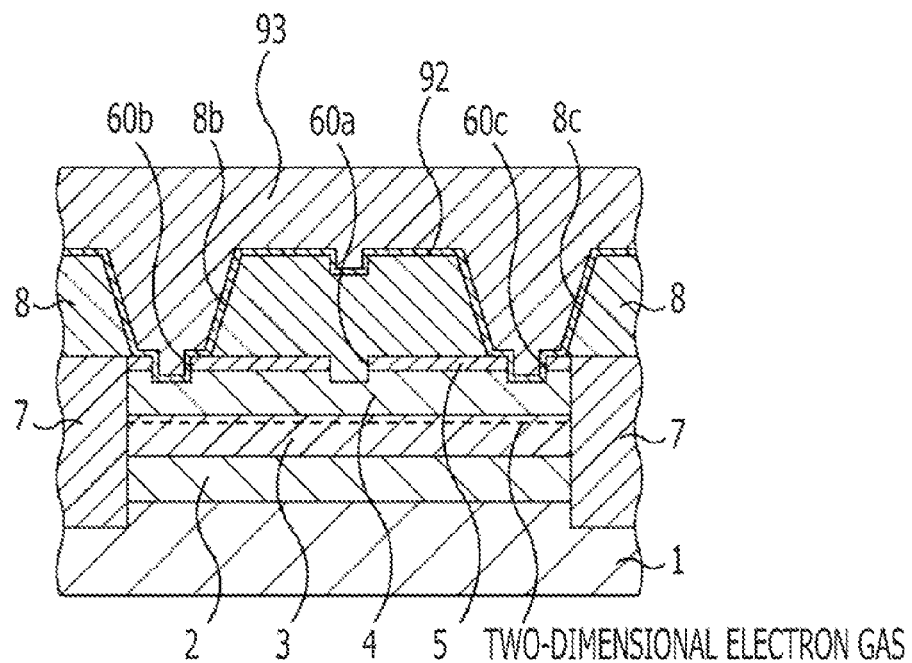

As illustrated in FIG. 16C, after the formation of a low-work-function film 92, a conductive material 93 is deposited.

The low-work-function film 92 is formed on the second protective insulating film 16 as an underlying conductive film so as to cover inner surfaces of the openings 8b and 60b and the inner surface of an opening into which the openings 8c and 60c are integrally formed. The low-work-function film 92 is formed by depositing one selected from Al, Ti, metal-rich TiN, Ta, metal-rich TaN, Zr, metal-rich TaC, $NiSi_2$, and Ag in such a manner that the deposited film has a thickness of about 1 nm to about 100 nm. Here, for example, a Ta film is deposited by PVD or the like at a DC power of, for example, 1 kW to 10 kW so as to have a thickness of about 10 nm, thereby forming the low-work-function film 92. The formation of the low-work-function film 92 reduces the barrier between the electrode material and a portion of the electron supply layer 4 directly below the gate electrode, thereby forming the source electrode and the drain electrode with low contact resistance.

The conductive material 93, such as Al, is deposited on the entire surface of the low-work-function film 92 by PVD or the like at a DC power of, for example, 1 kW to 10 kW in such a manner that the resulting film of the conductive material 93 has a thickness of about 300 nm and that the openings 8b and 60b and the openings 8c and 60c are filled with the conductive material via the low-work-function film 92.

Figure 16D:
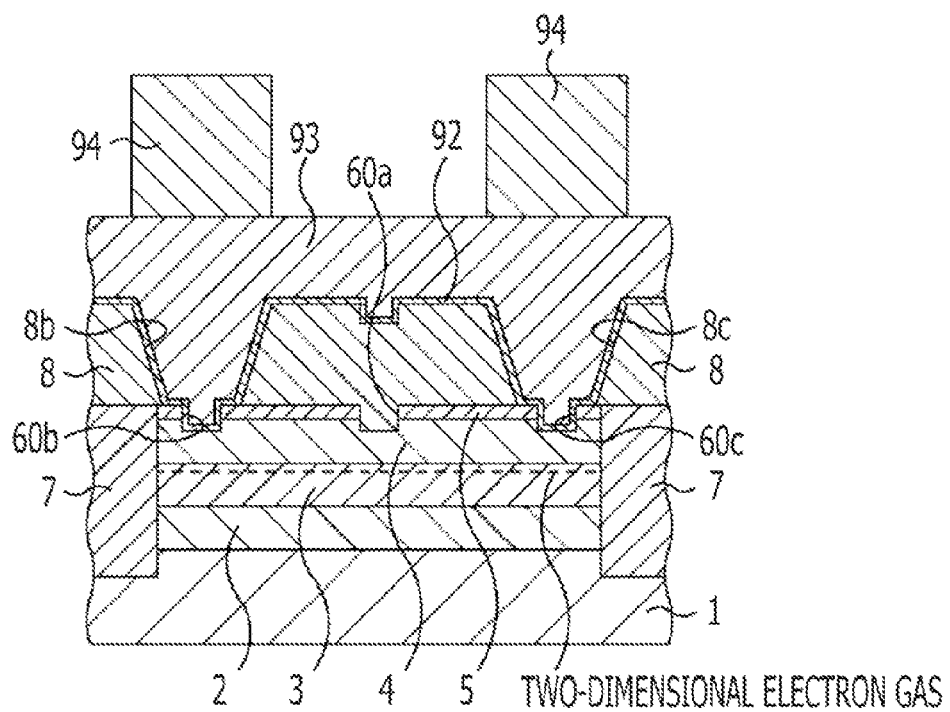

As illustrated in FIG. 16D, a resist mask 94 is formed on the conductive material 93.

A resist is applied on the entire surface of the conductive material 93 and processed by lithography, thereby forming the resist mask 94 that covers portions of the conductive material 93 where the source electrode and the drain electrode will be formed.

Figure 16E:
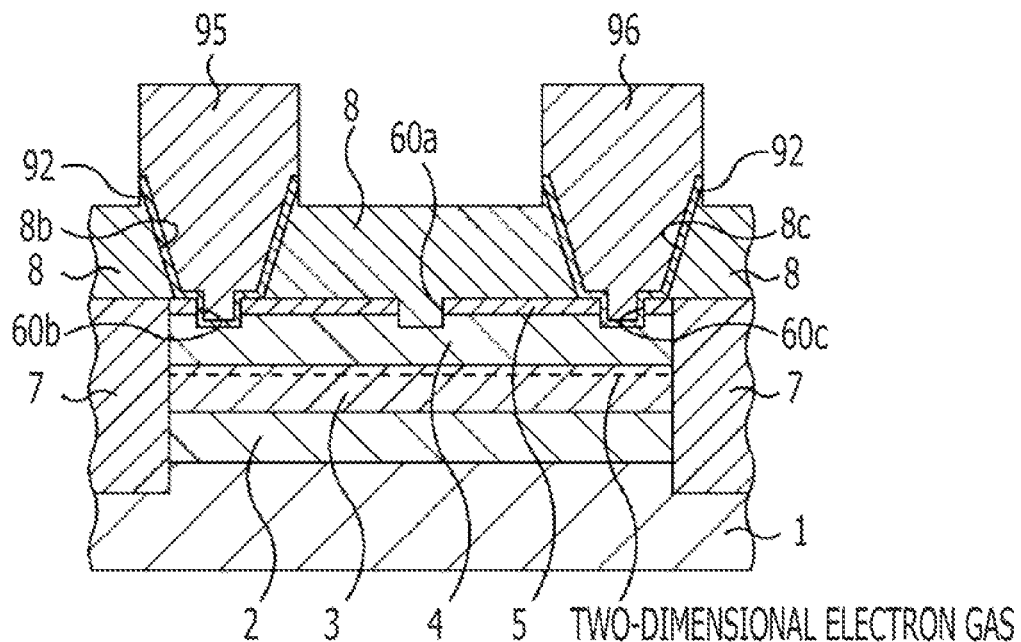

As illustrated in FIG. 16E, a source electrode 95 and a drain electrode 96 are formed.

The conductive material 93 and the low-work-function film 92 are dry-etched using the resist mask 94, thereby forming the source electrode 95 and the drain electrode 96 in which the openings 8b and 60b and the openings 8c and 60c are filled with the conductive material 93 via the low-work-function film 92 and which protrude from the second protective insulating film 16.

Then the resist mask 94 is removed by ashing or the like.

In this embodiment, the source electrode 95 and the drain electrode 96 of the AlGaN/GaN HEMT are formed by lithography and dry etching. In this case, the source electrode 95 and the drain electrode 96 are formed in such a manner that the openings 8b and 60b and the openings 8c and 60c are filled with the conductive material 93. The presence of the first protective insulating film 8 and the damage-less etching prevent physical damage to the electron supply layer 4 when the source and drain electrodes are formed. As described above, in this embodiment, when the source electrode 95 and the drain electrode 96 are formed, the lithography and the damage-less etching are performed using the first protective insulating film 8, without employing the lift-off process. Unlike the lift-off process, part of the conductive material is not redeposited above the SiC substrate 1, and the satisfactory source electrode 95 and the satisfactory drain electrode 96 are formed without physically damaging the electron supply layer 4.

The SiC substrate 1 is subjected to heat treatment in, for example, an $N_2$ atmosphere at about 600° C. for about 60 seconds.

Figure 16F:
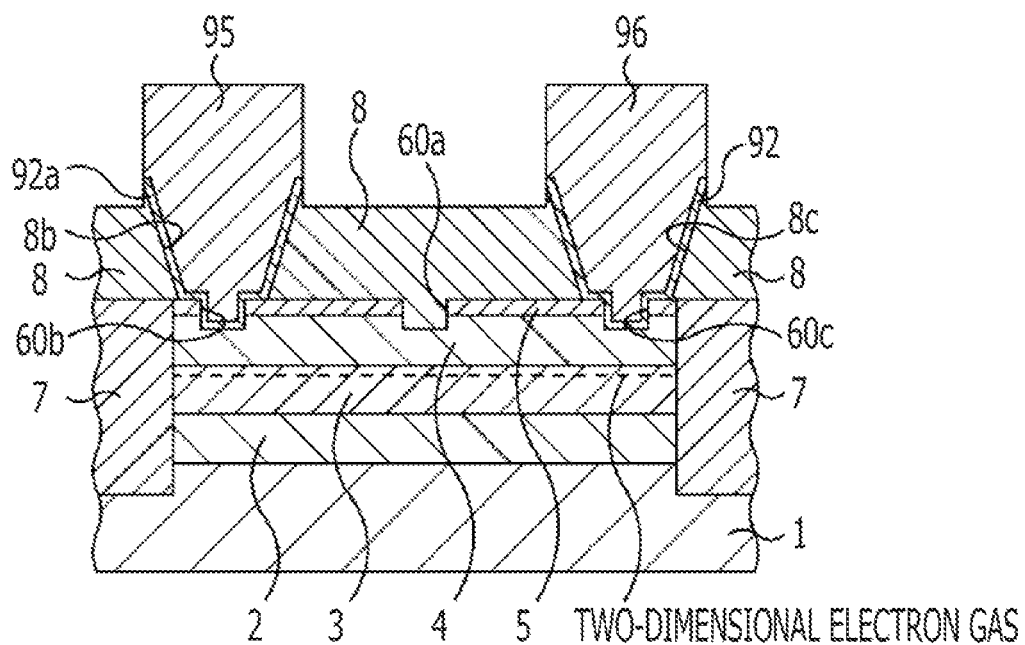

As illustrated in FIG. 16F, the heat treatment allows Ta in the low-work-function film 92 to react with Al in the conductive material 93, so that the low-work-function film 92 is formed into a $TaAl_3$ film 92a. The heat treatment results in the formation of minute spikes of the $TaAl_3$ film 92a at bottoms of the openings 8b and 60b and the openings 8c and 60c, i.e., portions of the electron supply layer 4 directly below the source electrode 95 and the drain electrode 96, thereby reducing the contact resistance between the electron supply layer 4 and the source electrode 95 and between the electron supply layer 4 and the drain electrode 96. Furthermore, Al has a low work function. This also contributes to a reduction in contact resistance.

Figure 16G:
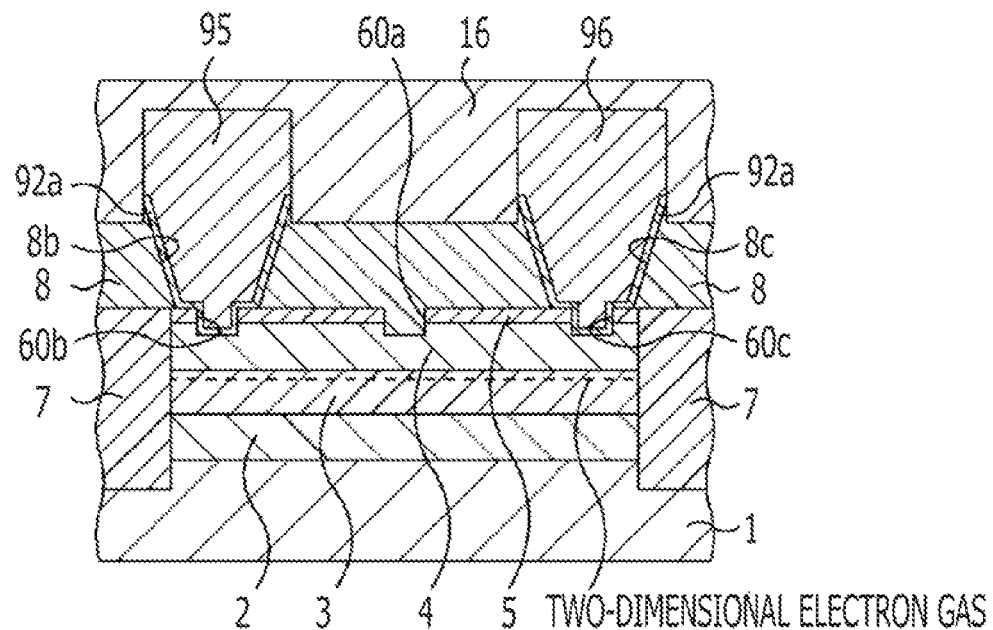

As illustrated in FIG. 16G, the second protective insulating film 16 is formed.

An insulating film, such as a silicon oxide film, having a thickness of about 300 nm is formed on the entire surface of the first protective insulating film 8 by, for example, plasma-enhanced CVD so as to cover the source electrode 95 and the drain electrode 96, thereby forming the second protective insulating film 16. Here, bumps attributed to projecting portions of the source electrode 95 and the drain electrode 96 are formed on portions of the second protective insulating film 16 above the source electrode 95 and the drain electrode 96. To remove the bumps, surface polishing is preferably performed by, for example, CMP. In this case, the silicon oxide film or the like is deposited so as to have a thickness of about 500 nm to about 1000 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the second protective insulating film 16. In FIG. 16G, the second protective insulating film 16 having a surface planarized by CMP is illustrated.

With respect to a method for forming the second protective insulating film, a silicon oxide film or the like may be formed by, for example, spin coating in place of plasma-enhanced CVD and is subjected to curing treatment to form the second protective insulating film.

Figure 16H:
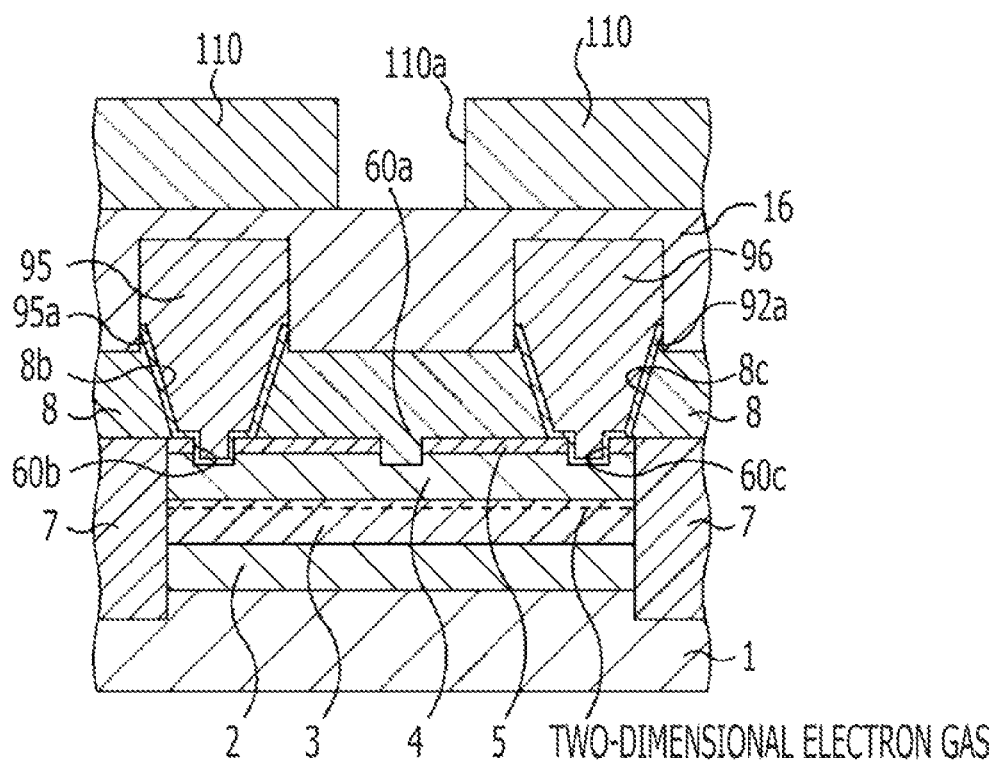

As illustrated in FIG. 16H, a resist mask 110 is formed on the second protective insulating film 16.

A resist is applied on the entire surface of the second protective insulating film 16 and processed by lithography, thereby forming the resist mask 110 having an opening 110a that exposes a portion of the second protective insulating film 16 where the gate electrode will be formed.

Figure 16I:
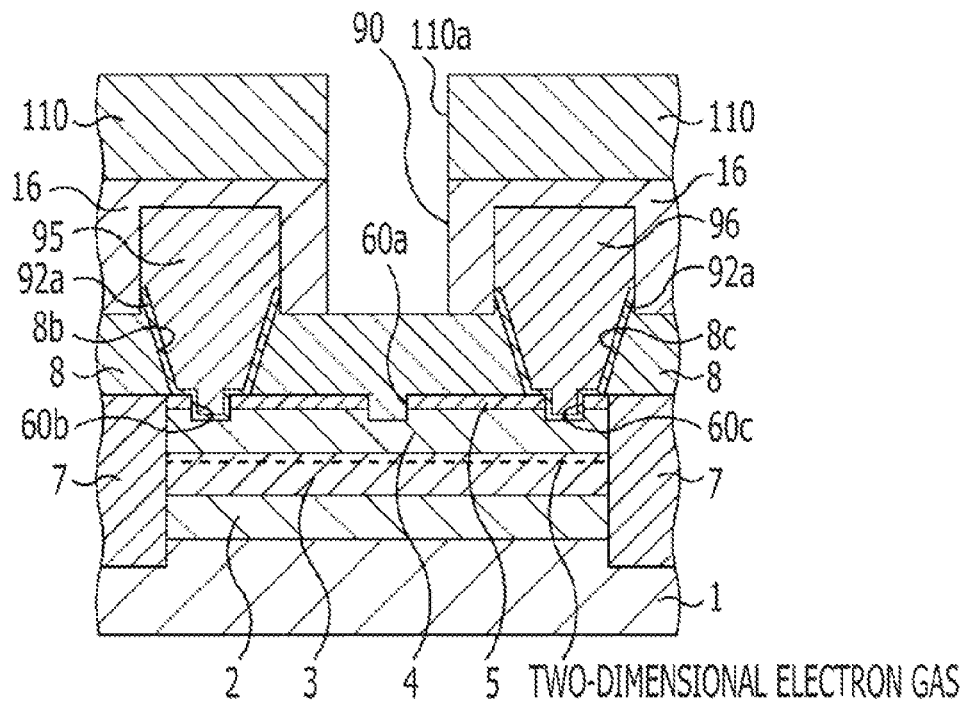
Figure 16J:
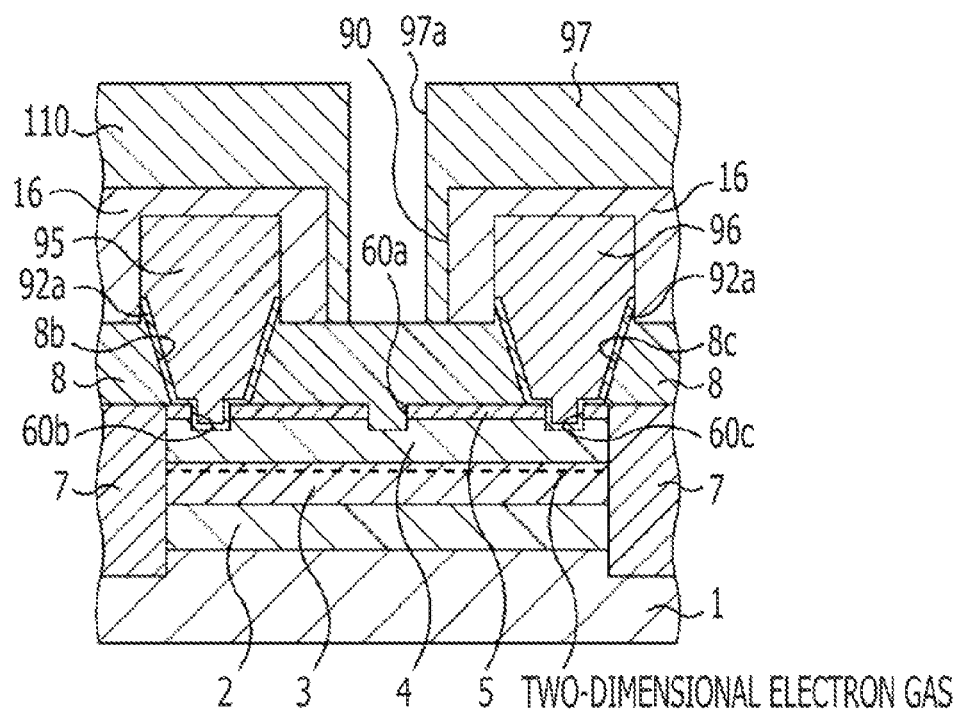

In steps illustrated in FIGS. 16I and 16J, two-stage etching is performed.

As illustrated in FIG. 16I, an opening 90 is formed so as to extend from a surface of the second protective insulating film 16 to the middle portion of the first protective insulating film 8. Here, the case where the opening 90 is formed so as to extend to the surface of the first protective insulating film 8.

The opening 90 is formed by dry etching from the surface of the second protective insulating film 16 to the middle portion of the first protective insulating film 8 using the resist mask 110. The dry etching is performed at a pressure of about 1.7 Torr and an RF power of, for example, about 650 W using a fluorine-containing gas, such as a mixed gas of $CHF_3$, $CF_3$, and Ar, as an etching gas in such a manner that etching is stopped at the surface of the first protective insulating film 8. This dry etching results in the formation of the opening 90 extending to the surface of the first protective insulating film 8 through the second protective insulating film 16, the first protective insulating film 8 being left at the bottom of the opening 90.

Then the resist mask 110 is removed by ashing or the like.

The dry etching illustrated in FIG. 16I is performed so as to expose the surface of the first protective insulating film 8. Thus, the first protective insulating film 8 is left at the bottom of the opening 90. So, the dry etching does not physically damage the electron supply layer 4.

As illustrated in FIG. 16J, a resist mask 97 is formed.

A resist is applied on the entire surface of the second protective insulating film 16 in such a manner that the opening 90 is filled with the resist. The resist is processed by lithography, thereby forming the resist mask 97 having an opening 97a that is located in the opening 90, the resist mask 97 covering the second protective insulating film 16 and the inner side wall of the opening 90, and the diameter (width) of the opening 97a being a smaller than that of the opening 90.

Figure 16K:
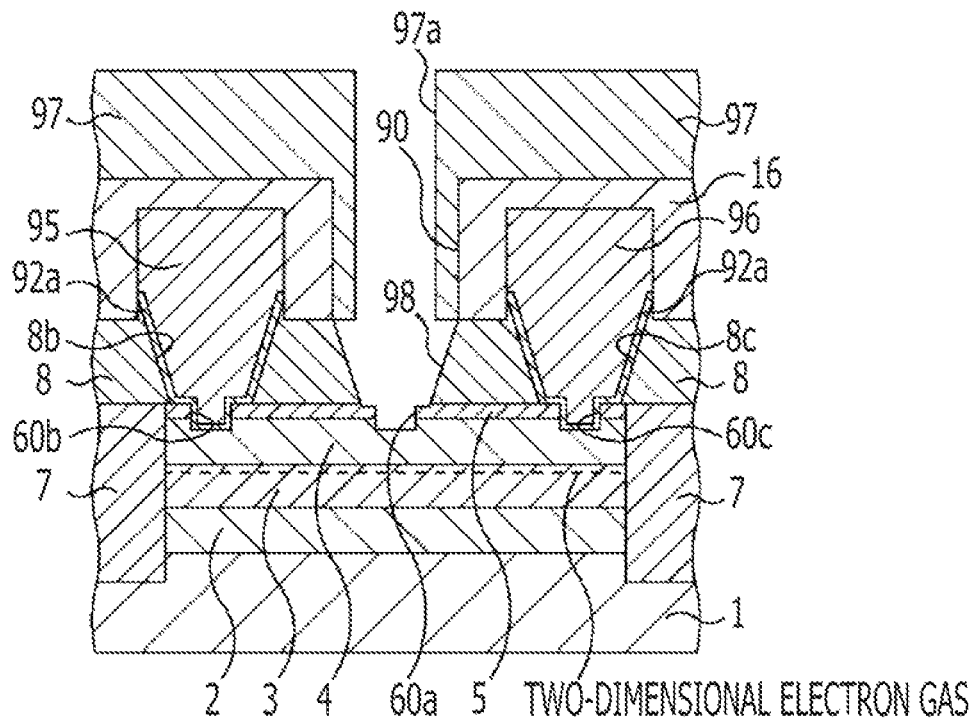

As illustrated in FIG. 16K, an opening 98 is formed in the first protective insulating film 8 by damage-less etching.

The damage-less etching employed here is what is called isotropic etching. Wet etching or isotropic dry etching under specific conditions is employed.

In the case where wet etching is performed, it is possible to use an etching solution the same as that used in the wet etching of the damage-less etching described in FIG. 11F according to the third embodiment.

In the case where dry etching is performed, it is possible to use an etching apparatus and etching conditions the same as those in the dry etching of the damage-less etching described in FIG. 11F according to the third embodiment.

The first protective insulating film 8 is subjected to the damage-less etching to form the opening 98 in the first protective insulating film 8, the opening 98 having a shape in which the diameter of an upper portion of the opening 98 is larger than that of the opening 97*a* in the resist mask 97 and the diameter of a lower portion of the opening 98 is smaller than that of the upper portion. The opening 98 and opening 90 communicate with the opening 60*a* to form one opening. The bottom of the opening 60*a*, i.e., the recess (where the gate electrode will be formed) of the electron supply layer 4, is exposed at the bottom of the opening 98. The recess is not physically damaged because of the damage-less etching. Thus, a predetermined satisfactory 2DEG is formed in the vicinity of the interface between the electron transit layer 3 and the electron supply layer 4.

Then the resist mask 97 is removed by ashing or the like.

Figure 16L:
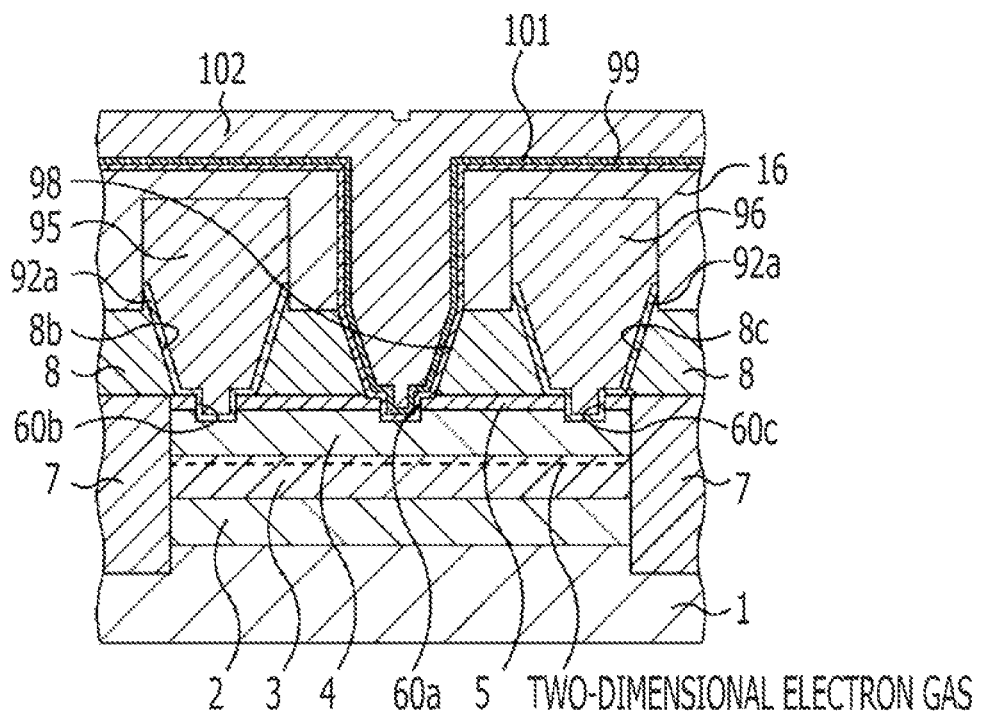

As illustrated in FIG. 16L, a gate insulator 99 and a high-work-function film 101 are formed.

The gate insulator 99 and the high-work-function film 101 are formed on the second protective insulating film 16 so as to cover the inner surface of the opening (referred to as an "opening C") into which the openings 60*a*, 90, and 98 are integrally formed.

The gate insulator 99 is formed by depositing, for example, an AlO film having a thickness of, for example, about 20 nm by ALD or the like. The gate insulator 99 may be formed of a TaO film, or a high-dielectric (high-k) oxide or oxynitride film of Hf, Ti, or Zr, in place of the AlO film. Alternatively, the gate insulator 99 may have a laminated structure of two or more selected from the AlO film, the TaO film, and the high-k film.

After the formation of the gate insulator 99, heat treatment may be performed at, for example, about 550° C. for about 60 seconds.

The high-work-function film 101 is formed by depositing, for example, a TaN film having a thickness of, for example, about 40 nm by physical vapor deposition (PVD) or the like. The term "high-work-function film" indicates a film composed of a conductive material having a work function of 4.5 eV or more. The formation of the high-work-function film 101 provides a shallow quantum well directly below the gate electrode, thereby reducing the 2DEG directly below the gate electrode when the gate voltage is 0 V.

As illustrated in FIG. 16L, a conductive material 102 is formed on the high-work-function film 101.

The conductive material 102, such as Al, is deposited on the entire surface of the high-work-function film 101 by PVD or the like in such a manner that the resulting film of the conductive material 102 has a thickness of about 20 nm to about 500 nm, for example, about 400 nm and that the opening C is filled with the conductive material 102 via the gate insulator 99 and the high-work-function film 101.

Figure 16M:
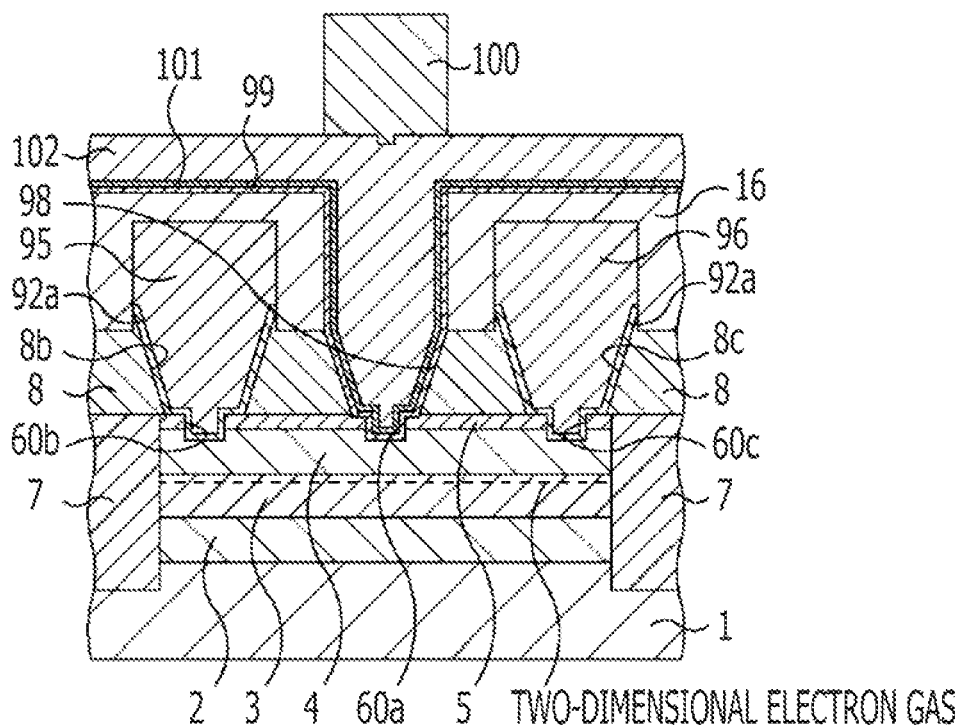

As illustrated in FIG. 16M, a resist mask 100 is formed on the conductive material 102.

A resist is applied on the entire surface of the conductive material 102 and processed by lithography, thereby forming the resist mask 100 that covers a portion of the conductive material 102 where the gate electrode will be formed.

Figure 16N:
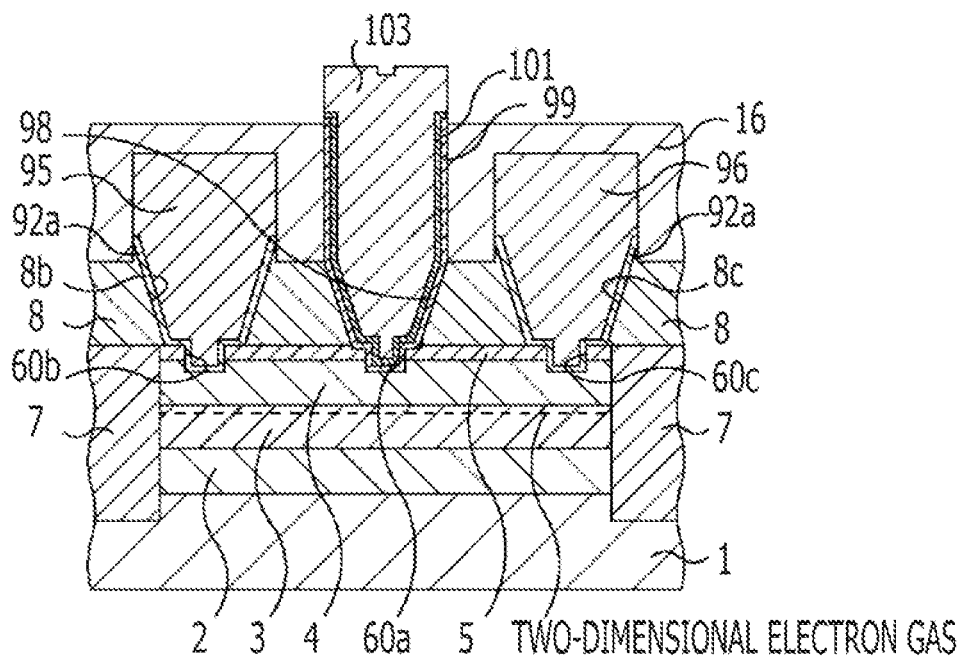

As illustrated in FIG. 16N, a gate electrode 103 is formed.

The conductive material 102, the high-work-function film 101, and the gate insulator 99 are dry-etched using the resist mask 100. Here, in order to reliably form the gate electrode, as illustrated in the figure, etching may be performed so as to expose a surface of the second protective insulating film 16. The dry etching results in the formation of the gate electrode 103 in which the opening C is filled with the conductive material 102 via the gate insulator 99 and the high-work-function film 101 and which protrudes from the second protective insulating film 16.

Then the resist mask 100 is removed by ashing or the like.

In this embodiment, the gate electrode 103 of the AlGaN/GaN HEMT is formed by lithography and dry etching. In this case, the first and second protective insulating films 8 and 16 are formed, and then the gate electrode 102 is formed in such a manner that the opening C is filled with the conductive material 102. The presence of the first and second protective insulating films 8 and 16 and the damage-less etching of the first protective insulating film 8 prevent physical damage to the electron supply layer 4 when the gate electrode is formed. As described above, in this embodiment, when the gate electrode 103 is formed, the lithography and the damage-less etching are performed using the first and second protective insulating films 8 and 16, without employing the lift-off process. Unlike the lift-off process, part of the conductive material is not redeposited above the SiC substrate 1, and the satisfactory gate electrode 103 is formed without physically damaging the compound semiconductor layers.

In this embodiment, the source electrode 95 and the drain electrode 96 are formed before the formation of the gate electrode 103. Thus, heat treatment to reduce the contact resistance of the source electrode 95 and the drain electrode 96 can be performed in a state in which the gate electrode is not formed. So, the barrier layer against Al as described in the modification of the first embodiment may not be formed, thereby leading to a simple manufacturing process.

Figure 16O:
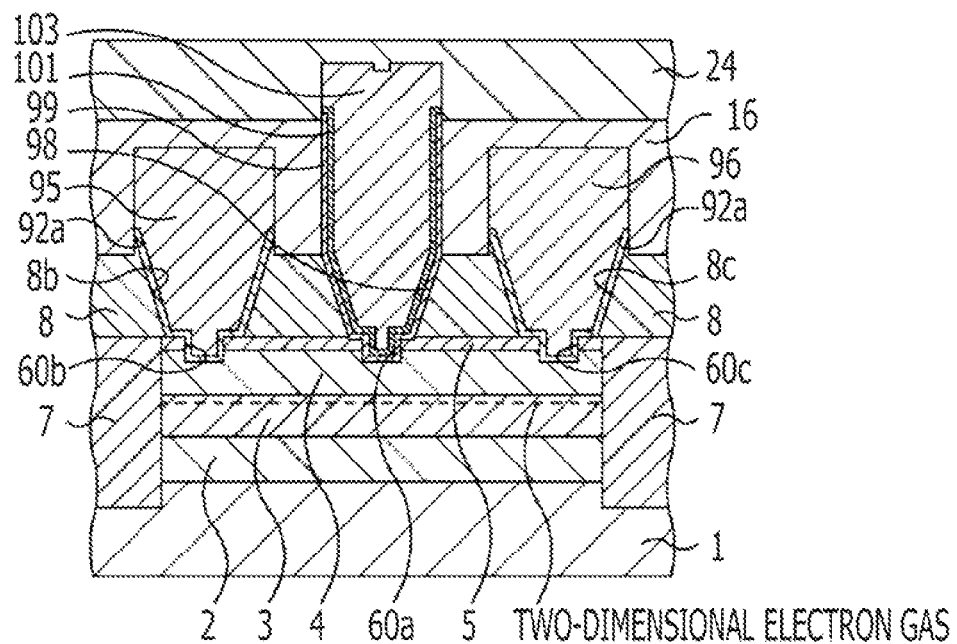

As illustrated in FIG. 16O, the interlayer insulator 24 is formed.

An insulating film, such as a silicon oxide film, having a thickness of about 1000 nm is formed on the entire surface of the second protective insulating film 16 by, for example, plasma-enhanced CVD so as to cover the gate electrode 103, thereby forming the interlayer insulator 24. Here, a bump attributed to a projecting portion of the gate electrode 103 is formed on a portion of the interlayer insulator 24 above the gate electrode 103. To remove the bump, surface polishing is preferably performed by, for example, chemical-mechanical polishing (CMP). In this case, the silicon oxide film or the like is deposited so as to have a thickness of about 1000 nm to about 1500 nm, and then a surface portion of the silicon oxide film or the like is polished by CMP so as to reduce the thickness of the silicon oxide film or the like by about 100 nm to about 600 nm, thereby planarizing the surface of the silicon oxide film or the like and forming the interlayer insulator 24. In FIG. 16O, the interlayer insulator 24 having a surface planarized by CMP is illustrated.

With respect to a method for forming the interlayer insulator, a silicon oxide film or the like may be formed by, for example, spin coating in place of plasma-enhanced CVD and is subjected to curing treatment to form the interlayer insulator.

Figure 16P:
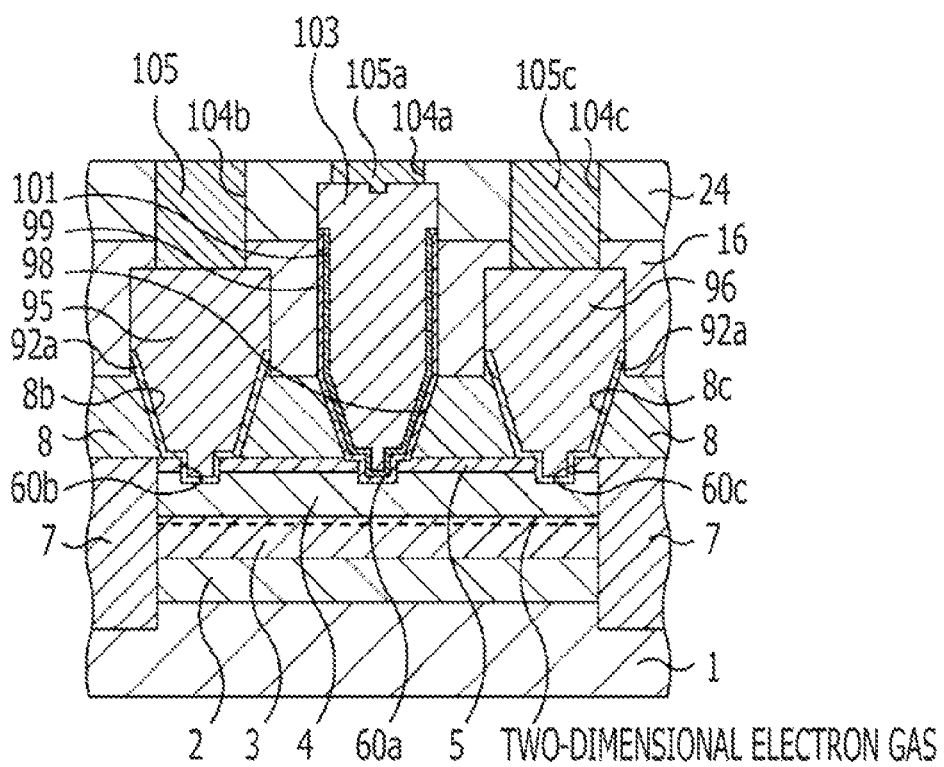

As illustrated in FIG. 16P, a connecting portion 105*a* of the gate electrode 103, a connecting portion 105*b* of the source electrode 95, and a connecting portion 105*c* of the drain electrode 96 are formed.

The second protective insulating film 16 and the interlayer insulator 24 are processed by lithography and dry etching, thereby forming openings 104a, 104b, and 104c that partially expose respective surfaces of the gate electrode 103, the source electrode 95, and the drain electrode 96.

A conductive material, such as Al, is deposited on the interlayer insulator 24 by, for example, sputtering or plating in such a manner that the openings 104a, 104b, and 104c are filled with the conductive material. The conductive material is polished by CMP using a surface of the interlayer insulator 24 as a polishing stopper. In this way, the openings 104a, 104b, and 104c are filled with the conductive material to form the connecting portion 105a of the gate electrode 103, the connecting portion 105b of the source electrode 95, and the connecting portion 105c of the drain electrode 96.

Subsequently, steps of forming, for example, an upper interlayer insulator and a line are performed to form the AlGaN/GaN HEMT according to this embodiment.

According to this embodiment, the gate electrode 103, the source electrode 95, and the drain electrode 96 of the AlGaN/GaN HEMT are formed not by the lift-off process but by a simple method without causing a defect in any pattern, thereby simply and reliably manufacturing the AlGaN/GaN HEMT having excellent device properties, in which the occurrence of gate leakage is prevented.

In each of the first to fourth embodiments and the modifications, the AlGaN/GaN HEMT, which is a nitride semiconductor device, is exemplified as a compound semiconductor device. However, the compound semiconductor device is not limited to the AlGaN/GaN HEMT. Examples of an applicable compound semiconductor device other than a compound semiconductor device including AlGaN and GaN are described below.

(1) Compound Semiconductor Device Including InAlN and AlN. InAlN and AlN are compound semiconductor materials. The lattice constant of AlN is smaller than that of InAlN. In this case, InAlN is used for an electron transit layer. AlN is used for an electron supply layer. Furthermore, for example, $n^+$-InAlN having a high n-type impurity concentration is used for a cap layer.

(2) Compound Semiconductor Device Including InAlGaN and AlN. InAlGaN and AlN compound semiconductor materials. The lattice constant of AlN is smaller than that of InAlGaN. In this case, InAlGaN is used for an electron transit layer. AlN is used for an electron supply layer. Furthermore, for example, $n^+$-InAlGaN having a high n-type impurity concentration is used for a cap layer.

(3) Compound Semiconductor Device Including InAlN and InAlGaN.

In the case of InAlN and InAlGaN, the lattice constants of InAlN and InAlGaN are changed by adjusting the proportions of In, Al, and Ga therein. It is possible to make the lattice constant of InAlN smaller or larger than that of InAlGaN by adjusting the proportions of In, Al, and Ga. Here, the case where the lattice constant of InAlGaN is smaller than that of InAlN is exemplified.

In this case, InAlN is used for an electron transit layer. InAlGaN is used for an electron supply layer. Furthermore, for example, $n^+$-InAlN having a high n-type impurity concentration is used for a cap layer.

(4) Compound Semiconductor Device Including AlGaN materials having different Al contents.

Even for compound semiconductor materials having similar compositions, different composition ratios result in different lattice constants. With respect to one type of compound semiconductor material that exhibits different lattice constants, for example, in the case of AlGaN, $Al_{0.3}Ga_{0.7}N$ and $Al_{0.5}Ga_{0.5}N$ may be used. For AlGaN, a higher Al content results in a smaller lattice constant. Thus, the lattice constant of the $Al_{0.5}Ga_{0.5}N$ is smaller than that of $Al_{0.3}Ga_{0.7}N$.

In this case, $Al_{0.3}Ga_{0.7}N$ is used for an electron transit layer. $Al_{0.5}Ga_{0.5}N$ is used for an electron supply layer. Furthermore, for example, $n^+$-$Al_{0.3}Ga_{0.7}N$ having a high n-type impurity concentration is used for a cap layer.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present invention have been described in detail, it should be understood that various changes, substitutions, and alterations could be made hereto without departing from the spirit and scope of the invention.

What is claimed is:

1. A method of manufacturing a compound semiconductor device, comprising:
    forming a compound semiconductor layer on a substrate;
    forming a first insulating film on the compound semiconductor layer;
    forming a first opening in the first insulating film, the first opening being configured to partially expose the compound semiconductor layer;
    forming a first conductive material on the first insulating film via at least a gate insulator in such a manner that the first opening is filled with the first conductive material;
    forming a first mask on a portion of the first conductive material corresponding to the first opening;
    processing at least the first conductive material with the first mask to form a gate electrode;
    forming a second insulating film on the first insulating film so as to cover the gate electrode;
    forming a pair of second openings in at least the second insulating film and the first insulating film, the pair of second openings being configured to partially expose the compound semiconductor layer;
    forming at least a second conductive material on the second insulating film in such a manner that the second openings are filled with the second conductive material;
    forming second masks on portions of the second conductive material corresponding to the second openings;
    processing at least the second conductive material using the second masks to form a source electrode and a drain electrode; and
    forming a first conductive film on the first insulating film so as to cover the inner surface of the first opening, the first conductive film containing at least TaN,
    wherein the first conductive material is formed on the first conductive film, and after the formation of the first conductive material, the substrate is subjected to heat treatment.

2. The method according to claim 1, wherein
    the composition ratio of N of TaN contained in the first conductive film is larger than the composition ratio of Ta of TaN contained in the first conductive film.

3. A method of manufacturing a compound semiconductor device, comprising:
    forming a compound semiconductor layer on a substrate;
    forming a first insulating film on the compound semiconductor layer;
    forming a first opening in the first insulating film, the first opening being configured to partially expose the compound semiconductor layer;

forming a first conductive material on the first insulating film via at least a gate insulator in such a manner that the first opening is filled with the first conductive material;

forming a first mask on a portion of the first conductive material corresponding to the first opening;

processing at least the first conductive material with the first mask to form a gate electrode;

forming a second insulating film on the first insulating film so as to cover the gate electrode;

forming a pair of second openings in at least the second insulating film and the first insulating film, the pair of second openings being configured to partially expose the compound semiconductor layer;

forming at least a second conductive material on the second insulating film in such a manner that the second openings are filled with the second conductive material;

forming second masks on portions of the second conductive material corresponding to the second openings;

processing at least the second conductive material using the second masks to form a source electrode and a drain electrode; and forming a second conductive film having a work function of 4.5 eV or more;

wherein the gate insulator and the second conductive film are formed so as to cover the inner surface of the first opening, and the first conductive material is formed on the first insulating film with at least the gate insulator and the second conductive film.

4. A method of manufacturing a compound semiconductor device, comprising:

forming a compound semiconductor layer on a substrate;

forming a first insulating film on the compound semiconductor layer;

forming a first opening in the first insulating film, the first opening being configured to partially expose the compound semiconductor layer;

forming a first conductive material on the first insulating film via at least a gate insulator in such a manner that the first opening is filled with the first conductive material;

forming a first mask on a portion of the first conductive material corresponding to the first opening;

processing at least the first conductive material with the first mask to form a gate electrode;

forming a second insulating film on the first insulating film so as to cover the gate electrode;

forming a pair of second openings in at least the second insulating film and the first insulating film, the pair of second openings being configured to partially expose the compound semiconductor layer;

forming at least a second conductive material on the second insulating film in such a manner that the second openings are filled with the second conductive material;

forming second masks on portions of the second conductive material corresponding to the second openings;

processing at least the second conductive material using the second masks to form a source electrode and a drain electrode; and forming a third conductive film so as to cover inner surfaces of the second openings, the third conductive film having a work function of less than 4.5 eV;

wherein the second conductive material is formed on the second insulating film via the third conductive film provided between the second conductive material and the second insulating film in such a manner that the second openings are filled with the second conductive material.

* * * * *